(12) United States Patent
Ohta et al.

(10) Patent No.: US 7,968,414 B2
(45) Date of Patent: *Jun. 28, 2011

(54) SEMICONDUCTOR DEVICE AND PRODUCTION METHOD THEREOF

(75) Inventors: Hiroyuki Ohta, Kawasaki (JP); Takashi Sakuma, Kawasaki (JP); Yosuke Shimamune, Kawasaki (JP); Akiyoshi Hatada, Kawasaki (JP); Akira Katakami, Kawasaki (JP); Naoyoshi Tamura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/698,303

(22) Filed: Feb. 2, 2010

(65) Prior Publication Data
US 2010/0129971 A1   May 27, 2010

Related U.S. Application Data

(60) Division of application No. 11/471,732, filed on Jun. 21, 2006, now Pat. No. 7,683,362, which is a continuation-in-part of application No. 11/229,745, filed on Sep. 20, 2005, now Pat. No. 7,579,617.

(30) Foreign Application Priority Data

Jun. 22, 2005 (JP) ............................. 2005-182382
Jun. 12, 2006 (JP) ............................. 2006-162134

(51) Int. Cl.
 H01L 21/8238 (2006.01)
 H01L 21/336 (2006.01)
(52) U.S. Cl. ........ 438/300; 438/198; 438/199; 438/230; 438/302; 438/303; 257/18; 257/E31.409; 257/E21.634; 257/E29.193

(58) Field of Classification Search .................... 257/18, 257/E21.409, E21.634, E29.193; 438/198, 438/199, 300, 302, 303, 230
See application file for complete search history.

(56) References Cited

U.S. PATENT DOCUMENTS
6,121,100 A   9/2000 Andideh et al.
(Continued)

FOREIGN PATENT DOCUMENTS
JP   2000-323711   11/2000
(Continued)

OTHER PUBLICATIONS

Ozturk, et al., "Ultra-Shallow Source/Drain Junction for Nanoscale CMOS Using Selective Silicon Germanium Technology", International Workshop on Junction Technology, 77, 2001 2001, 5-1-1 to 5-1-6.

(Continued)

Primary Examiner — Eugene Lee
Assistant Examiner — Peniel M Gumedzoe
(74) Attorney, Agent, or Firm — Fujitsu Patent Center

(57) ABSTRACT

A method of fabricating a semiconductor device is disclosed that is able to suppress a short channel effect and improve carrier mobility. In the method, trenches are formed in a silicon substrate corresponding to a source region and a drain region. When epitaxially growing p-type semiconductor mixed crystal layers to fill up the trenches, the surfaces of the trenches are demarcated by facets, and extended portions of the semiconductor mixed crystal layers are formed between bottom surfaces of second side wall insulating films and a surface of the silicon substrate, and extended portion are in contact with a source extension region and a drain extension region.

9 Claims, 46 Drawing Sheets

U.S. PATENT DOCUMENTS

| | | | |
|---|---|---|---|
| 6,335,251 B2 | 1/2002 | Miyamo et al. | |
| 6,368,927 B1 | 4/2002 | Lee | |
| 6,451,704 B1 | 9/2002 | Pradeel et al. | |
| 6,593,618 B2 | 7/2003 | Kamata et al. | |
| 6,621,131 B2 | 9/2003 | Murthy et al. | |
| 6,921,913 B2 | 7/2005 | Yeo et al. | |
| 7,378,305 B2 | 5/2008 | Hatada | |
| 2003/0098479 A1 | 5/2003 | Murthy et al. | |
| 2003/0136985 A1* | 7/2003 | Murthy et al. | 257/288 |
| 2003/0235966 A1 | 12/2003 | Kim et al. | |
| 2004/0262683 A1 | 12/2004 | Bohr | |
| 2005/0006637 A1 | 1/2005 | Iinuma et al. | |
| 2005/0026367 A1* | 2/2005 | Streck et al. | 438/259 |
| 2005/0112817 A1* | 5/2005 | Cheng et al. | 438/219 |
| 2005/0285203 A1 | 12/2005 | Fukutome et al. | |
| 2005/0287752 A1 | 12/2005 | Nouri et al. | |
| 2006/0138398 A1 | 6/2006 | Shimamune | |
| 2006/0151776 A1 | 7/2006 | Hatada et al. | |
| 2006/0197164 A1 | 9/2006 | Lindert et al. | |
| 2006/0202278 A1 | 9/2006 | Shima | |
| 2006/0289856 A1 | 12/2006 | Shimamune et al. | |
| 2007/0012919 A1 | 1/2007 | Oh et al. | |
| 2009/0280612 A1 | 11/2009 | Shimamune et al. | |
| 2011/0049533 A1 | 3/2011 | Shimamune et al. | |

FOREIGN PATENT DOCUMENTS

| | | |
|---|---|---|
| JP | 2002-231942 | 8/2002 |
| JP | 2002-530864 | 9/2002 |
| JP | 2004-031753 | 1/2004 |
| WO | WO 00/30169 | 5/2000 |

OTHER PUBLICATIONS

Quirk, et al., "Semiconductor Manufacturing Technology, 2001", 2001, 215.

Thompson, Scott et al., "A 90-nm Logic Technology Featuring Strained-Silicon", *IEEE Transactions on Electron Devices*, vol. 51, No. 11, Nov. 2004, 1790-1797.

USPTO, [GUMEDZOE] "U.S. Appl. No. 11/471,732 (parent)," [CTRS] Requirement for Restriction/Election issued on Feb. 4, 2009.

USPTO, [GUMEDZOE] "U.S. Appl. No. 11/471,732 (parent)," [CTNF] Non-Final Rejection issued on May 28, 2009.

USPTO, [GUMEDZOE] "U.S. Appl. No. 11/471,732 (parent)," [NOA] Notice of Allowance and Fees Due issued on Nov. 2, 2009.

USPTO, [GUMEDZOE] "U.S. Appl. No. 11/229,745", [CTFR] Final Rejection issued on Jul. 24, 2008.

USPTO, [GUMEDZOE] "U.S. Appl. No. 11/229,745", [CTNF] Non-Final Rejection issued on Sep. 6, 2007.

USPTO, [GUMEDZOE] "U.S. Appl. No. 11/229,745", [CTNF] Non-Final Rejection issued on Jan. 22, 2009.

USPTO, [GUMEDZOE] "U.S. Appl. No. 11/229,745", [CTRS] Requirement for Restriction/Election issued on May 29, 2007.

USPTO, [GUMEDZOE] "U.S. Appl. No. 11/229,745", [NOA] Notice of Allowance and Fees Due issued on May 14, 2009.

USPTO, [ABDELAZIEZ] "U.S. Appl. No. 12/458,621", [NOA] Notice of Allowance and Fees Due issued on Jul. 23, 2010.

USPTO, [ABDELAZIEZ] "U.S. Appl. No. 12/458,621", [NOA] Notice of Allowance and Fees Due issued on Nov. 1, 2010.

USPTO, [ABDELAZIEZ] "U.S. Appl. No. 12/916,953", CTNF] Non-Final Rejection issued on Mar. 9, 2011.

\* cited by examiner

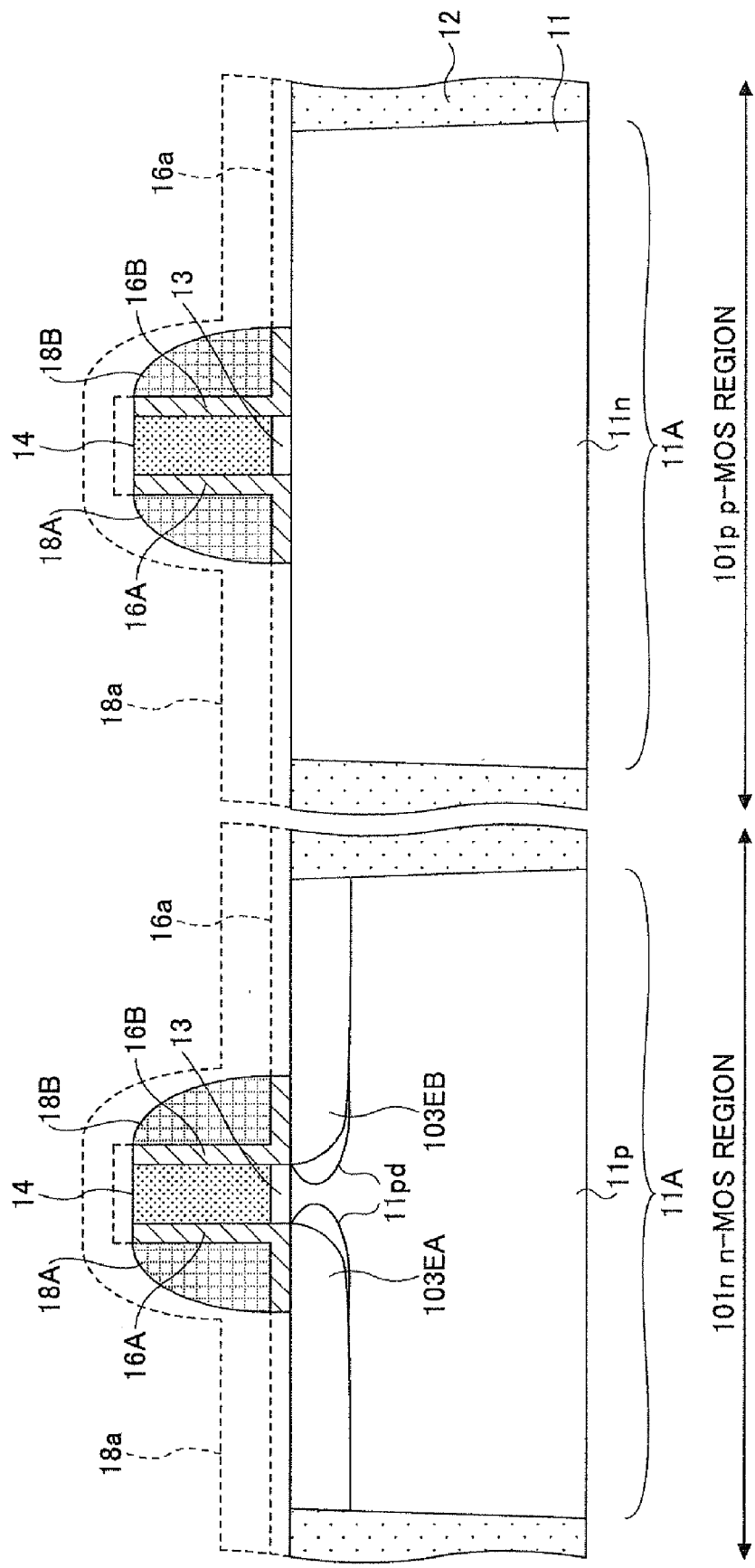

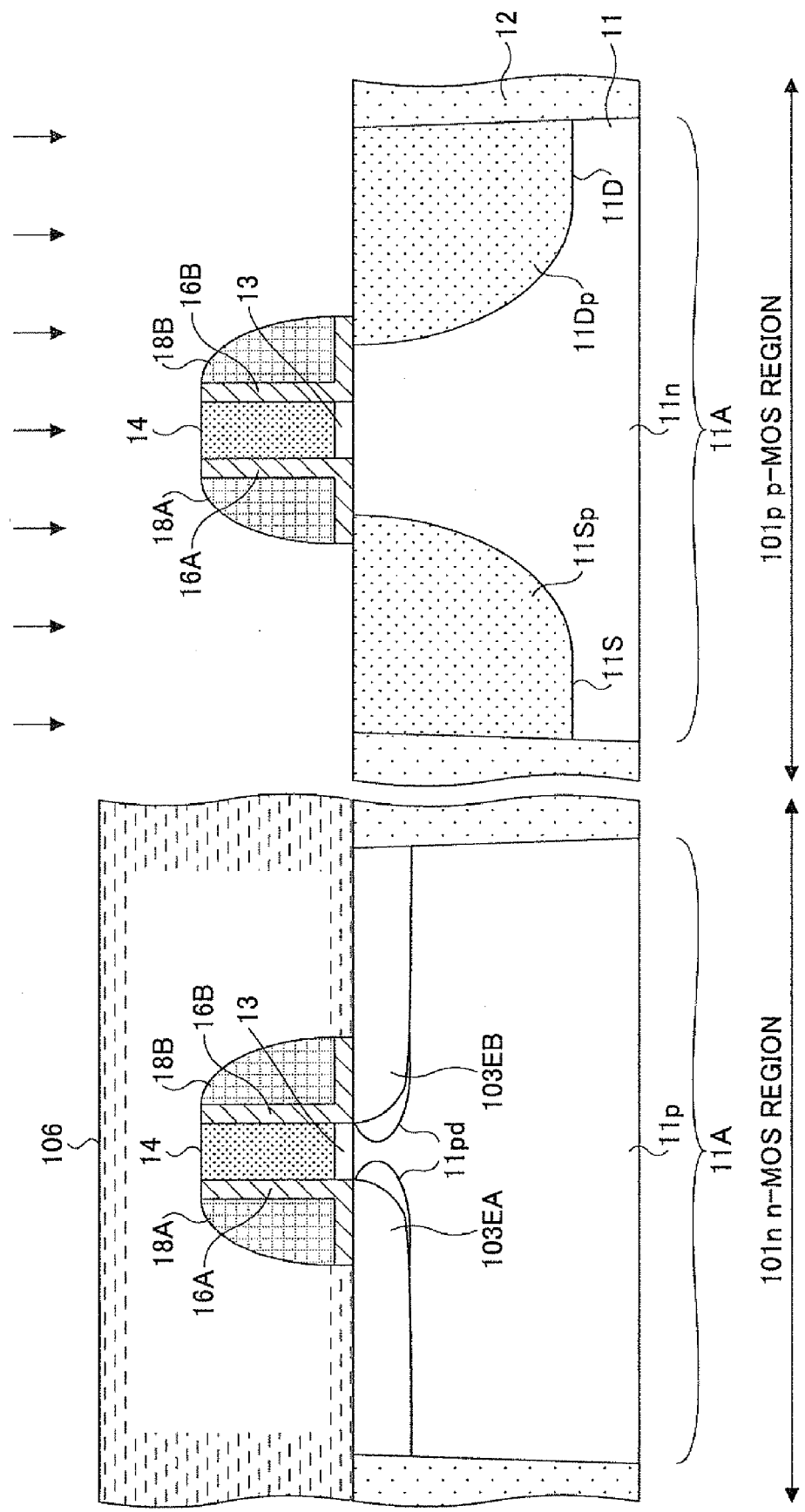

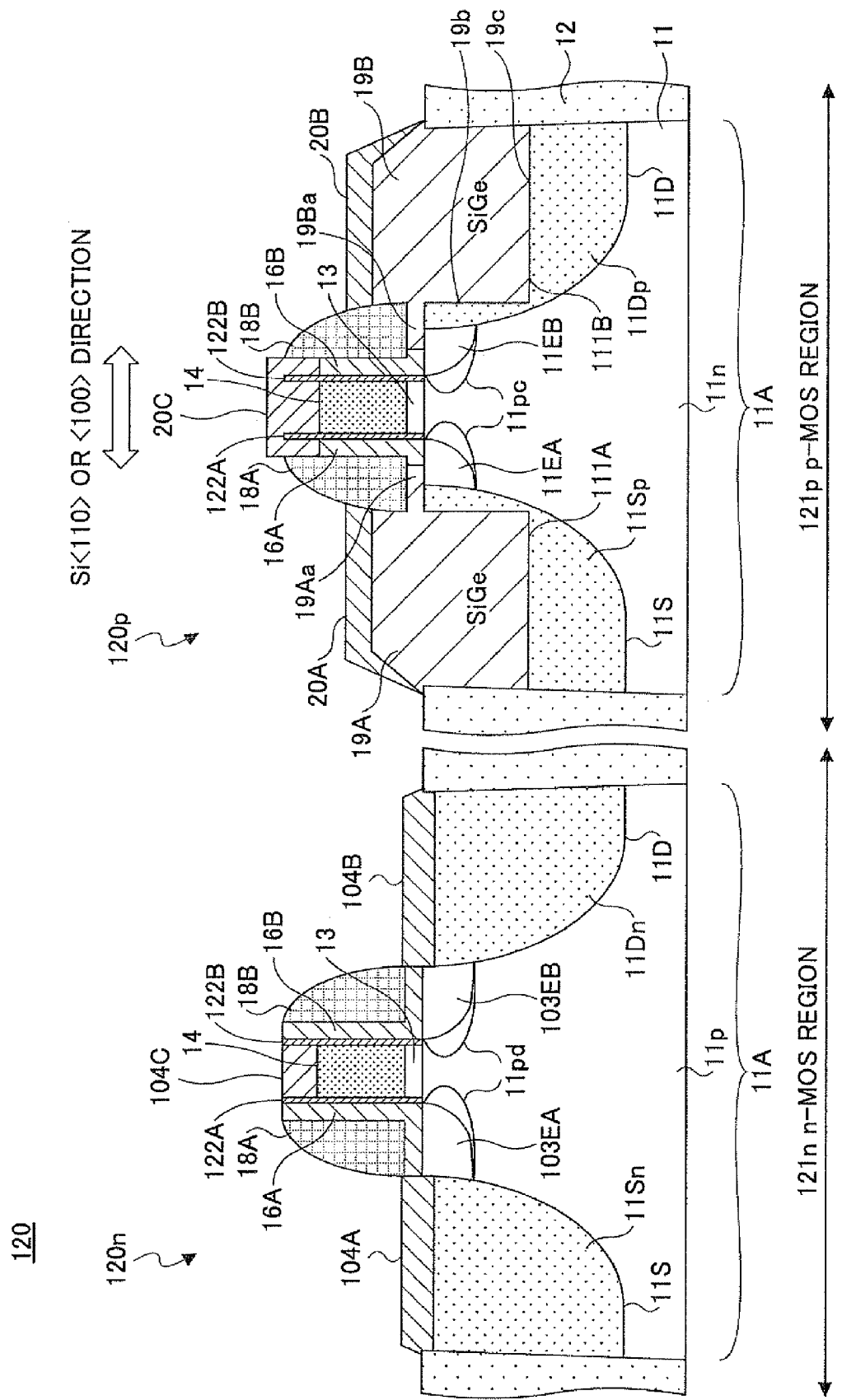

SEMICONDUCTOR DEVICE AND PRODUCTION METHOD THEREOF

CROSS-REFERENCE TO RELATED APPLICATION

The present application is a divisional application of U.S. patent application Ser. No. 11/471,732, filed Jun. 21, 2006, which is a continuation-in-part application of the U.S. patent application Ser. No. 11/229,745 filed on Sep. 20, 2005, which issued as U.S. Pat. No. 7,579,617, on Aug. 25, 2009, the aforementioned '745 application being based on Japanese Priority Patent Applications No. 2005-182382 filed on Jun. 22, 2005 and No. 2006-162134 filed on Jun. 12, 2006. The entire contents of each of these applications are hereby incorporated by reference.

BACKGROUND OF THE INVENTION

1. Field of the Invention

The present invention generally relates to a semiconductor device and a method of producing the semiconductor device, and particularly, to a semiconductor device having a high operating speed due to stress application, and a method of producing the semiconductor device.

2. Description of the Related Art

A semiconductor device is made at a smaller and smaller scale in order to increase its operating speed and expand its functions, and so far, large scale integrated circuits (LSI) including transistors having a gate length less than 100 nm have been fabricated. When a transistor is miniaturized following a scaling rule more and more, the operating speed of the semiconductor device increases accordingly. However, when the gate length becomes extremely short, a threshold voltage decreases, namely, a so-called "short channel" effect occurs. Various methods are proposed to reduce the short channel effect, but effects of these methods are becoming more and more limited.

On the other hand, since mobility of holes is lower than mobility of electrons in silicon, it has been a crucial issue in the related art to increase the operating speed of a p-channel MOS (Metal-Oxide-Silicon) transistor, in which holes serve as carriers.

The p-channel MOS transistor is a component of a CMOS (Complementary MOS) inverter circuit, which is a basic element of a logic circuit. Hence, if the p-channel MOS transistor cannot operate at high speed, speed of the CMOS inverter circuit cannot be increased, either, and in turn, speed of the LSI cannot be increased.

A method is well know for improving hole mobility by applying a compressive stress to a channel region of a silicon substrate.

FIG. 1 is a cross-sectional view of a p-channel MOS transistor 100 involving compressive stress.

As shown in FIG. 1, a gate electrode 203 is arranged on a silicon substrate 201 with a gate insulating film 202 in between. On side walls of the gate electrode 203, side-wall insulating films 204A and 104B are provided to cover the surface of the silicon substrate 201.

In the silicon substrate 201, a channel region is formed beneath the gate electrode 103. In addition, in the silicon substrate 201, a source extension region 201A and a drain extension region 101B, in which p-type impurity elements are implanted, are formed on the two sides of the gate electrode 203. Further, a source region 201S and a drain region 201D, in which p-type impurity elements are implanted, are formed outside the source extension region 201A and the drain extension region 201B. Holes move from the source region 201S, and pass through the source extension region 201A, the channel region, and the drain extension region 201B, and finally arrive at the drain region 201D. Magnitude of a current of the holes is controlled by a gate voltage applied to the gate electrode 203 in the channel region.

Further, in the p-channel MOS transistor 200, SiGe mixed crystal layers 205A and 205B are formed in regions outside the side-wall insulating films 204A and 204B in the silicon substrate 201. The SiGe mixed crystal layers 205A and 205B are formed in the silicon substrate 201 by epitaxial growth. Because the lattice constant of the SiGe mixed crystal layers 205A and 205B is greater than the lattice constant of the silicon substrate 201, a compressive stress is induced in the SiGe mixed crystal layers 205A and 205B in a horizontal direction as indicated by arrows "a" in FIG. 1. Due to the compressive stress, lattices of the SiGe mixed crystal layers 205A and 205B stretch in a vertical direction as indicated by an arrow "b" in FIG. 1, namely, distortion of the lattices occurs.

Due to this distortion, in the channel region of the silicon substrate 201, which is sandwiched by the SiGe mixed crystal layers 205A and 205B, the lattice of the silicon substrate 201 stretches in the vertical direction as indicated by an arrow "c" in FIG. 1, in response to the stretch of the lattices of the SiGe mixed crystal layers 205A and 205B. As a result, in the channel region of the silicon substrate 201, a uniaxial compressive stress is induced in the horizontal direction as indicated by arrows "d" in FIG. 1.

In the p-channel MOS transistor 200 shown in FIG. 1, because of the uniaxial compressive stress in the channel region, symmetry of the silicon crystal in the channel region is locally modulated. In response to the change of the symmetry in the channel region, the degeneracy of heavy-hole valence bands and light-hole valence bands is removed. As a result, the hole mobility increases in the channel region, and the operating speed of a transistor rises. Particularly, the increase in hole mobility due to the compressive stress locally induced in the channel region and increase in transistor operating speed are significant in a transistor having a gate length less than 100 nm.

For example, reference can be made to U.S. Pat. No. 6,621, 131 (below, referred to as "reference 1") for details of the technique.

SUMMARY OF THE INVENTION

It is a general object of the present invention to solve one or more of the problems of the related art.

It is a more specific object of the present invention to provide a semiconductor device able to suppress a short channel effect and improve carrier mobility, and a method of producing the semiconductor device.

According to a first aspect of the present invention, there is provided a semiconductor device, including: a silicon substrate having a channel region; a gate electrode formed over the silicon substrate corresponding to the channel region with a gate insulating film in between; a first side wall insulating film formed on side walls of the gate electrode; a second side wall insulating film formed on side surfaces of the first side wall; a source extension region and a drain extension region formed from diffusion regions having a predetermined conductivity, said diffusion regions being formed in the silicon substrate on sides of the gate electrode to sandwich the channel region; a source region and a drain region formed from diffusion regions having the predetermined conductivity, said diffusion regions being formed in the silicon substrate outside the second wall insulating film and in contact with the source extension region and the drain extension region, respectively; and a semiconductor mixed crystal layer formed in the silicon substrate outside the second side wall insulating film and epitaxially growing over the silicon substrate, wherein the semiconductor mixed crystal layer is formed from a SiGe mixed crystal when the predetermined conductivity is p-type, or from a SiC mixed crystal when the predetermined conductivity is n-type, the semiconductor mixed crystal layer includes an impurity having the predetermined conductivity, the semiconductor mixed crystal layer is grown to a height different from an interface between the silicon substrate and the gate insulating film, and the semiconductor mixed crystal layer has an extended portion between a bottom surface of the second side wall insulating film and a surface of the silicon substrate, said extended portion being in contact with a portion of the source extension region and the drain extension region.

According to the present invention, because a semiconductor mixed crystal layer having a predetermined conductivity is epitaxially grown on the sides of the channel region, a uniaxial stress is induced in the channel region, and this improves greatly the mobility of carriers through the channel region.

In addition, because the semiconductor mixed crystal layer has an extended portion, which is located between a bottom surface of the second side wall insulating film and a surface of the silicon substrate, and is in contact with a portion of one of the source extension region and the drain extension region, according to research of the inventors of the present invention, the extended portion of the semiconductor mixed crystal layer induces a stress opposite to the uniaxial stress within the substrate plane in the silicon substrate just below the semiconductor mixed crystal layer, and indirectly induces a stress in the same direction as the uniaxial stress on the silicon crystal in the channel region. Because this stress is in the same direction as the uniaxial stress, it tends to increase the stress in the channel region, and this further increases the mobility of the carriers.

For example, when the semiconductor device is a p-channel MOS transistor, the semiconductor mixed crystal layer is formed from a SiGe mixed crystal layer, and a compressive stress is applied from the SiGe mixed crystal layer on the two sides of the channel region to the channel region along a moving direction of holes. Because the extended portion of the SiGe mixed crystal layer is in contact with a portion of the source extension region or the drain extension region, which are in proximity of the source region and the drain region, the extended portion of the SiGe mixed crystal layer applies a stretching stress on the source extension region or the drain extension region. In this case, because the side surfaces of the source region and the drain region are fixed by the SiGe mixed crystal layer, the extended portion of the SiGe mixed crystal layer induces stretched deformation in the source extension region and the drain extension region in contact with the extended portion, and the stretching deformation generates an opposite stress in the silicon crystal in the channel region not in contact with the SiGe mixed crystal layer. As a result, it is possible to effectively apply the compressive stress on the channel region together with the deformation generated by the SiGe mixed crystal layer in the source and drain regions. This further increases the mobility of the carriers.

On the other hand, when the semiconductor device is an n-channel MOS transistor, the semiconductor mixed crystal layer is formed from a SiC mixed crystal layer, and a stretching stress is induced on the channel region along the moving direction of electrons. In this case, because of the extended portion of the SiC mixed crystal layer, a compressive stress is applied on the source extension region and the drain extension region close to the channel region, and it is possible to effectively apply the stretching stress on the channel region, and to further increases the mobility of electrons in the channel region.

Further, because the semiconductor mixed crystal layer includes conductive impurities and is in contact with a portion of one of the source extension region and the drain extension region, stray resistance can be reduced greatly, and this can improve a driving current of the semiconductor device.

According to a second aspect of the present invention, there is provided a method of fabricating a semiconductor device including semiconductor mixed crystal layers on sides of a channel region for inducing a stress in the channel region, comprising the steps of: forming a gate insulating film over the silicon substrate; forming a gate electrode over the silicon substrate in correspondence to the channel region with the gate insulating film in between; forming first diffusion regions in the silicon substrate on respective sides of the gate electrode and having a predetermined conductivity; forming a first side wall insulating film on side walls of the gate insulating film and the gate electrode, a portion of the first side wall insulating film extending over the silicon substrate; forming a second side wall insulating film on side surfaces of the first side wall; forming second diffusion regions in the silicon substrate outside the second side wall insulating film and having the predetermined conductivity, said second diffusion regions forming a source region and a drain region; forming, by etching, trenches in the silicon substrate corresponding to the source region and the drain region so that side surfaces and bottom surfaces of the trenches are continuously covered by the second diffusion regions, said trenches having side surfaces defined by facets; removing a portion of the first side wall insulating film; growing the semiconductor mixed crystal layer by epitaxial growth to fill up the trenches, said semiconductor mixed crystal layers being grown to a height different from an interface between the silicon substrate and the gate insulating film, wherein in the step of removing, a portion of the first side wall insulating film between a bottom surface of the second side wall insulating film and a surface of the silicon substrate is removed to form a space, and in the step of growing the semiconductor mixed crystal layers, the semiconductor mixed crystal layers fill up the space.

According to the present invention, trenches are formed, and after a portion of the first side wall insulating film between a bottom surface of the second side wall insulating film and a surface of the silicon substrate is removed and a space is formed, the semiconductor mixed crystal layers are grown epitaxially to fill up the trenches and the space.

The semiconductor mixed crystal layers grow from the surface of the silicon substrate in the space, the semiconductor mixed crystal layers fill up the space, and grow along the second side wall insulating film. Hence, in the processing with HF, the semiconductor mixed crystal layers and the second side wall insulating film are in close contact, and the space is filled up. This prevents HF from entering the space between the semiconductor mixed crystal layers and the second side wall insulating film, and prevents the first side wall insulating film from being directly exposed. As a result, it is possible to prevent the first side wall insulating film from being partially removed to expose the silicon substrate, and in a step of forming a silicide layer, it is possible to prevent the silicide layer from damaging, like a spike, the silicon substrate.

These and other objects, features, and advantages of the present invention will become more apparent from the following detailed description of the preferred embodiments given with reference to the accompanying drawings.

BRIEF DESCRIPTION OF THE DRAWINGS

FIG. 23A through FIG. 23G are cross-sectional views illustrating portions of the semiconductor device 100 in FIG. 22 for illustrating a method of fabricating the semiconductor device 100 according to the present embodiment of the present invention;

FIG. 29 is a cross-sectional view illustrating an example of a semiconductor device 120 according to a 19th embodiment of the present invention;

DESCRIPTION OF THE PREFERRED EMBODIMENTS

Below, preferred embodiments of the present invention are explained with reference to the accompanying drawings.

Inventors of the present invention found new technical subject matter as below, which has not been disclosed so far.

Figure 1:
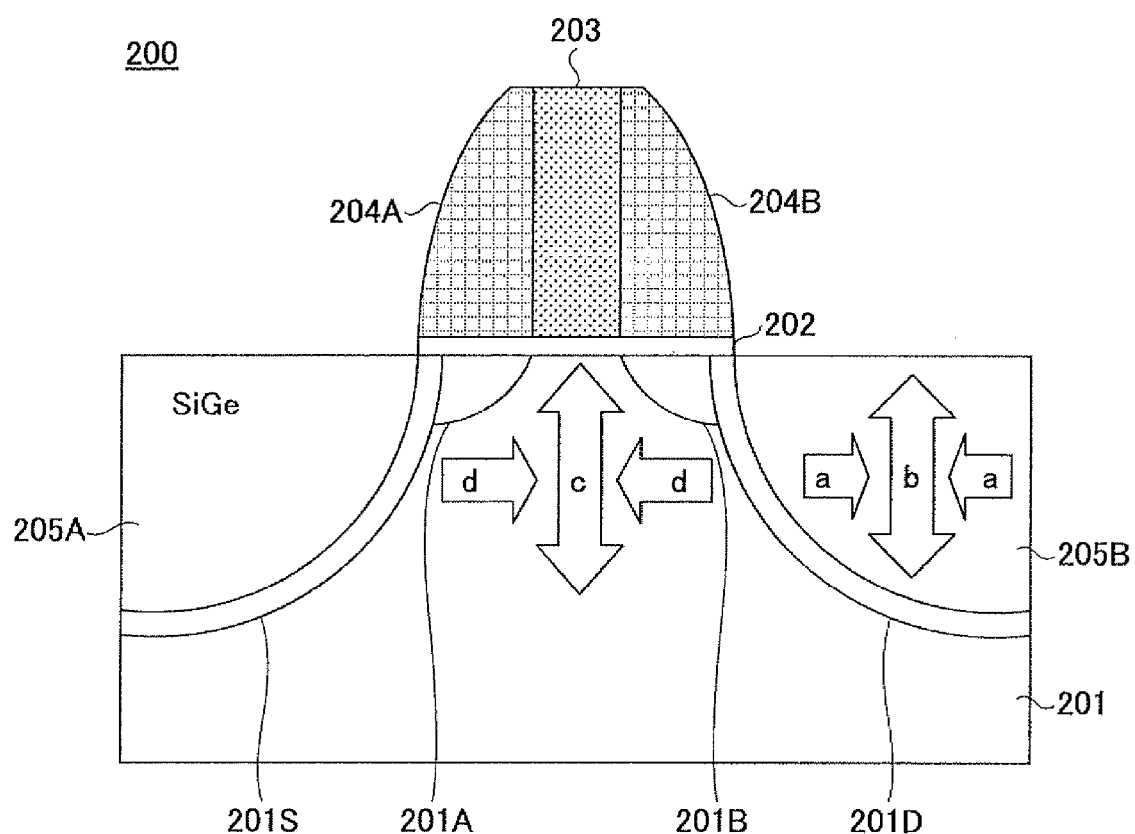
FIG. 1 is a cross-sectional view of a p-channel MOS transistor 100 involving compressive stress.

It is known that when the compressive stress induced in the channel region of a transistor increases, the hole mobility in the channel region rises and a driving current of the transistor increases. Nevertheless, in the p-channel MOS transistor 200 as shown in FIG. 1, when the interval between the SiGe mixed crystal layers 205A and 205B is large, the vertical stretch at the center of the channel region of the silicon substrate 201 becomes small, and due to this, a sufficiently large compressive stress cannot be induced in the channel region. In order to increase the compressive stress, it is effective to reduce the interval between the SiGe mixed crystal layers 205A and 205B.

However, in a transistor having an extremely short gate length, the source extension region 201A and the drain extension region 201B on the two sides of the channel region, and non-illustrated pocket implantation regions formed on the inside of the source extension region 201A and the drain extension region 201B have functions of suppressing the short channel effect. Because the SiGe mixed crystal layers 205A and 205B are formed after implanting impurities into the source extension region 201A, the drain extension region 201B, and the pocket implantation regions, it is necessary to form trenches in proximity of these impurity regions. Hence, when it is attempted to reduce the interval between the SiGe mixed crystal layers 205A and 205B, when forming the trenches, impurity profiles are disturbed, roll-off characteristics of a threshold voltage is degraded, and a leakage current rises, namely, the short channel effect occurs.

In other words, when it is attempted to increase the compressive stress and thus increase the driving current by reducing the interval between the SiGe mixed crystal layers 205A and 205B, trade-off with suppression of the short channel effect should be considered.

For example, this issue is discussed in "S. E. Thompson et al., IEEE Transactions on Electrons Devices, Vol. 51, No. 11, November, 2004, pp. 1790-1797" (below, referred to as "reference 2").

Figure 2:
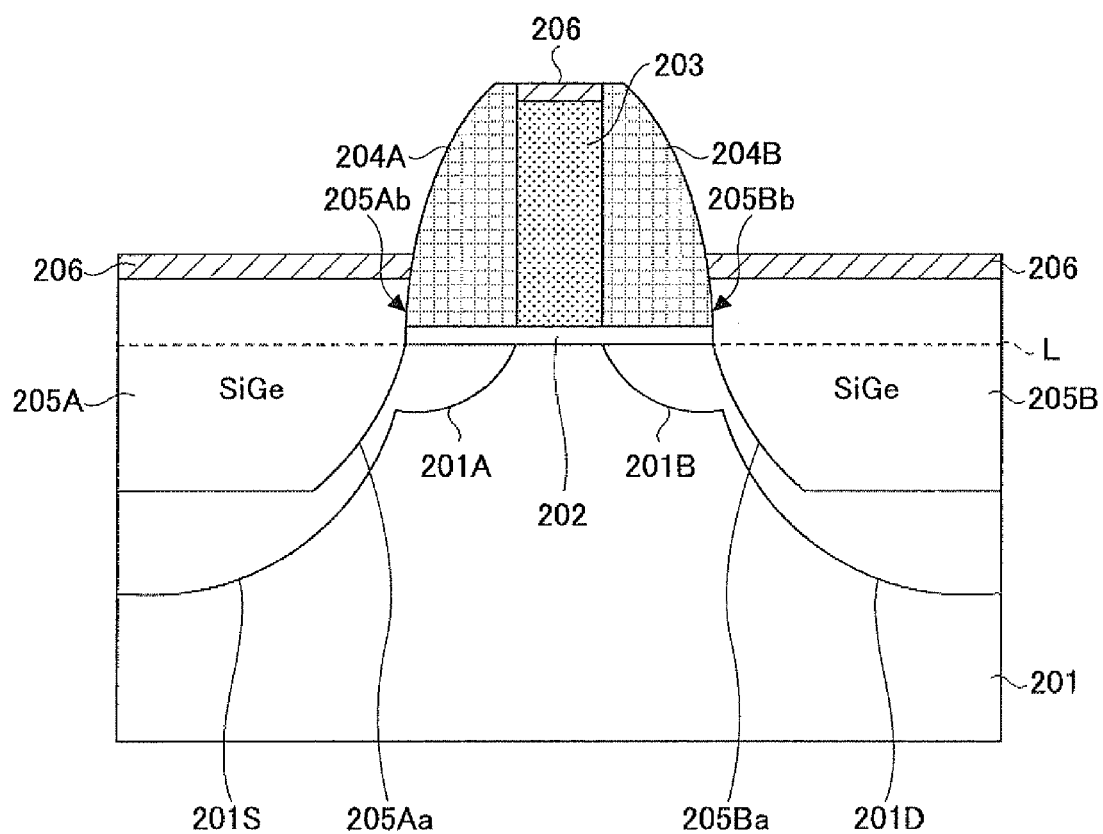
FIG. 2 is a cross-sectional view of a MOS transistor disclosed in reference 2.

FIG. 2 is a cross-sectional view of a MOS transistor disclosed in reference 2.

The MOS transistor is a modification of the MOS transistor 200 in FIG. 1, therefore, the same reference numbers are assigned to the same elements as those in FIG. 1, and overlapping descriptions are omitted.

As illustrated in FIG. 2, the SiGe mixed crystal layers 205A and 205B are epitaxially grown again to fill up trenches 205Aa and 205Ba formed in the silicon substrate 201 up to a height L indicated by a dotted line in FIG. 2. As illustrated in FIG. 2, the height L is higher than the interface between the silicon substrate 201 and the gate insulating film 202.

In FIG. 2, a silicide layer 206 is formed on the SiGe mixed crystal layers 205A and 205B; in fact, a nickel silicide layer is used in 90-nm or sub-90-nm semiconductor devices. When forming the nickel silicide layer, pre-processing is performed with HF (hydrofluoric acid) to remove the native oxide films on surfaces of the SiGe mixed crystal layers 205A and 205B. In this process, if there exist spaces between the SiGe mixed crystal layers 205A and 205B and outer surfaces of the side-wall insulating films 204A and 204B due to facets of the SiGe mixed crystal layers 205A and 205B, the gate insulating film 202, or the side-wall insulating films 204A and 204B, which are formed from silicon oxide films, are dissolved by HF, and part of the surface of the silicon substrate 201 ends up being exposed. If the silicide layer 206 is formed under such conditions, the silicide layer 206 may destroy, like a spike, the pn junction formed between the source extension region 201A and the drain extension region 201B and the n-type silicon substrate 201, and extend to the n-well region of the silicon substrate 201, which causes strong junction leakage.

As described in the following embodiments, the present invention provides a semiconductor device and a method of producing the semiconductor device to solve these problems.

First Embodiment

Figure 3:
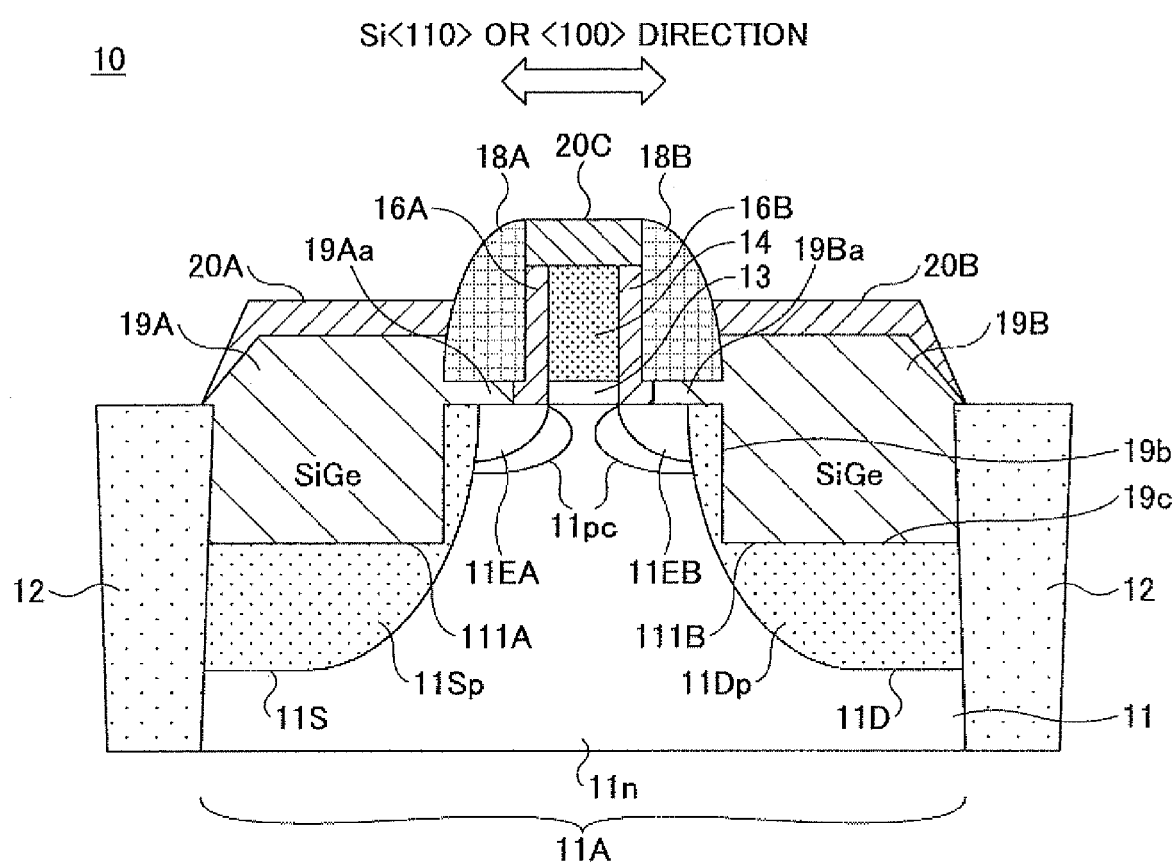
FIG. 3 is a cross-sectional view illustrating an example of a semiconductor device according to a first embodiment of the present invention.

FIG. 3 is a cross-sectional view illustrating an example of a semiconductor device according to a first embodiment of the present invention.

The semiconductor device 10 shown in FIG. 3 is a p-channel MOS transistor, in which a device region 11A demarcated by an element separation region 12 is formed on a single crystal silicon substrate 11 having a (100) crystal plane as a principal plane. Corresponding to the device region 11A, which is an n-type semiconductor region, an n-type Si well 11n is formed in the silicon substrate 11.

On the silicon substrate 11 including the n-type device region 11A, a gate insulating film 13 is formed on the silicon substrate corresponding to a channel region in the silicon substrate. For example, the gate insulating film 13 may be formed from a thermal oxide film, a silicon nitride film, a silicon oxide nitride film, or others. In this example, it is assumed that the gate insulating film 13 is formed from a silicon oxide nitride film having a thickness of 1.2 nm.

On the gate insulating film 13, a gate electrode 14 is formed from a poly-silicon film including boron (B) or other p-type impurities.

On side-walls of the laminated structure of the gate insulating film 13 and the gate electrode 14, first side wall insulating films 16A and 16B are formed, for example, from a silicon oxide film by CVD. The first side wall insulating films 16A and 16B cover portions of the silicon substrate besides the gate insulating film 13, and cover the side-walls of the laminated structure of the gate insulating film 13 and the gate electrode 14.

Second side-wall insulating films 18A and 18B are formed on side surfaces of the first side walls 16A and 16B, for example, from a silicon nitride film.

In the silicon substrate 11, trenches 111A and 111B are formed outside the second side-wall insulating films 18A and 18B, respectively. SiGe mixed crystal layers 19A and 19B including p-type impurities are grown epitaxially in the trenches 111A and 111B to fill up the trenches 111A and 111B, respectively. The SiGe mixed crystal layers 19A and 19B epitaxially grown on the silicon substrate 11 have lattice constants greater than the silicon substrate 11, and as described above with reference to FIG. 1, a uniaxial compressive stress is applied on the channel region just below the gate electrode 14 in the silicon substrate 11. The second side wall insulating films 18A and 18B cover portions of the SiGe mixed crystal layers 19A and 19B, and cover the side surfaces of the first side walls 16A and 16B.

In the p-channel MOS transistor 10 shown in FIG. 3, n-type pocket implanted regions 11pc are formed in the device region 11A on two sides of the gate electrode 14. For example, the n-type pocket implanted regions 11pc are formed from by implanting Sb or other n-type impurities obliquely. Further, a source extension region 11EA and a drain extension region 11EB are formed to partially overlap the n-type pocket implanted regions 11pc.

The source extension region 11EA and drain extension region 11EB are of p-type, and in contact with p-type diffusion regions 11Sp and 11Dp, respectively, which form a source region 11S and a drain region 11D of the p-channel MOS transistor 10, respectively. The p-type diffusion regions 11Sp and 11Dp enclose the SiGe mixed crystal layers 19A and 19B, respectively, which are portions of the source region 11S and the drain region 11D. Due to this structure, the p-type SiGe mixed crystal layers 19A and 19B having a small bandgap do not directly contact the n-type well 11n, and this reduces a leakage current in a pn junction at the interface between Si and SiGe.

Silicide layers 20A and 20B are formed on the SiGe mixed crystal layers 19A and 19B, respectively, and a silicide layer 20C is formed on the gate electrode 14. Because the silicide layers 20A, 20B, and 20C are actually reaction products between metals and the SiGe mixed crystal layers 19A and 19B, the silicide layers 20A, 20B, and 20C include metal-germano-silicide and metal-silicide. Below, for descriptive convenience, it is simply described that the silicide layers 20A, 20B, and 20C are formed from "silicide".

Although not illustrated, a silicon layer including p-type impurities are formed on the SiGe mixed crystal layers 19A and 19B, and a silicide layer may be formed on the silicon layer, that is, converting the surface of the silicon layer into silicide. This Ge-free silicide layer is superior in thermal resistance compared to the above silicide layers which consume the SiGe mixed crystal layers 19A and 19B directly.

In the p-channel MOS transistor 10 shown in FIG. 3, each of the SiGe mixed crystal layers 19A and 19B has a side surface 19b and a bottom surface 19c, which demarcate the SiGe mixed crystal layers 19A and 19B. The side surface 19b or the bottom surface 19c is a flat facet. The bottom surface 19c is in a (100) plane parallel to the principal plane of the silicon substrate 11, and the side surface 19b is nearly perpendicular to the bottom surface 19c. Due to this, the side surface 19b of the SiGe mixed crystal layer 19A and the side surface 19b of the SiGe mixed crystal layer 19B, which face each other, are nearly perpendicular to the principal plane of the silicon substrate 11, and this structure can effectively confine the uniaxial compressive stress in the channel region.

Preferably, the concentration of Ge in the SiGe mixed crystal layers 19A and 19B is in a range from 20 atom % to 40 atom %, because with the concentration of Ge greater than 20 atom %, a strong compressive stress can be imposed on the channel region, and dislocation defects are preventable on the interface between the silicon substrate 11 and the SiGe mixed crystal layers 19A and 19B.

According to experimental results in the present invention, in the device region 11A of the semiconductor device, it is found that even when the thickness of the semiconductor layer constituting the SiGe mixed crystal layers 19A and 19B, which are formed in regions having limited areas, grows to be greater than a so-called critical film thickness, sometimes, quality of the growing semiconductor layer does not deteriorate. This is different from a model of two-dimensional continuous epitaxial growth. In addition, it is found that even when the concentration of Ge is increased to be higher than a critical concentration, and it is thought that this critical concentration may cause dislocation defects, sometimes, quality of the growing semiconductor layer does not deteriorate. Further, it is found that the effective critical film thickness increases when the growing temperature is lowered, and in the present invention, with thin films of the SiGe mixed crystal layers 19A and 19B, which are selectively grown locally at a low temperature, it is possible to effectively impose deformation on the channel. From this experiment, it is found that the SiGe mixed crystal layers 19A and 19B can be epitaxially grown when the concentration of Ge in the SiGe mixed crystal layers 19A and 19B is to be lower than or equal to 40 atom %.

It is known that in the SiGe mixed crystal layers 19A and 19B having a high Ge concentration, the solubility limit of Boron increases, and concentration of the impurities can be as high as $1 \times 10^{22}$ cm$^{-3}$. Concentration of the impurities in the SiGe mixed crystal layers 19A and 19B is set to be in a range from $1 \times 10^{19}$ cm$^{-3}$ to $1 \times 10^{21}$ cm$^{-3}$. Due to this, it is possible to reduce the resistance of the SiGe mixed crystal layers 19A and 19B.

The SiGe mixed crystal layers 19A and 19B have extended portions 19Aa, 19Ba, which are formed on the respective sides of the first side wall insulating films 16A and 16B below the bottom surface of the second side wall insulating films 18A, 18B and covering the surface of the silicon substrate 11. The extended portions 19Aa and 19Ba are in contact with the source extension region 11EA and the drain extension region 11EB, respectively. As described below, since the SiGe mixed crystal layers 19A and 19B are low resistance CVD films including p-type impurities of high activity, due to the extended portions 19Aa and 19Ba, stray resistance can be greatly reduced. As a result, the short channel effect does not occur, and the current driving capability of the p-channel MOS transistor 10 is improved.

The extended portions 19Aa and 19Ba are epitaxially grown on the silicon substrate 11 just below the extended portions 19Aa and 19Ba. In experiments performed in the present invention, the inventors of the present invention found that by deformation analysis by means of converged electron diffraction and corresponding high order diffracted electron beams, a stretching stress is imposed on the silicon substrate 11 just below the SiGe mixed crystal layers 19A and 19B in the gate length direction. Therefore, it is highly expected that the extended portions 19Aa and 19Ba induce a stretching stress in the gate length direction in the silicon substrate 11 just below the extended portions 19Aa and 19Ba. In this case, because the side surfaces 19b are fixed by the SiGe mixed crystal layers 19A and 19B, it is believed that the extended portions of the SiGe mixed crystal layers 19A and 19B induce stretching deformation in the source extension region 11EA and the drain extension region 11EB, and the stretching deformation generates stress opposite to the silicon crystal in the channel region. As a result, in the p-channel MOS transistor 10 shown in FIG. 3, because of the extended portions 19Aa and 19Ba, which are in contact with the source extension region 11EA and the drain extension region 11EB, it is possible to further increases the hole mobility.

The extended portions 19Aa and 19Ba are formed to fill up a space between the second side wall insulating films 18A and 18B and the surface of the silicon substrate 11. In addition, because of the extended portions 19Aa and 19Ba, the SiGe mixed crystal layers 19A and 19B grow continuously on outer surfaces of the second side wall insulating films 18A and 18B from the extended portions 19Aa and 19Ba. Therefore, the SiGe mixed crystal layers 19A and 19B are in close contact with the second side wall insulating films 18A and 18B, and the extended portions 19Aa and 19Ba of the SiGe mixed crystal layers 19A and 19B cover ends of the first side wall insulating films 16A and 16B. Consequently, during HF processing in a step of forming a silicide film, the first side wall insulating films 16A and 16B are not eroded, and it is possible to prevent a silicide spike from being formed in the silicon substrate 11. Especially, when nickel is used to form the silicide layer, it is difficult to induce a silicide reaction of nickel on SiGe compared to a silicide reaction on Si. However, because of the extended portions 19Aa and 19Ba, it is possible to effectively prevent nickel from being diffused to the source extension region 11EA and the drain extension region 11EB. Consequently, it is possible to prevent direct contact of the silicide layers 20A and 20B with the n-well 11n, and reduce the leakage current.

It is preferable that the extended portions 19Aa and 19Ba be at a distance from the channel region and the gate insulating film 13 just above the channel region. The reasons are described below. When the extended portions 19Aa and 19Ba of the SiGe mixed crystal layers 19A and 19B are in proximity of the channel region and the gate insulating film 13 just above the channel region, Ge atoms in the SiGe mixed crystal layers 19A and 19B diffuse in the channel region in a heat treatment in subsequent processing, and probably cause spread of the channel current. In addition, Ge atoms in the SiGe mixed crystal layers 19A and 19B may diffuse into the gate insulating film 13, and lower reliability of the gate insulating film 13. Considering stray resistance, or magnitude of the stress, protection to the first side wall insulating films 16A and 16B during a HF treatment, and device degradation due to diffusion of Ge atoms, the longitudinal length of the extended portions 19Aa and 19Ba, and the distances between the extended portions 19Aa and 19Ba and the gate insulating film 13 are appropriately determined.

The SiGe mixed crystal layers 19A and 19B are grown to be higher than the interface between the silicon substrate and the gate insulating film 13 by 5 nm to 40 nm. Due to this, it is possible to effectively induce the compressive stress.

When the silicide layers 20A and 20B are formed from nickel silicide, because generally the nickel silicide layers induce a stretching stress on the channel, this stretching stress tends to cancel out the compressive stress. However, because the silicide layers 20A and 20B are formed on the SiGe mixed crystal layers 19A and 19B, and at positions much higher than the interface between the silicon substrate and the gate insulating film 13, the stretching stress induced in the silicide layers 20A and 20B cannot cancel out the compressive stress induced in the channel region.

It is preferable that the gate electrode 14 extend on the silicon substrate 11 nearly in the direction <110>, but the gate electrode 14 may also extend nearly in the direction <100>.

In the p-channel MOS transistor 10 shown in FIG. 3, enhancement of hole mobility due to application of the compressive stress on the channel region is noticeable when the silicon substrate 11 is a so-called (100) substrate, and the gate length direction on the silicon substrate 11 is along the <110> direction or the <100> direction, especially, when in the <110> direction. Here, the <100> direction includes the [100] direction and directions equivalent to the [100] direction in a diamond structure. The same is true for the <110> direction.

Below, a method of fabricating the semiconductor device 10 in FIG. 3 is explained with reference to FIG. 4A through FIG. 4C, and FIG. 5A and FIG. 5B.

Figure 4A:
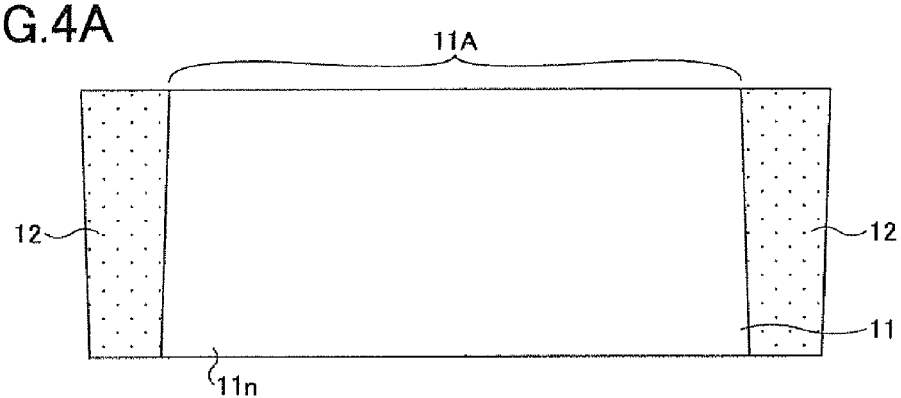
FIG. 4A through FIG. 4C are cross-sectional views illustrating portions of the semiconductor device 10 in FIG. 3 for illustrating a method of fabricating the semiconductor device 10 according to the present embodiment of the present invention.
Figure 4B:
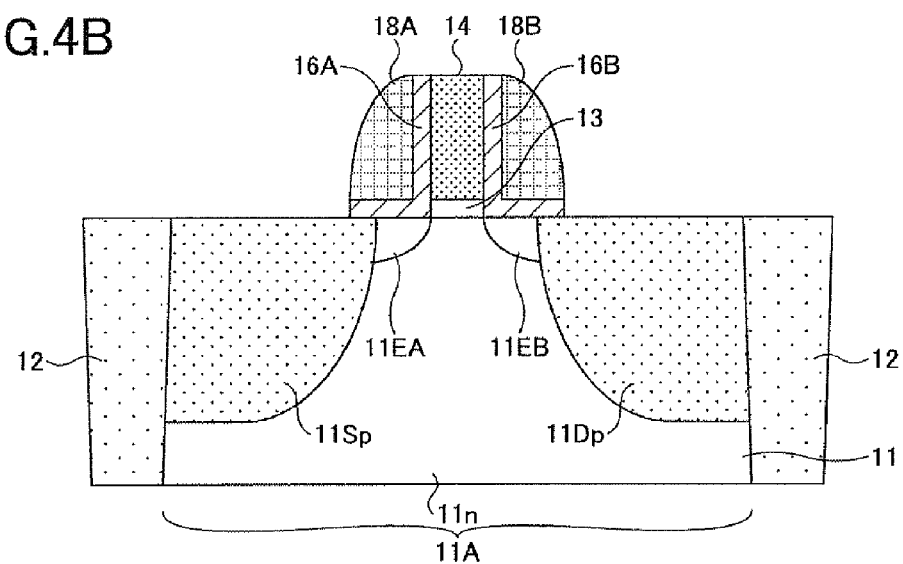
Figure 4C:
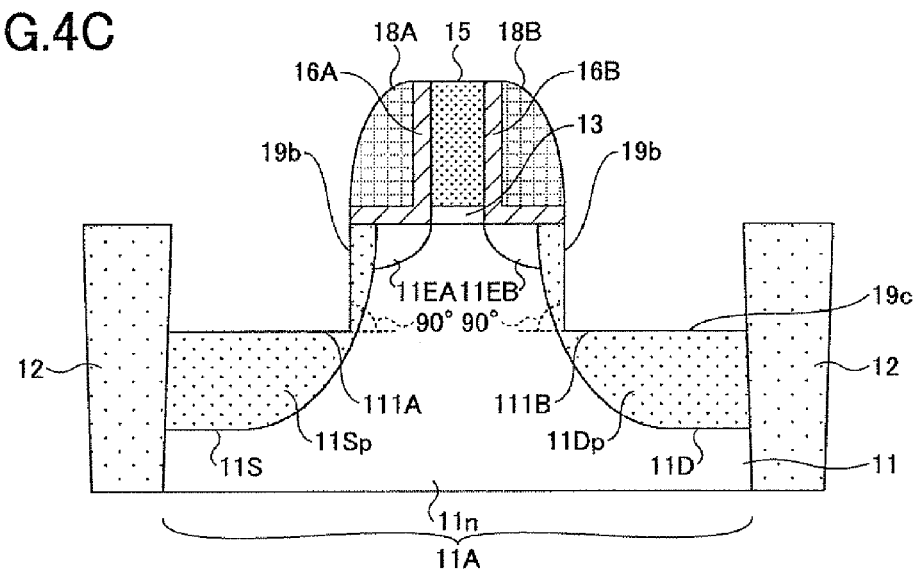

FIG. 4A through FIG. 4C are cross-sectional views illustrating portions of the semiconductor device 10 in FIG. 3 for illustrating a method of fabricating the semiconductor device 10 according to the present embodiment of the present invention.

In the step shown in FIG. 4A, on the p-type silicon substrate 11, the device region 11A is demarcated by the element separation region 12, which is a STI-type; n-type impurities are implanted into the device region 11A, thereby, the n-type Si well 11n is formed corresponding to the device region 11A.

Next, in the step shown in FIG. 4B, on the silicon substrate 11, corresponding to the device region 11A, the gate insulating film 13 and the gate electrode 14 are formed from patterning of a SiON film and a poly-silicon film, which are uniformly formed on the silicon substrate 11.

Then, with the gate electrode 14 as a mask, Sb or other n-type impurities are implanted obliquely in the device region 11A, thereby, forming the pocket implantation regions 11pc as shown in FIG. 3. In FIG. 4B and the subsequent drawings, the pocket implantation regions 11pc are not illustrated.

Then, with the gate electrode 14 as a mask, boron (B) or other p-type impurities are implanted in the device region 11A, thereby forming the source extension region 11EA and the drain extension region 11EB.

Then, the first side walls 16A and 16B and the second side-wall insulating films 18A and 18B are formed on the gate electrode 14. Further, boron (B) or other p-type impurities are implanted, and p-type diffusion regions 11Sp and 11Dp are formed outside the second side-wall insulating films 18A and 18B in the device region 11A in the silicon substrate 11.

Next, in the step shown in FIG. 4C, in the silicon substrate 11, a portion of the device region 11A outside the second side-wall insulating films 18A and 18B is etched by dry etching to a depth of 10 to 60 nm. Due to the etching process, trenches 111A and 111B are formed in the device region 11A, which are demarcated by the side surface 19b nearly perpendicular to the principal plane of the silicon substrate 11 and the side surface 19c nearly parallel to the principal plane of the silicon substrate 11.

Figure 5A:
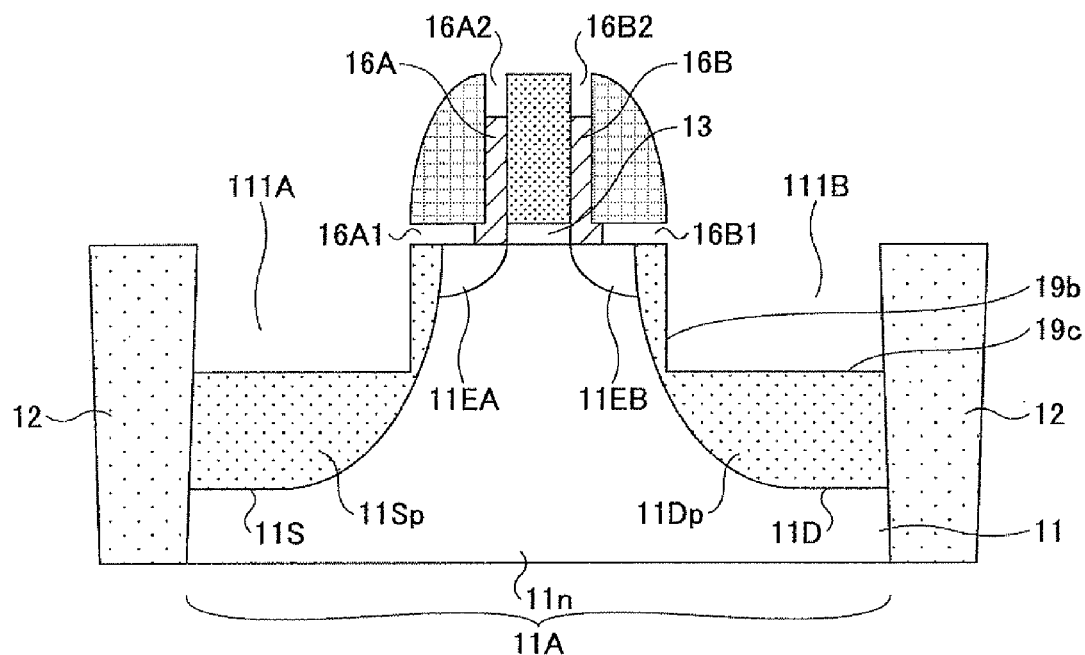
FIG. 5A and FIG. 5B are cross-sectional views illustrating portions of the semiconductor device 10 in FIG. 3 continuing from FIG. 4C for illustrating the method of fabricating the semiconductor device 10 of the present embodiment of the present invention.
Figure 5B:
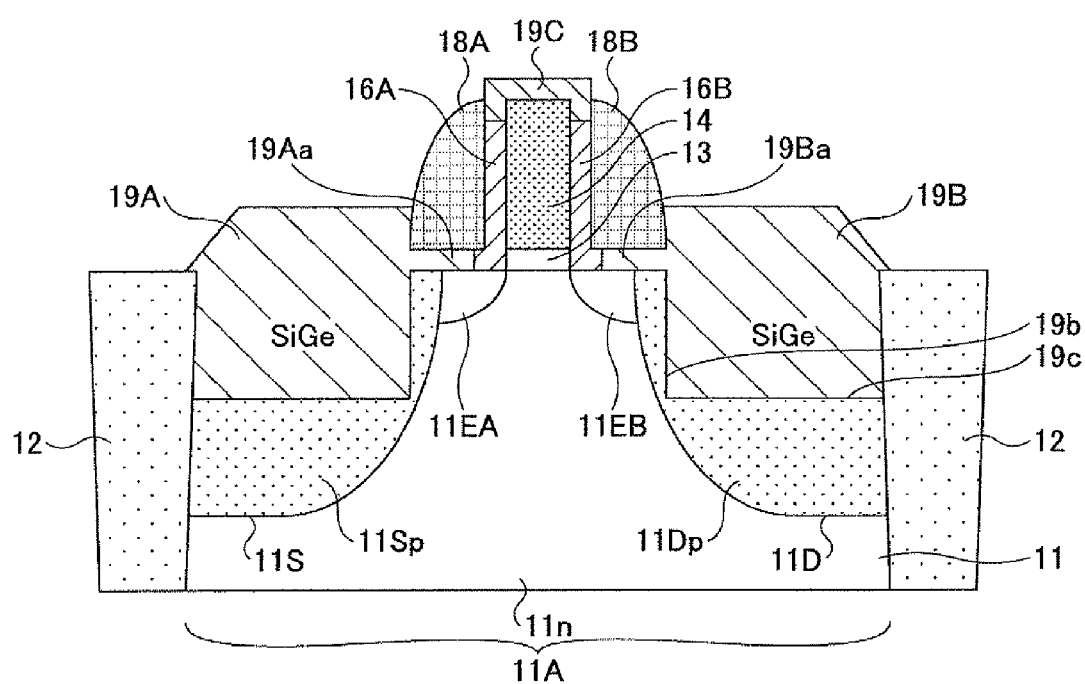

FIG. 5A and FIG. 5B are cross-sectional views illustrating portions of the semiconductor device 10 in FIG. 3 continuing from FIG. 4C for illustrating the method of fabricating the semiconductor device 10 of the present embodiment of the present invention.

In the step shown in FIG. 5A, portions of the first side wall insulating films 16A, 16B, which are formed from silicon oxide films, are removed by isotropic etching, and below the bottom surface of the second side wall insulating films 18A and 18B, the surface of the silicon substrate 11 is exposed, forming spaces 16A1 and 16B1, which are like slits along the gate width direction.

Here, in the isotropic etching, a water solution of HF (for example, the concentration of HF is 5 volume %) or HF vapor is used. Here, as long as the first side wall insulating films 16A, 16B can be selectively etched by the isotropic etching, there are no limitations to the conditions of the isotropic etching. During the isotropic etching, the first side wall insulating films 16A, 16B on the gate electrode 14 are also etched, and forming openings 16A2 and 16B2.

It is preferable that the spaces 16A1 and 16B1 be formed by the isotropic etching such that a large portion of the surface of the silicon substrate 11, on which the source extension region 11EA and the drain extension region 11EB are formed, are exposed through the spaces 16A1 and 16B1, and the spaces 16A1 and 16B1 do not reach the gate insulating film 13.

For example, in FIG. 5A, each of the first side wall insulating films 16A, 16B may be formed to be L-shaped, and cover side surfaces of the gate insulating film 13 and the gate electrode 14.

In the isotropic etching, the amount of the first side wall insulating films 16A, 16B to be removed is determined by the etching time or concentration of HF, and the isotropic etching is performed in such a way that the side surfaces of the gate insulating film 13 and the gate electrode 14 are not exposed.

In the isotropic etching, native oxide films on the trenches 111A and 111B are also removed.

Next, in the step shown in FIG. 5B, the substrate with the structure in FIG. 5A being formed thereon is introduced in a low pressure CVD device, which is filled with hydrogen gas, nitrogen gas, or argon gas, helium gas or other inactive gases, and is maintained at a pressure from 5 to 1330 Pa.

Then, after the temperature is increased to 400 to 550° C. in a hydrogen atmosphere, the pressure is maintained in a range from 5 to 1330 Pa for 5 minutes, to execute baking of the substrate in the hydrogen atmosphere.

Then, at a substrate temperature of 400 to 550° C., and with partial pressures of hydrogen gas, nitrogen gas, or argon gas, helium gas or other inactive gases being in a range from 5 to 1330 Pa, the following gases are supplied in a period from 1 to 40 minutes, that is, a silane ($SiH_4$) gas (as a gas-phase material of silicon) with the partial pressure in a range from 1 to 10 Pa, a germane ($GeH_4$) gas (as a gas-phase material of Ge) with the partial pressure in a range from 0.1 to 10 Pa, a diborane ($B_2H_6$) gas (as a dopant gas) with the partial pressure in a range from $1\times10^{-5}$ to $1\times10^{-3}$ Pa, and a HCl (hydrogen chloride) gas (as a precursor which enhances selectivity) with the partial pressure in a range from 1 to 10 Pa. Consequently, p-type SiGe mixed crystal layers 19A and 19B are epitaxially grown in the trenches 111A and 111B.

At the same time, the extended portions 19Aa, 19Ba of the SiGe mixed crystal layers 19A and 19B are formed in the spaces 16A1 and 16B1 below the bottom surfaces of the second side wall insulating films 18A, 18B. Further, the SiGe mixed crystal layers 19A and 19B grow upward while being in close contact with the side surfaces of the second side-wall insulating films 18A, 18B. At the same time, the SiGe mixed crystal layer 19C is also formed on the surface of the gate electrode 14.

Next, after the step in FIG. 5B, the surfaces of the SiGe mixed crystal layers 19A and 19B, and the SiGe mixed crystal layer 19C on the surface of the gate electrode 14 are converted to silicide layers. Specifically, the surface of the structure in FIG. 5B is treated by using HF to remove native oxide films on the surface. Then, for example, a nickel film is formed by sputtering to cover the structure in FIG. 5B. Then, a RTP (Rapid Thermal Process) device is used to perform a heat treatment (at 400 to 500° C.) to induce reactions with the source region 19A, the drain region 19B, and a SiGe mixed crystal layer 19C on the gate electrode 14, for example, forming a nickel silicide layer (include germano-silicide) having a thickness of 20 nm.

Then, the un-reacted nickel film is etched by wet etching using a mixture of ammonia and hydrogen peroxide (first treatment), and is further etched by wet etching using a mixture of sulfuric acid and hydrogen peroxide (second treatment), thus the un-reacted nickel film is removed. Where necessary, one or more wet etching steps can be omitted. Then, where necessary, the RTP device is used to perform a heat treatment at 400 to 500° C.

Here, instead of the nickel silicide films, Co, Ta, Ti, or PT silicide films may be formed.

In this way, the p-channel MOS transistor 10 in FIG. 3 is fabricated.

In the method of the present embodiment, because the SiGe mixed crystal layers 19A and 19B are formed by CVD with p-type impurities as dopants, an activation rate of the impurities is nearly 100% even without a heat treatment. This rate is higher than the activation rate of the impurities implanted by ion implantation. Therefore, the SiGe mixed crystal layers 19A and 19B have low resistance, and the extended portions 19Aa and 19Ba are in contact with the source extension region 11EA and the drain extension region 11EB, respectively, so that the stray resistance can be reduced greatly, and the current driving capability of the p-channel MOS transistor 10 is improved.

In the step of forming a silicide film to remove the native oxide films on the SiGe mixed crystal layers 19A and 19B by treatment using HF, it is possible to prevent the extended portions 19Aa and 19Ba of the SiGe mixed crystal layers 19A and 19B from contacting the first side wall insulating films 16A and 16B; therefore, the first side wall insulating films 16A and 16B are not eroded, and the surface of the silicon substrate 11 is not exposed. Further, when the silicide layers are formed from nickel silicide, it is difficult to induce a silicide reaction of nickel on SiGe compared to a silicide reaction of nickel on Si. Hence, it is possible to prevent a silicide spike from being formed in the n-well 11n.

In the step shown in FIG. 5B, instead of the processing described above, at an initial stage of growth of the SiGe mixed crystal layers 19A and 19B, the partial pressure of the germane ($GeH_4$) gas (as a gas-phase material of Ge) may be set relatively low, and along with growth of the SiGe mixed crystal layers 19A and 19B, the partial pressure of the germane ($GeH_4$) gas may be increased successively. Due to this, it is possible to prevent dislocation in the interface between the silicon substrate 11 and the SiGe mixed crystal layers 19A and 19B, and effectively form horizontal compressive deformation inside the SiGe mixed crystal layers 19A and 19B.

After the step shown in FIG. 5B, before the step of forming a silicide film, p-type semiconductor layers primarily including Si may be deposited on the SiGe mixed crystal layers 19A and 19B. By siliciding a p-type semiconductor layer primarily including Si, it is possible to prevent degradation of thermal resistance or morphology, which occurs easily in siliciding process when the concentration of Ge is high in the SiGe mixed crystal layers 19A and 19B.

Specifically, at a temperature the same as or lower than that of the SiGe mixed crystal layers 19A and 19B, a silane ($SiH_4$) gas with a partial pressure in a range from 1 to 10 Pa, a diborane ($B_2H_6$) gas with a partial pressure in a range from $1\times10^{-4}$ to $1\times10^{-2}$ Pa, and a HCl (hydrogen chloride) gas with a partial pressure in a range from 1 to 10 Pa are supplied together, and a p-type semiconductor layer of a thickness less than 20 nm is formed on the SiGe mixed crystal layers 19A and 19B.

Because the p-type semiconductor layer is provided for consideration of the subsequent siliciding step, it is preferable that the p-type semiconductor layer be a p-type silicon layer which can be easily silicided, but the p-type semiconductor layer may include Ge of a concentration lower than the concentration of Ge in the SiGe mixed crystal layers 19A and 19B. When the p-type semiconductor layer includes Ge, in growth of the p-type semiconductor layer, a $GeHe_4$ gas with a partial pressure from 0 to 0.4 Pa may be supplied.

As described above, in the p-channel MOS transistor 10 in FIG. 3, because p-type SiGe mixed crystal layers 19A, 19B are epitaxially grown on the sides of the channel region, a uniaxial compressive stress is applied on the channel region. Because the side surface 19b of the SiGe mixed crystal layer 19A and the side surface 19b of the SiGe mixed crystal layer 19B, which face each other, are nearly perpendicular to the principal plane of the silicon substrate 11, it is possible to induce the compressive stress effectively in the channel region.

In addition, because SiGe mixed crystal layers 19A, 19B have extended portions 19Aa and 19Ba, which are in contact with the source extension region 11EA and the drain extension region 11EB, it is expected that the extended portion 19Aa and 19Ba can reduce extension resistance, and the extended portion 19Aa and 19Ba apply a stretching stress in the gate length direction on the silicon substrate just below the extended portion 19Aa and 19Ba. Due to this, it is expected that a compressive stress be applied indirectly on the channel region, thus further strengthening the compressive stress applied on the channel region. As a result, it is possible to improve the current driving capability of the p-channel MOS transistor 10.

Second Embodiment

Figure 6:
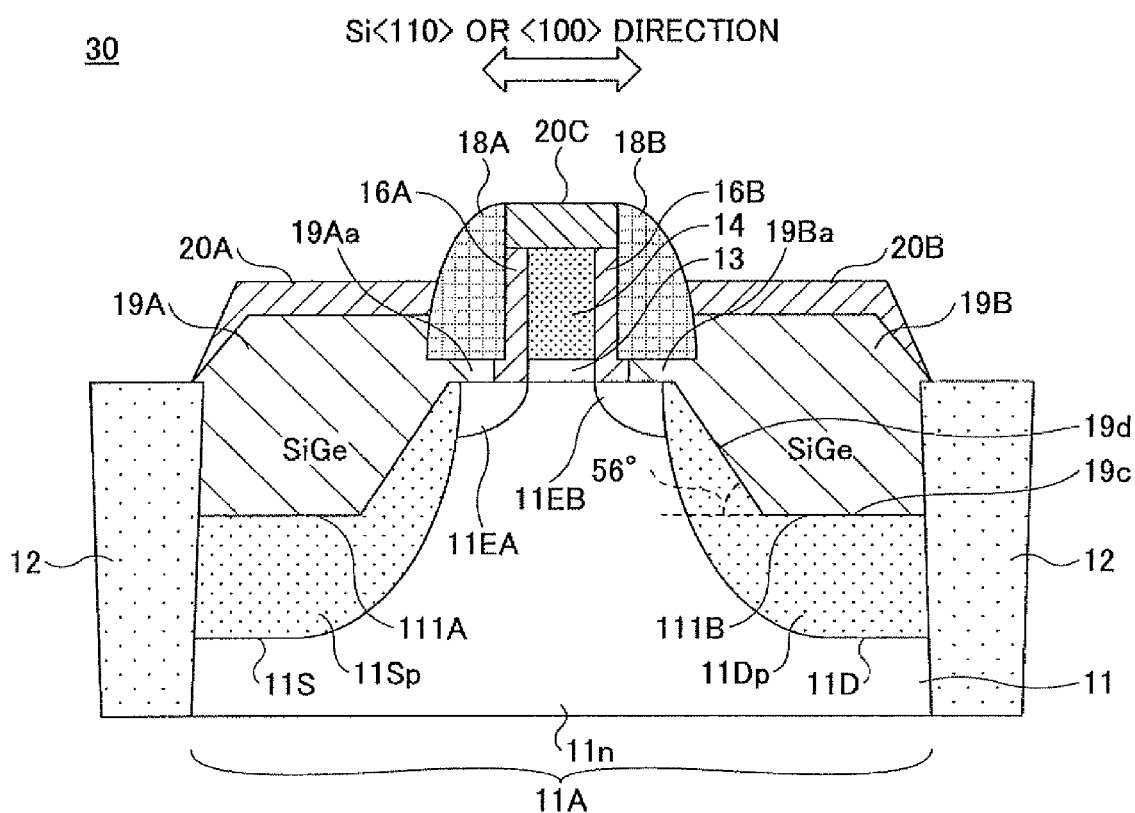
FIG. 6 is a cross-sectional view illustrating an example of a semiconductor device 30 according to a second embodiment of the present invention.

FIG. 6 is a cross-sectional view illustrating an example of a semiconductor device 30 according to a second embodiment of the present invention.

In the following descriptions, the same reference numbers are assigned to the same elements as those described in the previous embodiment, and overlapping descriptions are omitted.

The semiconductor device 30 shown in FIG. 6 is a p-channel MOS transistor. The p-channel MOS transistor 30 is basically the same as the p-channel MOS transistor 10 of the first embodiment except that side surfaces 19d of the trenches 111A and 111B in the silicon substrate 11 are formed from facets along a Si (111) plane.

In the p-channel MOS transistor 30, each of the trenches 111A and 111B in the silicon substrate 11 includes the bottom surface 19c which is nearly parallel to the principal plane of the silicon substrate 11, and the side surface 19d which is formed from the facet along the Si (111) plane at an angle of 56° relative to the bottom surface 19c.

The p-type SiGe mixed crystal layers 19A and 19B are grown epitaxially in the trenches 111A and 111B to fill up the trenches 111A and 111B, respectively.

The same as the first embodiment, the SiGe mixed crystal layers 19A and 19B have extended portions 19Aa, 19Ba, which cover the surface of portions of the silicon substrate 11 where the source extension region 11EA and the drain extension region 11EB are formed. The SiGe mixed crystal layers 19A and 19B grow upward along outer surfaces of the second side wall insulating films 18A and 18B.

The p-channel MOS transistor 30 has the same effects as the p-channel MOS transistor 10 in the first embodiment; additionally, in the p-channel MOS transistor 30, because the facets along the Si (111) plane are formed along impurity concentration profiles in the source region 11S and the drain region 11D, and the source extension region 11EA and the drain extension region 11EB, the SiGe mixed crystal layers 19A and 19B are formed in proximity of the channel region while disturbing the impurity concentration profiles. Therefore, it is possible to more effectively induce the compressive stress in the channel region.

Below, a method of fabricating the semiconductor device 30 in FIG. 6 is explained with reference to FIG. 7A and FIG. 7B.

Figure 7A:
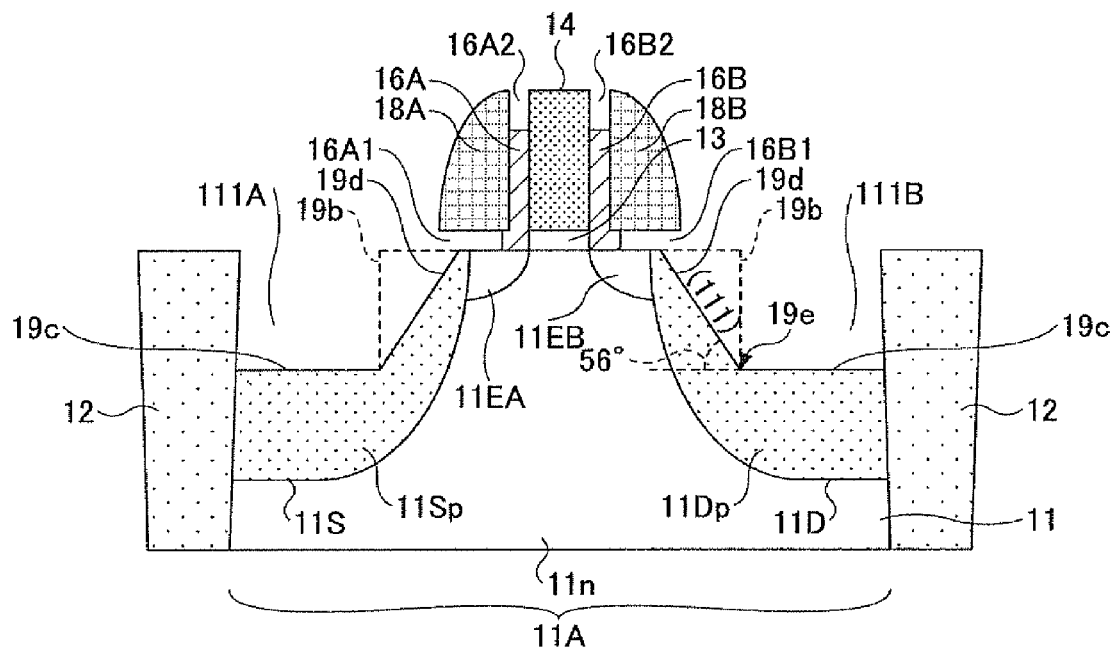
FIG. 7A and FIG. 7B are cross-sectional views illustrating portions of the semiconductor device 30 in FIG. 6 for illustrating a method of fabricating the semiconductor device 30 according to the second embodiment of the present invention.
Figure 7B:
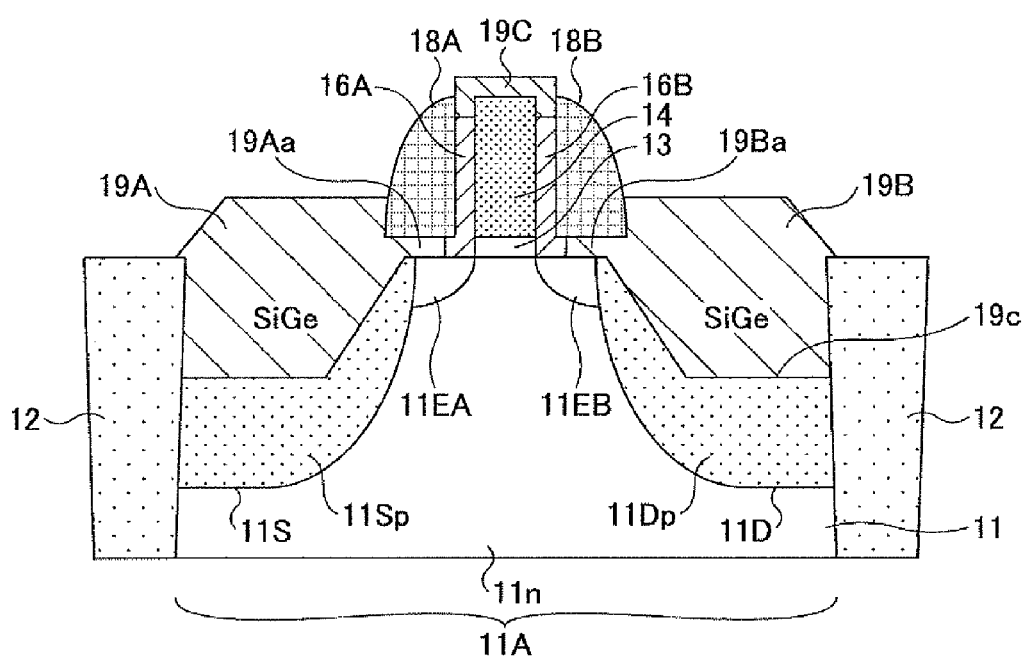

FIG. 7A and FIG. 7B are cross-sectional views illustrating portions of the semiconductor device 30 in FIG. 6 for illustrating a method of fabricating the semiconductor device 30 according to the second embodiment of the present invention.

In the step shown in FIG. 7A, processes shown in FIG. 4A through FIG. 4, and FIG. 5A in the first embodiment are performed.

In the structure fabricated so far, each of the trenches 111A and 111B includes the bottom surface 19c and the side surface 19b which is nearly perpendicular to the bottom surface 19c; the spaces 16A1 and 16B1 are formed below the bottom surface of the second side wall insulating films 18A and 18B and on the surface of the silicon substrate 11; and the openings 16A2 and 16B2 are formed beside the upper portion of the gate electrode 14.

Further, in the step shown in FIG. 7A, the vertical side surface 19b is etched to form the facet in the Si (111) plane at an angle of 56° relative to the principal plane of the silicon substrate 11. In this etching process, wet etching is performed using organic alkali etchants (for example, tetramethyl ammonium hydroxide, such as TMAH, choline), or ammonium hydroxide. Alternatively, the etching process is performed by a heat treatment in a hydrogen and HCl atmosphere at 800° C.

The facet is formed so that the upper end of the side surface 19d does not reach the gate insulating film 13. For this purpose, the side surface 19d is formed to extend upward and obliquely at an angle of 56° relative to the bottom surface 19c from an intersection line 19e of the bottom surface 19c and the vertical side surface 19b of the trenches 111A and 111B. Therefore, the position at which to form the vertical side surface 19b is appropriately selected in the step in FIG. 4C.

The side surface 19d is at a position enclosed by the source region 11S and the drain region 11D, and the source extension region 11EA and the drain extension region 11EB so as not to penetrate the n-well 11n.

Next, in the step shown in FIG. 7B, the SiGe mixed crystal layers 19A and 19B are formed in the same way as shown in FIG. 5B. Then, a siliciding step is performed as described above. In this way, the p-channel MOS transistor 30 in FIG. 6 is fabricated.

In the method of the present embodiment, the SiGe mixed crystal layers 19A and 19B fill up the trenches 111A and 111B, the extended portions 19Aa and 19Ba are formed, and the SiGe mixed crystal layers 19A and 19B grown upward are in close contact with outer surfaces of the second side wall insulating films 18A and 18B. Therefore, it is possible to prevent exposure of the surface of the silicon substrate 11 during HF treatment in the siliciding step, and it is possible to prevent a silicide spike from being formed in the n-well 11n in the siliciding step. Further, when the silicide layers are formed by using nickel, it is difficult to induce a silicide reaction of nickel on SiGe compared to a silicide reaction of nickel on Si, so that formation of the silicide spike in the n-well 11n can be prevented effectively.

Third Embodiment

Figure 8:
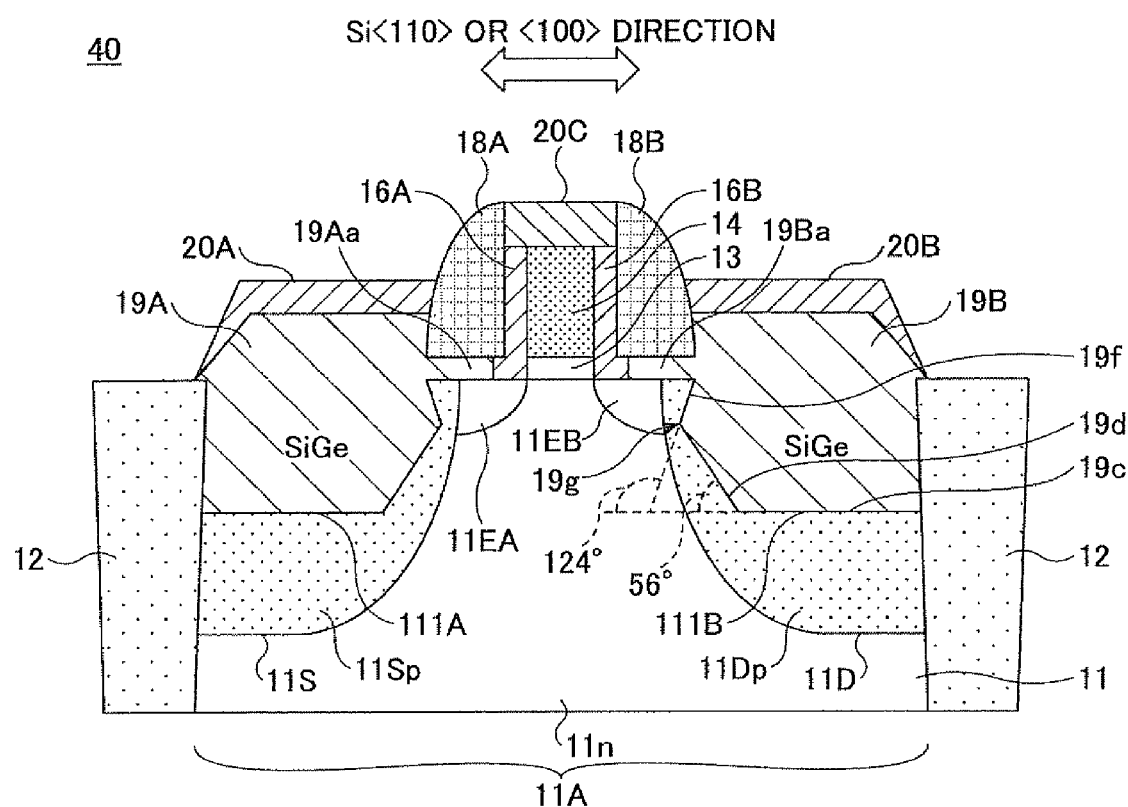
FIG. 8 is a cross-sectional view illustrating an example of a semiconductor device 40 according to a third embodiment of the present invention.

FIG. 8 is a cross-sectional view illustrating an example of a semiconductor device 40 according to a third embodiment of the present invention.

In the following descriptions, the same reference numbers are assigned to the same elements as those described in the previous embodiments, and overlapping descriptions are omitted.

The semiconductor device 40 shown in FIG. 8 is a p-channel MOS transistor. The p-channel MOS transistor 40 is basically the same as the p-channel MOS transistor 10 of the first embodiment except that a side surface 19d and a side surface 19f of the trenches 111A and 111B in the silicon substrate 11 are formed from facets along Si (111) planes of different orientation.

In the p-channel MOS transistor 40, each of the trenches 111A and 111B in the silicon substrate 11 includes the bottom surface 19c nearly parallel to the principal plane of the silicon substrate 11, the side surface 19d which is formed from the facet in the Si (111) plane at an angle of 56° relative to the bottom surface 19c, and extends inward, and a side surface 19f formed from a facet in a Si (111) plane at an angle of 124° relative to the bottom surface 19c. The side surface 19f extends inward from the surface of the silicon substrate 11, which is also the interface between the silicon substrate 11 and the gate insulating film 13.

The side surface 19*d* and the side surface 19*f* intersect, thereby forming a wedge shape facing inward.

The p-type SiGe mixed crystal layers 19A and 19B are grown epitaxially in the trenches 111A and 111B to fill up the trenches 111A and 111B, respectively. The same as the first embodiment, the SiGe mixed crystal layers 19A and 19B have extended portions 19Aa, 19Ba, which cover the surface of portions of the silicon substrate 11 where the source extension region 11EA and the drain extension region 11EB are formed. The SiGe mixed crystal layers 19A and 19B are in contact with the bottom surfaces of the second side wall insulating films 18A and 18B, and grow upward along outer surfaces of the second side wall insulating films 18A and 18B.

In the SiGe mixed crystal layers 19A and 19B, a front end 19*g* of the wedge, which is the intersection line of the side surface 19*d* and the side surface 19*f*, is formed at an inside position relative to the outer surface of the second side wall insulating films 18A or 18B, and the SiGe mixed crystal layers 19A and 19B are near the channel region just below the gate electrode 14. However, the front end 19*g* of the wedge is formed so as not to penetrate into inside of the n-well 11*n* from the source region 11S and the drain region 11D; thus the interval between the SiGe mixed crystal layers 19A and 19B is smaller than that in the previous embodiments.

The p-channel MOS transistor 40 has the same effects as the p-channel MOS transistor 10 in the first embodiment; additionally, in the p-channel MOS transistor 40, it is possible to induce a stronger compressive stress in the channel region than those in the p-channel MOS transistors 10 and 30. Thus, it is possible to further increase the hole mobility and improve the current driving capability of the p-channel MOS transistor 40.

Below, a method of fabricating the semiconductor device 40 in FIG. 8 is explained with reference to FIG. 9A through FIG. 9C.

Figure 9A:
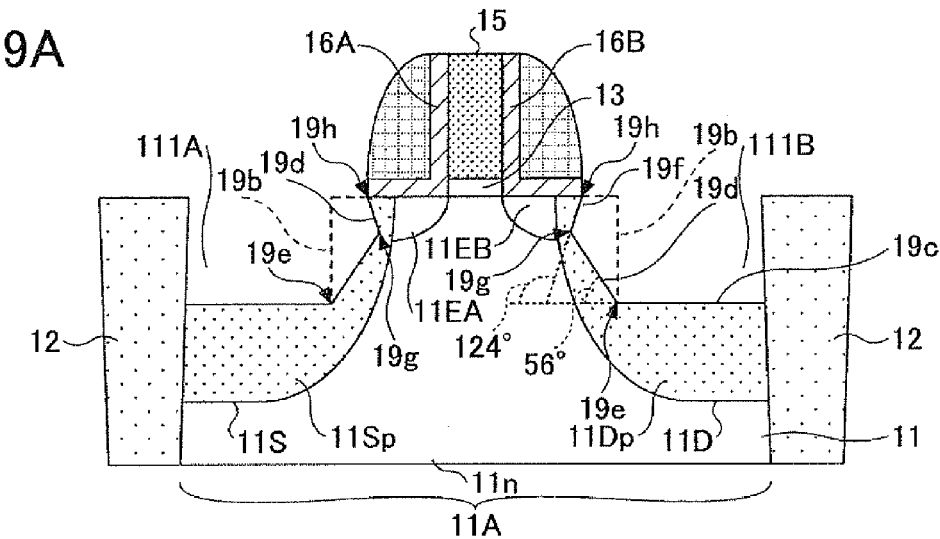
FIG. 9A through FIG. 9C are cross-sectional views illustrating portions of the semiconductor device 40 in FIG. 8 for illustrating a method of fabricating the semiconductor device 40 according to the third embodiment of the present invention.
Figure 9B:
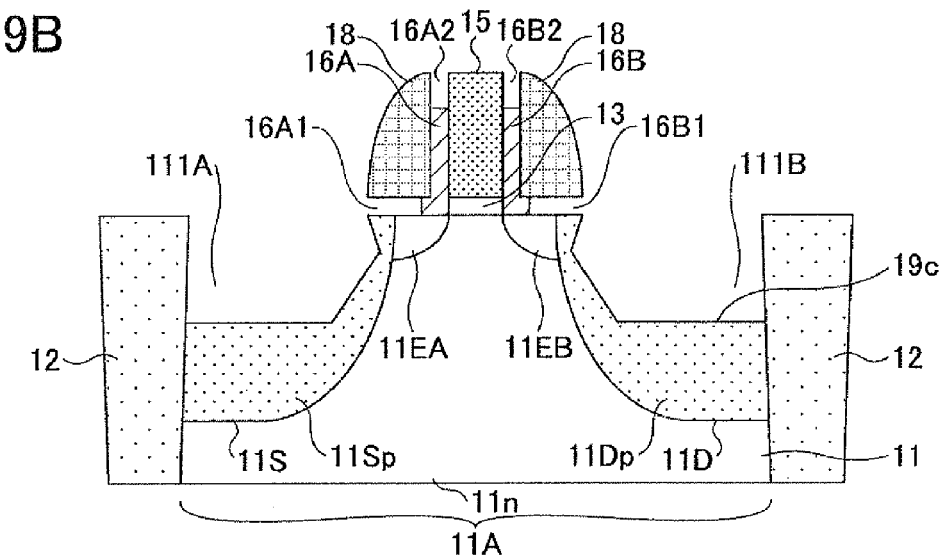
Figure 9C:
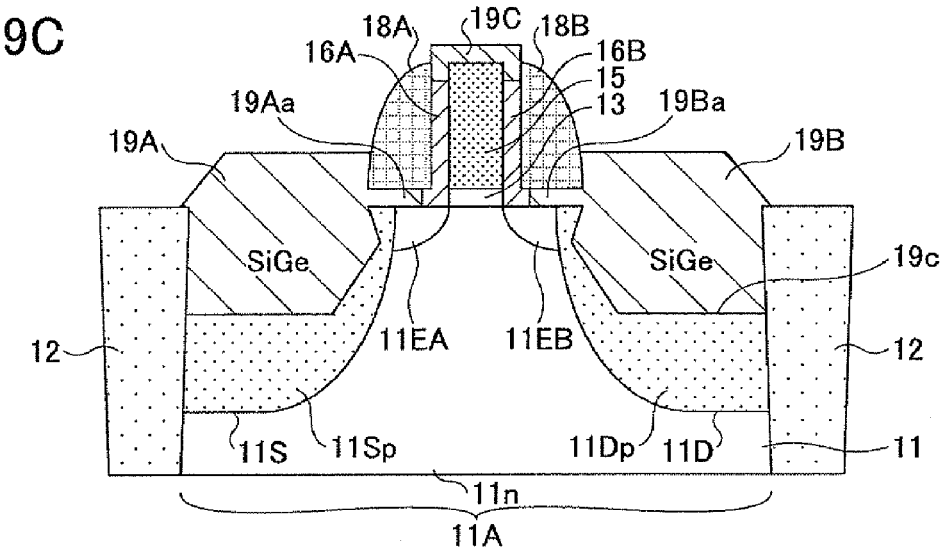

FIG. 9A through FIG. 9C are cross-sectional views illustrating portions of the semiconductor device 40 in FIG. 8 for illustrating a method of fabricating the semiconductor device 40 according to the third embodiment of the present invention.

In the step shown in FIG. 9A, processes shown in FIG. 4A through FIG. 4C in the first embodiment are performed.

In the structure fabricated so far, in the device region outside the second side wall insulating films 18A and 18B, each of the trenches 111A and 111B includes the bottom surface 19*c* and the side surface 19*b* nearly perpendicular to the bottom surface 19*c*. At this stage, the position of the intersection line between the side surface 19*b* and the bottom surface 19*c* of the trenches 111A and 111B is defined, and the position of ends 19*h* of the first side wall insulating films 16A and 16B are defined. Because these positions define starting positions of facets in two different Si (111) planes, which are formed in the next step, the side surface 19*b* and the bottom surface 19*c* are formed so that desired side surface can be formed in the next step.

It should be noted that it is not required that the side surface 19*b* be perpendicular to the bottom surface 19*c*; hence, starting positions of facets in Si (111) planes can be defined flexibly.

Further, in the step shown in FIG. 9A, the vertical side surface 19*b* is etched to form the side surface 19*d* and side surface 19*f*, which are formed from two facets. The same as the step in FIG. 7A, in this etching process, wet etching is performed using organic alkali etchants (for example, tetramethyl ammonium hydroxide, such as TMAH, choline), or ammonium hydroxide. Alternatively, the etching process is performed by a heat treatment in a hydrogen and HCl atmosphere at 800° C.

As a result, both the side surface 19*d* and the side surface 19*f* are formed from facets in the Si (111) planes, but the side surface 19*d* is formed from a facet in a Si (111) plane at an angle of 56° relative to the principal plane of the silicon substrate 11, and the side surface 19*f* is formed from a facet in a Si (111) plane at an angle of 124° relative to the principal plane of the silicon substrate 11.

Because the side surface 19*d* is formed from a facet in the Si (111) plane, once the position of the intersection line 19*e* of the bottom surface 19*c* and the vertical side surface 19*b* (refer to FIG. 4C) is defined, the side surface 19*d* can be formed as controlled. On the other hand, because the side surface 19*f* is also formed from a facet in the Si (111) plane, once the position of the ends 19*h* of the first side wall insulating films 16A and 16B are defined, the side surface 19*f* can be formed as controlled.

Therefore, because the front end 19*g* of the wedge, which is the intersection line of the side surface 19*d* and the side surface 19*f*, can be formed as controlled, it is possible to prevent the front end 19*g* of the wedge from penetrating into the inside of the n-well 11*n* from the source region 11S and the drain region 11D, and prevent the impurity profiles from be disturbed.

Next, in the step shown in FIG. 9B, portions of the first side wall insulating films 16A, 16B are removed by isotropic etching, in the same way as shown in FIG. 5B.

Next, in the step shown in FIG. 9C, the SiGe mixed crystal layers 19A and 19B are formed in the same way as shown in FIG. 5B. The SiGe mixed crystal layers 19A and 19B fill up the trenches 111A and 111B, respectively, and at the same time, nearly fill up the spaces 16A1 and 16B1 between the bottom surfaces of the second side wall insulating films 18A, 18B and the surface of the silicon substrate 11 in the same way as in the first embodiment, and grow along outer surfaces of the second side wall insulating films 18A and 18B.

Then, silicide layers 20A through 20C are formed in the same way as described above. In this way, the p-channel MOS transistor 40 in FIG. 8 is fabricated.

In the method of the present embodiment, because the trenches 111A and 111B including the bottom surface 19*c* and the vertical side surface 19*b* are formed to define starting positions of etching, and the etching is performed so that the Si (111) plane is selectively exposed, the side surfaces of the projecting wedge, which face inward, can be formed as controlled. Therefore, it is possible to prevent the short channel effect, while increasing the compressive stress; thus it is possible to increase the hole mobility in the channel region and improve the current driving capability of the p-channel MOS transistor 40.

Fourth Embodiment

Figure 10:
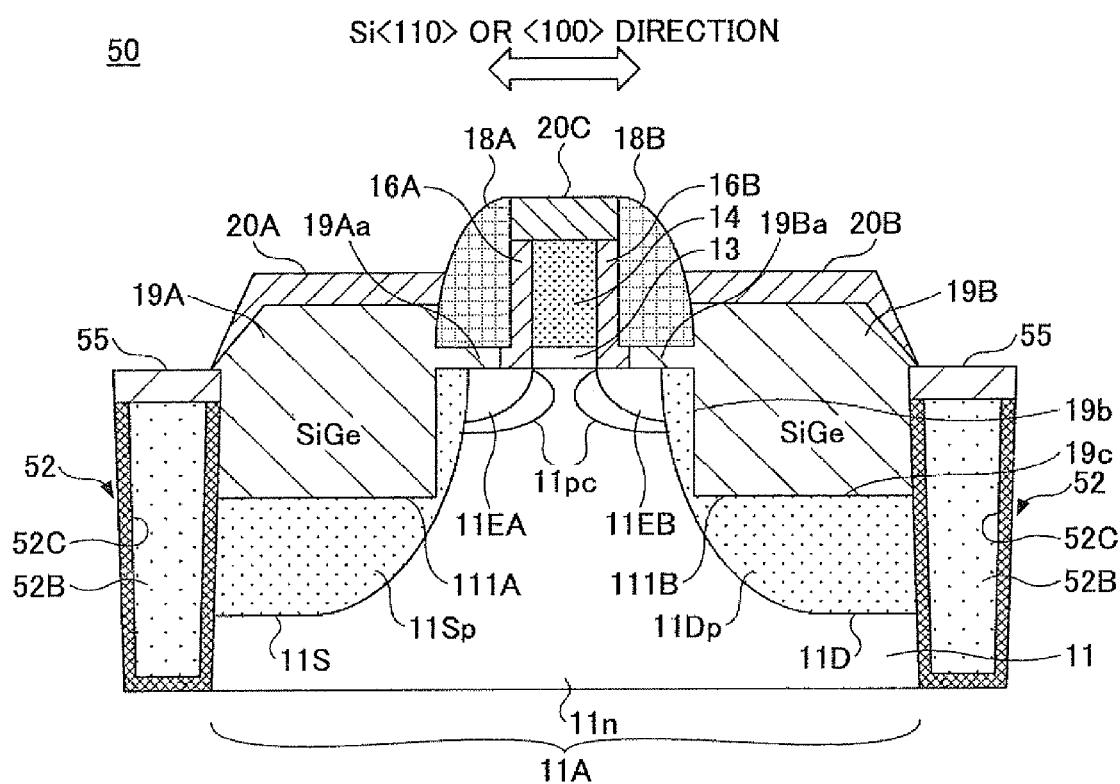
FIG. 10 is a cross-sectional view illustrating an example of a semiconductor device 50 according to a fourth embodiment of the present invention.

FIG. 10 is a cross-sectional view illustrating an example of a semiconductor device 50 according to a fourth embodiment of the present invention.

In the following descriptions, the same reference numbers are assigned to the same elements as those described in the previous embodiments, and overlapping descriptions are omitted.

The semiconductor device 50 shown in FIG. 10 is a p-channel MOS transistor. The p-channel MOS transistor 50 is basically the same as the p-channel MOS transistor 10 of the first embodiment except that the structure of an element separation region is different.

In the p-channel MOS transistor 50, an element separation region 52 includes a HF resistance film 52C formed on a surface of an element separation groove 112, a CVD oxide film 52B which covers the HF resistance film 52C and fills up the element separation groove 112, and a HF resistance film 55 which covers the CVD oxide film 52B.

The HF resistance films 52C and 55 may be SiN films, SiOCN films, or SiCN films. Especially, it is preferable to use SiOCN films or SiCN films because they are superior in HF resistance.

In the element separation region 52, because the HF resistance films 52C and 55 cover the whole CVD oxide film 52B, which is used to remove a native oxide film, subduction of the element separation region is preventable, which is caused by a HF treatment repeatedly executed to remove the native oxide film on the silicon substrate 11.

As described in methods of fabricating semiconductor devices in the previous embodiments, portions of the first side wall insulating films 16A, 16B are etched by the HF treatment, and in this process, the HF treatment may be overdone. In the present embodiment, even when the HF treatment is overdone, erosion of the element separation region 52 is preventable in the p-channel MOS transistor 50. Therefore, it is possible to prevent the silicide layer of the source or the drain from reaching the n-well 11n in the silicon substrate 11, and prevent junction leakage.

Below, a method of fabricating the semiconductor device 50 in FIG. 10 is explained with reference to FIG. 11A through FIG. 11C, FIG. 12A through FIG. 12C, and FIG. 13.

Figure 11A:
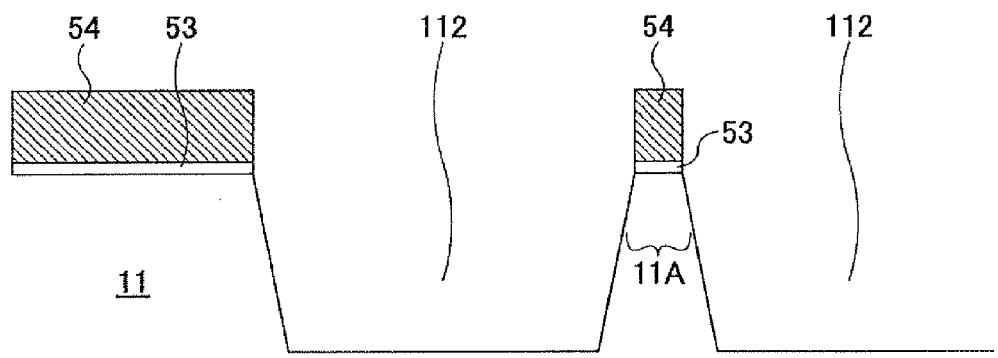
FIG. 11A through FIG. 11C are cross-sectional views illustrating portions of the semiconductor device 50 in FIG. 10 for illustrating a method of fabricating the semiconductor device 50 according to the fourth embodiment of the present invention.
Figure 11B:
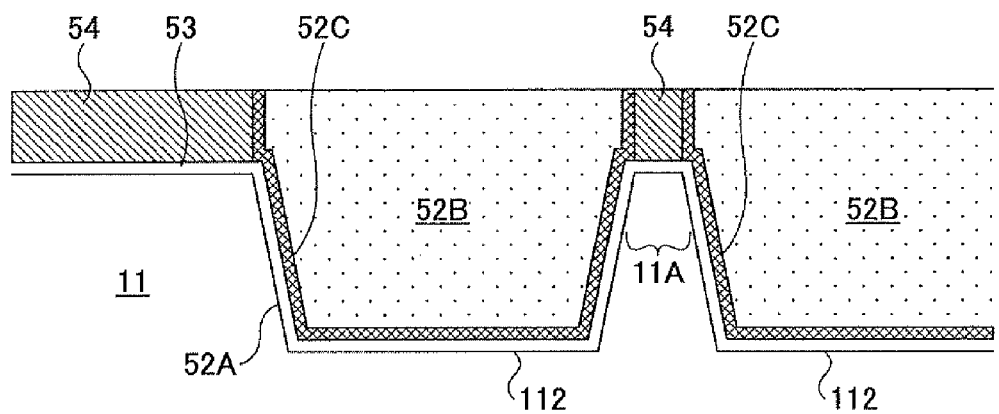
Figure 11C:
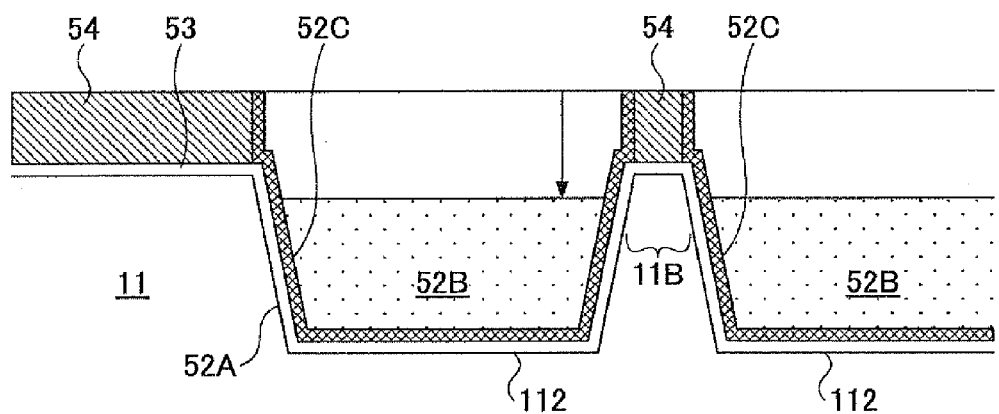

FIG. 11A through FIG. 11C are cross-sectional views illustrating portions of the semiconductor device 50 in FIG. 10 for illustrating a method of fabricating the semiconductor device 50 according to the fourth embodiment of the present invention.

Here, it is assumed that the HF resistance films 52C and 55 are SiOCN films or SiCN films.

In the step shown in FIG. 11A, on the silicon substrate 11, a sacrifice oxide film 53 is formed to a thickness of 10 nm, and then a SiN film is formed on the sacrifice oxide film 53 by thermal CVD at a substrate temperature of 775° C. to a thickness of 105 nm.

The SiN film 54 is patterned. With the obtained SiN pattern 54 as a mask, the element separation groove 112 is formed in the silicon substrate 11 to demarcate the device region 11A.

Next, in the step shown in FIG. 11B, a thermal oxide film 52A is formed on the side surface and bottom surface of the element separation groove 112 to a thickness of 3 nm.

Then, as the HF resistance film 52C, a SiOCN film or a SiCN film is formed to a thickness of 20 nm by LPCVD (Low Pressure CVD) with BTBAS (bis(tertiary-butylamino)silance)) as a stock material so as to cover the thermal oxide film 52A located on the side surface and bottom surface of the element separation groove 112.

Chemical formula of BTBAS is below.

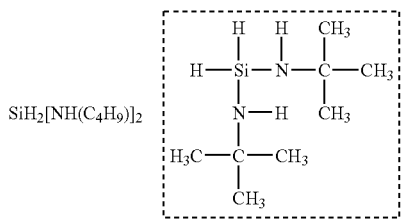

In LPCVD, reactions as expressed by the following reaction formulae take place.

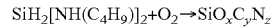

or

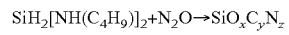

and a SiOCN film described by $SiO_xC_yN_z$ is formed. The SiOCN film obtained in this way includes C having concentration higher than dopant concentration. For example, according to analysis results of the obtained SiOCN film, it is found that ratio of Si, O, N, and C in the obtained SiOCN film is 2:2:2:1.

If ammonia is used instead of O2 or N2O in the above reactions, the following reaction takes place.

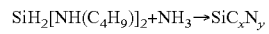

and a SiCN film described by $SiC_xN_y$ is formed.

Further, in the step shown in FIG. 11B, by high density plasma CVD, the CVD oxide film 52B is deposited on the HF resistance film 52C to fill up the element separation groove 112. Then, the CVD oxide film 52B deposited on the SiN pattern 54 is polished and removed by CMP (Chemical Mechanical Polishing); thereby, the height of the CVD oxide film 52B is the same as the height of the SiN pattern 54.

Next, in the step shown in FIG. 11C, the CVD oxide film 52B is subject to the HF treatment, that is, the CVD oxide film 52B is etched by wet etching using HF, and as a result, the CVD oxide film 52B is lowered by 80 nm to 120 nm.

Figure 12A:
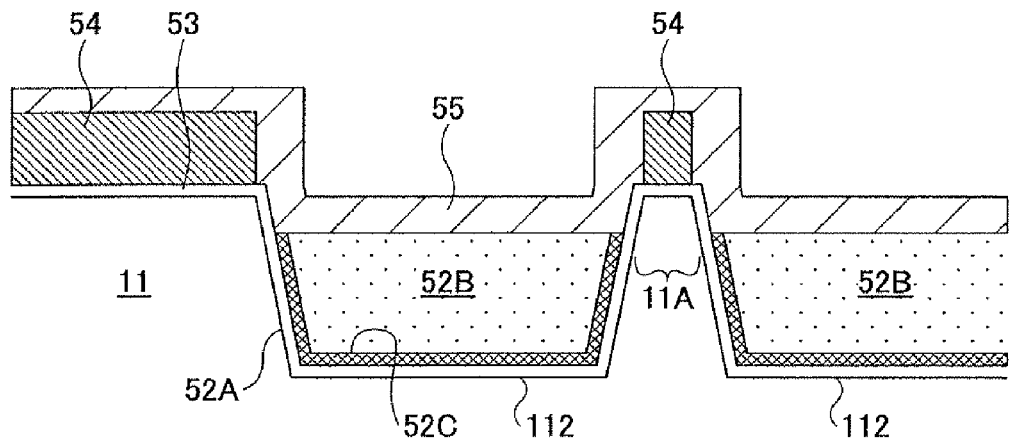
FIG. 12A through FIG. 12C are cross-sectional views illustrating portions of the semiconductor device 50 in FIG. 10 continuing from FIG. 11C for illustrating the method of fabricating the semiconductor device 50 of the present embodiment of the present invention.
Figure 12B:
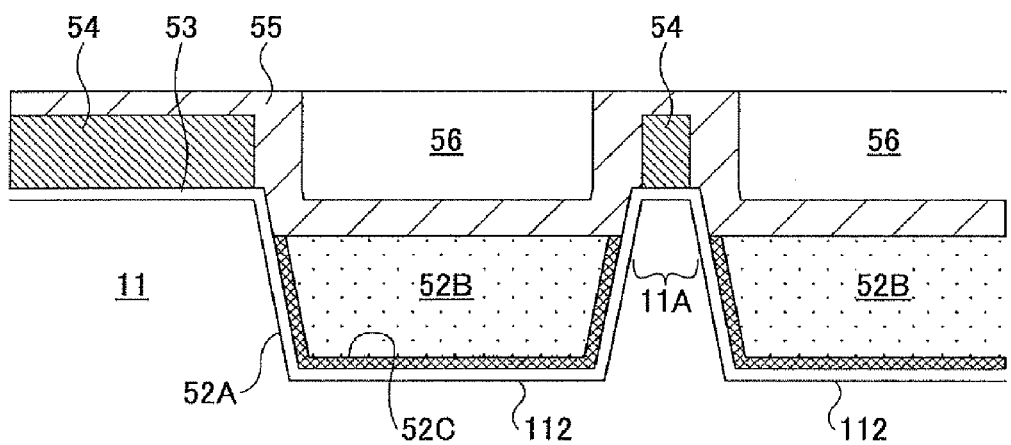
Figure 12C:
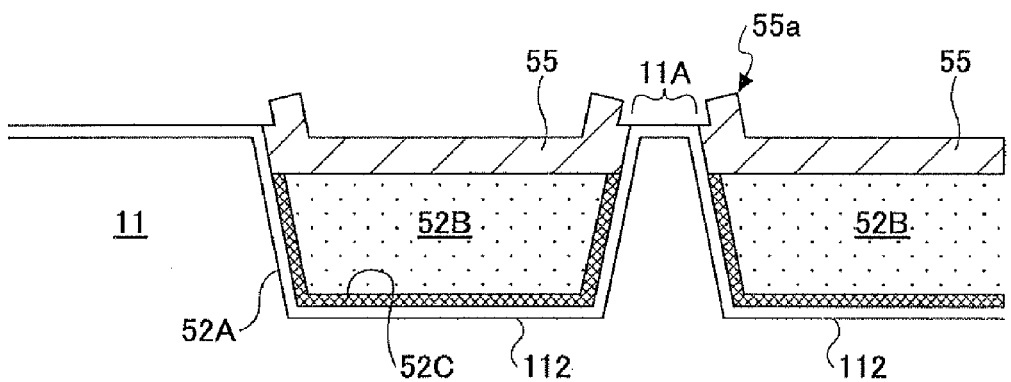

FIG. 12A through FIG. 12C are cross-sectional views illustrating portions of the semiconductor device 50 in FIG. 10 continuing from FIG. 11C for illustrating the method of fabricating the semiconductor device 50 of the present embodiment of the present invention.

Next, in the step shown in FIG. 12A, on the structure shown in FIG. 11C, as the HF resistance film 55, a SiOCN film or a SiCN film is deposited by LPCVD with BTBAS (bis(tertiary-butylamino)silance)) as stock material.

The HF resistance film 55 is deposited to a thickness so as to be at the same height as the surface of the silicon substrate 11.

Next, in the step shown in FIG. 12B, by high density plasma CVD, a silicon oxide film is deposited on the structure shown in FIG. 12A. Then, the silicon oxide film is polished and removed by CMP, and thereby, a silicon oxide film pattern 56 is formed on the HF resistance film 55 corresponding to the element separation groove 112.

Next, in the step shown in FIG. 12C,

With the silicon oxide film pattern 56 as a mask, the HF resistance film 55 and the SiN pattern 54 below the HF resistance film 55 are dissolved and removed by thermal-phosphate treatment. Then, the silicon oxide film pattern 56 is removed by wet etching using HF. Here, because the SiOCN film or the SiCN film is soluble in thermal-phosphate, and has etching speed similar to or slightly slower than that of SiN, in the thermal-phosphate treatment, even when the SiN pattern is removed, before that, the HF resistance films 52C and 55 are removed in the element separation groove 112, and thus, the CVD oxide film 52B will not be exposed at all. In addition, a portion of the HF resistance film 55 may be projected after the thermal-phosphate treatment, forming a projection 55a. In this case, the HF resistance film 55 may be flattened by CMP. In this way, the element separation region 52 is formed, in which the CVD oxide film 52B as a whole is covered by the HF resistance films 52C and 55.

Figure 13:
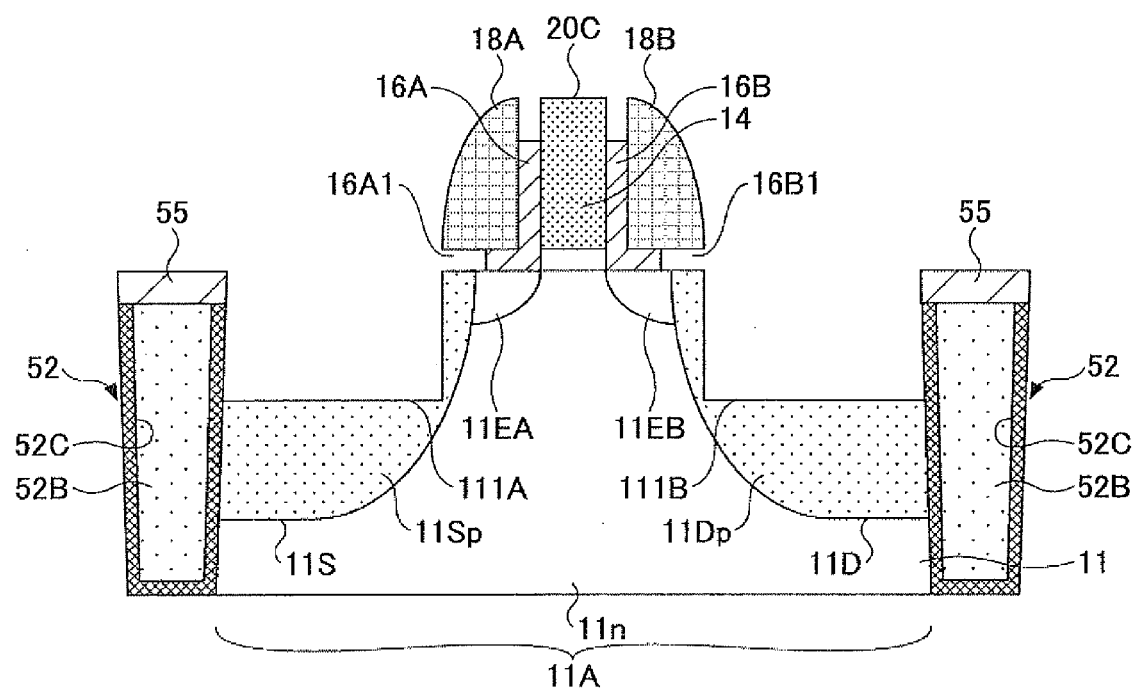
FIG. 13 is a cross-sectional view illustrating a portion of the semiconductor device 50 continuing from FIG. 12C for illustrating the method of fabricating the semiconductor device 50 of the present embodiment of the present invention.

FIG. 13 is a cross-sectional view illustrating a portion of the semiconductor device 50 continuing from FIG. 12C for illustrating the method of fabricating the semiconductor device 50 of the present embodiment of the present invention.

In the step shown in FIG. 13, in the device region 11A in FIG. 12C, processes shown in FIG. 4A through FIG. 4C, and FIG. 5A in the first embodiment are performed. That is, n-type impurities are implanted into the device region 11A (FIG. 4A); the gate insulating film 13, the gate electrode 14, the source extension region 11EA, the drain extension region 11EB, the first side walls 16A and 16B, the second side-wall insulating films 18A and 18B are formed (FIG. 4B); trenches 111A and 111B are formed in the device region 11A (FIG. 4C); and portions of the first side wall insulating films 16A, 16B, which are formed from silicon oxide films, are removed by isotropic etching, and the spaces 16A1 and 16B1 are formed by exposing the surface of the silicon substrate 11 below the bottom surface of the second side wall insulating films 18A and 18B.

After the step in FIG. 13, a silicide layer is formed as shown in FIG. 5B.

In this way, the p-channel MOS transistor 50 in FIG. 10 is fabricated.

In the method of the present embodiment, in the step shown in FIG. 13, because portions of the first side wall insulating films 16A, 16B are removed, even when the HF treatment is overdone, since the whole element separation region 52 is covered by the HF resistance films 52C and 55, dissolution by HF is preventable; therefore, erosion of the element separation region 52 is preventable, and it is possible to prevent junction leakage.

Fifth Embodiment

Figure 14:
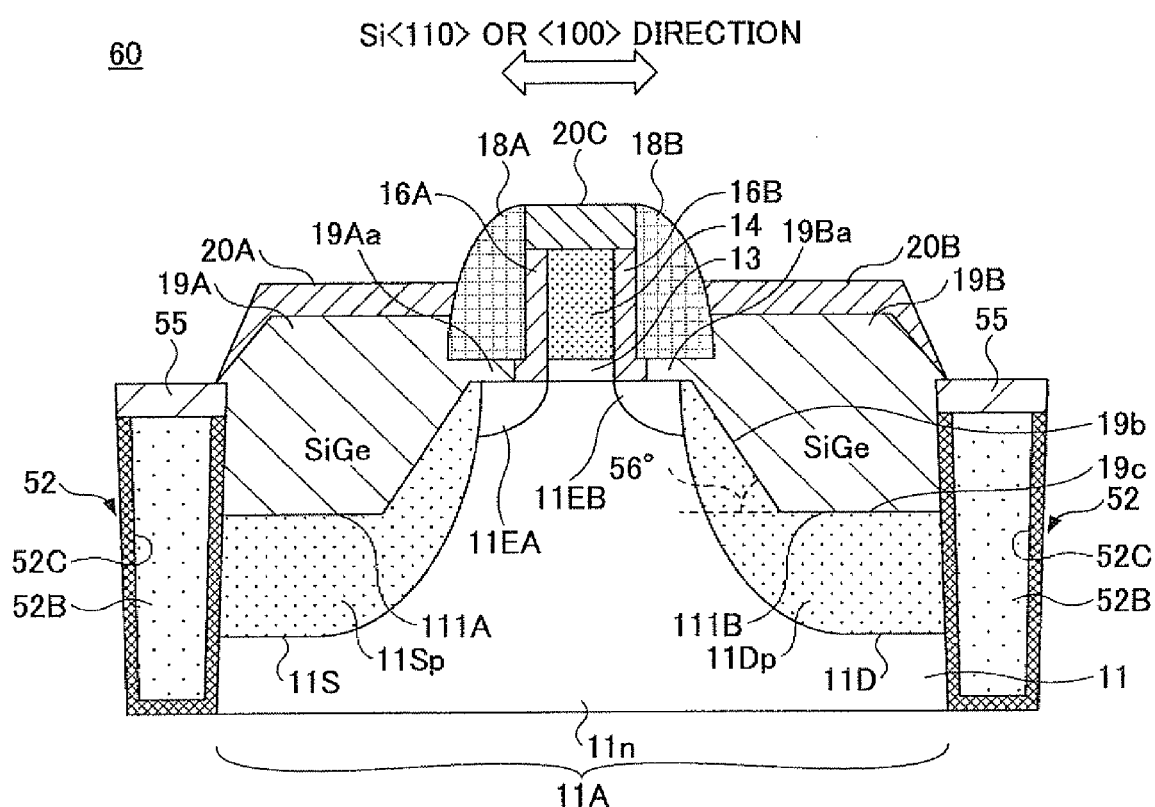
FIG. 14 is a cross-sectional view illustrating an example of a semiconductor device 60 according to a fifth embodiment of the present invention.

FIG. 14 is a cross-sectional view illustrating an example of a semiconductor device 60 according to a fifth embodiment of the present invention.

The semiconductor device 60 shown in FIG. 14, which is a p-channel MOS transistor, is basically the same as the p-channel MOS transistor 30 in FIG. 6 of the second embodiment except that the element separation region 12 is replaced by the element separation region 52 in FIG. 13. Due to this, the p-channel MOS transistor 60 has the same effects as the p-channel MOS transistor 50 in FIG. 10 of the fourth embodiment.

Sixth Embodiment

Figure 15:
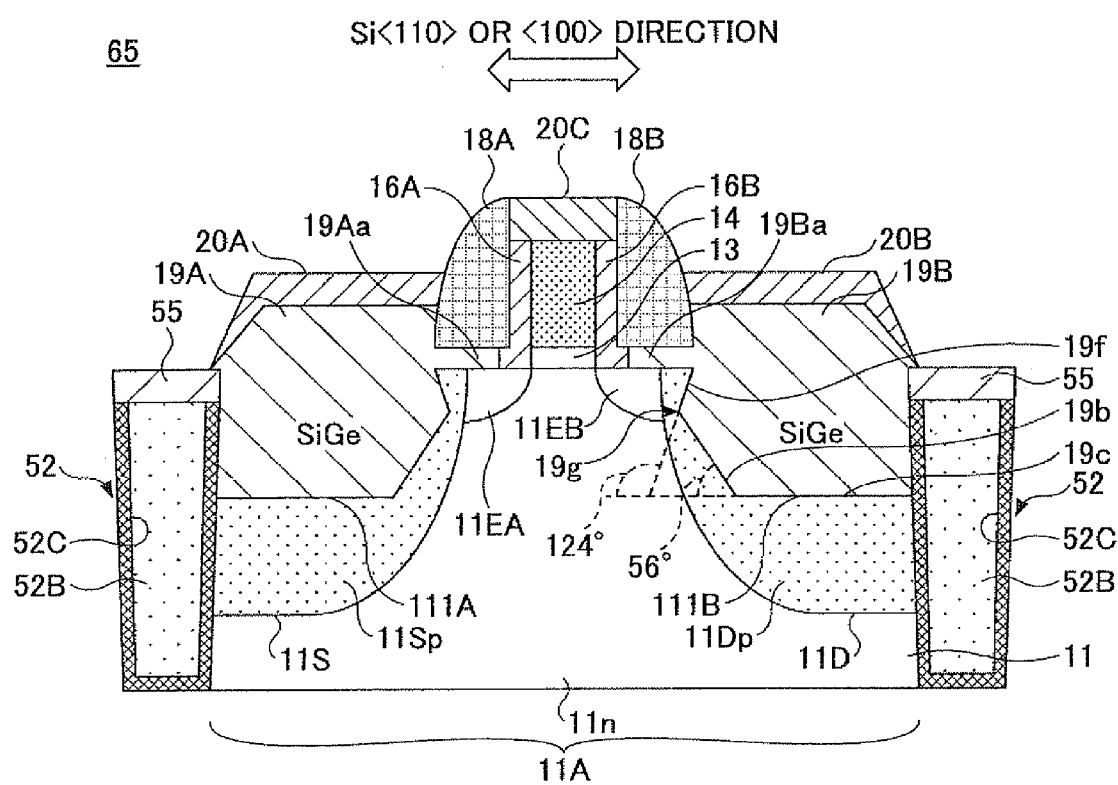
FIG. 15 is a cross-sectional view illustrating an example of a semiconductor device 65 according to a sixth embodiment of the present invention.

FIG. 15 is a cross-sectional view illustrating an example of a semiconductor device 65 according to a sixth embodiment of the present invention.

The semiconductor device 65 shown in FIG. 15, which is a p-channel MOS transistor, is basically the same as the p-channel MOS transistor 40 in FIG. 8 of the third embodiment except that the element separation region 12 is replaced by the element separation region 52 in FIG. 13. Due to this, the p-channel MOS transistor 65 has the same effects as the p-channel MOS transistor 50 in FIG. 10 of the fourth embodiment.

Seventh Embodiment

Figure 16:
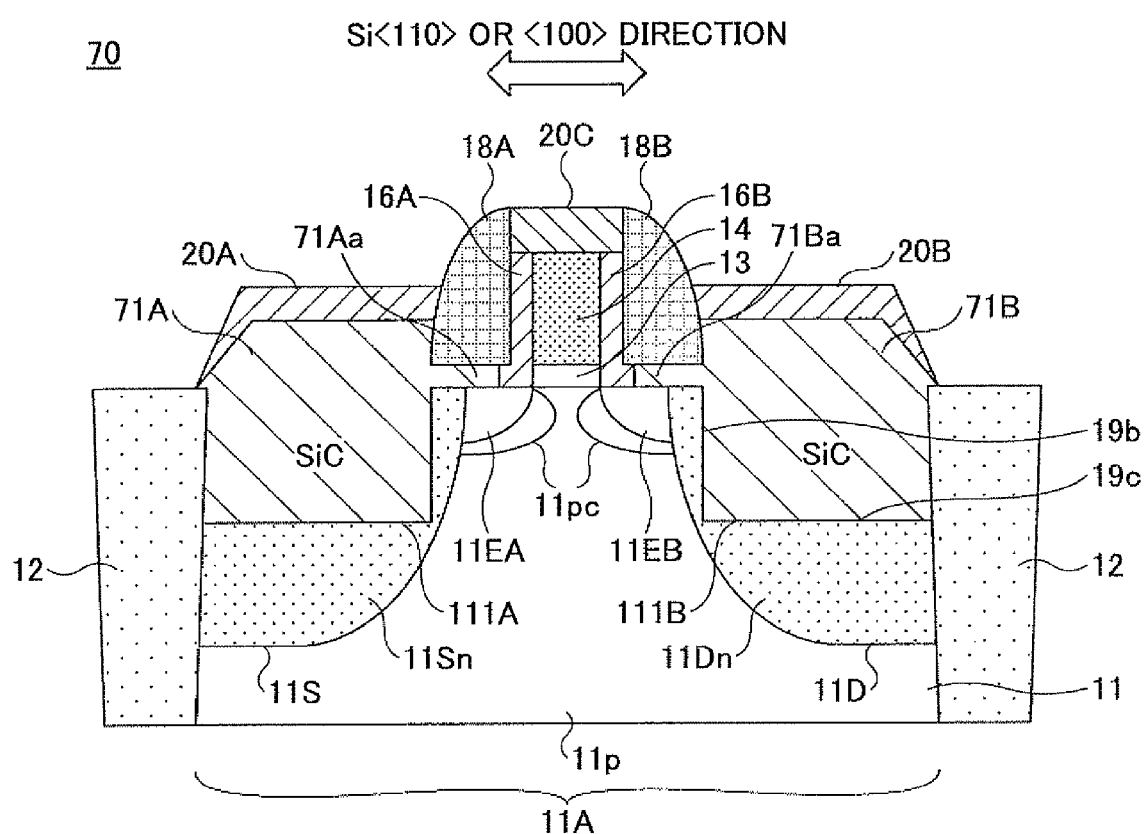
FIG. 16 is a cross-sectional view illustrating an example of a semiconductor device 70 according to a seventh embodiment of the present invention.

FIG. 16 is a cross-sectional view illustrating an example of a semiconductor device 70 according to a seventh embodiment of the present invention.

In the following descriptions, the same reference numbers are assigned to the same elements as those described in the previous embodiments, and overlapping descriptions are omitted.

The semiconductor device 70 shown in FIG. 16 is an n-channel MOS transistor. In the n-channel MOS transistor 70, instead of the SiGe mixed crystal layers 19A and 19B in the p-channel MOS transistor 30 in FIG. 3 of the second embodiment, SiC mixed crystal layers 71A and 71B are adopted to induce a stretching stress in the channel region.

In addition, impurities introduced into the n-channel MOS transistor 70 have opposite conductivity to the impurities introduced into the p-channel MOS transistor 30 in FIG. 3, that is, the SiC mixed crystal layers 71A and 71B include n-type impurities. In addition, in the n-channel MOS transistor 70, p-type impurities are implanted into the device region 11A, the pocket implantation regions 11$pc$, and a Si well region, and n-type impurities are implanted into the source extension region 11EA and the drain extension region 11EB, the source region 11Sn and the drain region 11Dn. Except for the above points, the n-channel MOS transistor 70 is basically the same as the p-channel MOS transistor 30 in FIG. 3 of the second embodiment.

In the silicon substrate 11, trenches 111A and 111B are formed outside the second side-wall insulating films 18A and 18B, respectively. SiC mixed crystal layers 71A and 71B including n-type impurities are grown epitaxially in the trenches 111A and 111B to fill up the trenches 111A and 111B, respectively. The SiC mixed crystal layers 71A and 71B epitaxially grown on the silicon substrate 11 have lattice constants less than the silicon substrate 11, as described above with reference to FIG. 1, stress opposite to the arrows "a", "b", "c", "d" are generated. As a result, a uniaxial stretching stress is applied on the channel region just below the gate electrode 14 in the silicon substrate 11. Due to the stretching stress, electron mobility is increased in the channel region, and the current driving capability of the n-channel MOS transistor 70 is improved.

The same as the SiGe mixed crystal layers 19A and 19B in FIG. 3, the SiC mixed crystal layers 71A and 71B have extended portions 71Aa, 71Ba, which are formed on the respective sides of the first side wall insulating films 16A and 16B below the bottom surface of the second side wall insulating films 18A, 18B and covering the surface of the silicon substrate 11. The extended portions 71Aa and 71Ba are in contact with the source extension region 11EA and the drain extension region 11EB, respectively. As described below, since the SiC mixed crystal layers 71A and 71B are low resistance CVD films including n-type impurities of high activity, due to the extended portions 71Aa and 71Ba, stray resistance can be greatly reduced. As a result, the short channel effect does not occur, and the current driving capability of the n-channel MOS transistor 70 is improved.

In addition, it is expected that the extended portions 71Aa and 71Ba induce a compressive stress in the gate length direction in the silicon substrate 11 just below the extended portions 71Aa and 71Ba. In this case, because the side surfaces 19$b$ are fixed by the SiC mixed crystal layers 71A and 71B, it is believed that the extended portions 71Aa and 71Ba of the SiC mixed crystal layers 71A and 71B induce compressive deformation in the source extension region 11EA and the drain extension region 11EB, and the compressive deformation generates opposite stretching stress in the silicon crystal in the channel region. As a result, in the n-channel MOS transistor 70 shown in FIG. 16, because of the extended portions 71Aa and 71Ba, which are in contact with the source extension region 11EA and the drain extension region 11EB, it is possible to further increases the electron mobility.

Because of the good crystal property of the SiC mixed crystal layers 71A and 71B, it is preferable that atom concentration of C be 0.1 atom % to 2.0 atom % in the SiC mixed crystal layers 71A and 71B. For example, the n-type impurities in the SiC mixed crystal layers 71A and 71B are P (phosphorus) or As (Arsenic), and the concentration of the n-type impurities is from $1 \times 10^{19}$ cm$^{-3}$ to $1 \times 10^{20}$ cm$^{-3}$.

For example, the SiC mixed crystal layers 71A and 71B can be formed by using a low pressure CVD device. The method is described below.

The processes shown in FIG. 4A through FIG. 4C, and FIG. 5A in the first embodiment are performed. The substrate with trenches 111A and 111B formed thereon is introduced into the low pressure CVD device, which is filled with hydrogen gas, nitrogen gas, argon gas, helium gas, or other inactive gases, and is maintained at a pressure from 5 to 1330 Pa.

Then, after the temperature is increased to 400 to 550° C. in a hydrogen atmosphere, the pressure is maintained in a range from 5 to 1330 Pa for 5 minutes, to execute baking of the substrate in the hydrogen atmosphere.

Then, at a substrate temperature of 400 to 550° C., and with partial pressures of hydrogen gas, nitrogen gas, argon gas, helium gas, or other inactive gases being in a range from 5 to 1330 Pa, the following gases are supplied in a period from 1 to 40 minutes, that is, a silane (SiH$_4$) gas (as a gas-phase material of silicon) with the partial pressure in a range from 1 to 10 Pa, a monomethylsilane (SiH$_3$CH$_3$) gas (as a gas-phase material of C) with the partial pressure in a range from 0.01 to 1 Pa, a phosphine (PH$_3$) gas (as a dopant gas) with the partial pressure in a range from $1 \times 10^{-5}$ to $1 \times 10^{-2}$ Pa, and a HCl (hydrogen chloride) gas (as a precursor which enhances selectivity) with the partial pressure in a range from 1 to 10 Pa.

Consequently, the n-type SiC mixed crystal layers 71A and 71B are epitaxially grown in the trenches 111A and 111B. Due to this, the SiC mixed crystal layers 71A and 71B also grow in the spaces below the bottom surfaces of the second side wall insulating films 18A, 18B, and forming the extended portions 71Aa, 71Ba of the SiC mixed crystal layers 71A and 71B. Further, the SiC mixed crystal layers 71A and 71B grow upward while being in close contact with the side surfaces of the second side-wall insulating films 18A, 18B.

In the n-channel MOS transistor 70 of the present embodiment, shapes of the side surfaces of the trenches 111A and 111B in the silicon substrate 11, which trenches are filled with the SiC mixed crystal layers 71A and 71B, are the same as those in the p-channel MOS transistors described above.

Eighth Embodiment

Figure 17:
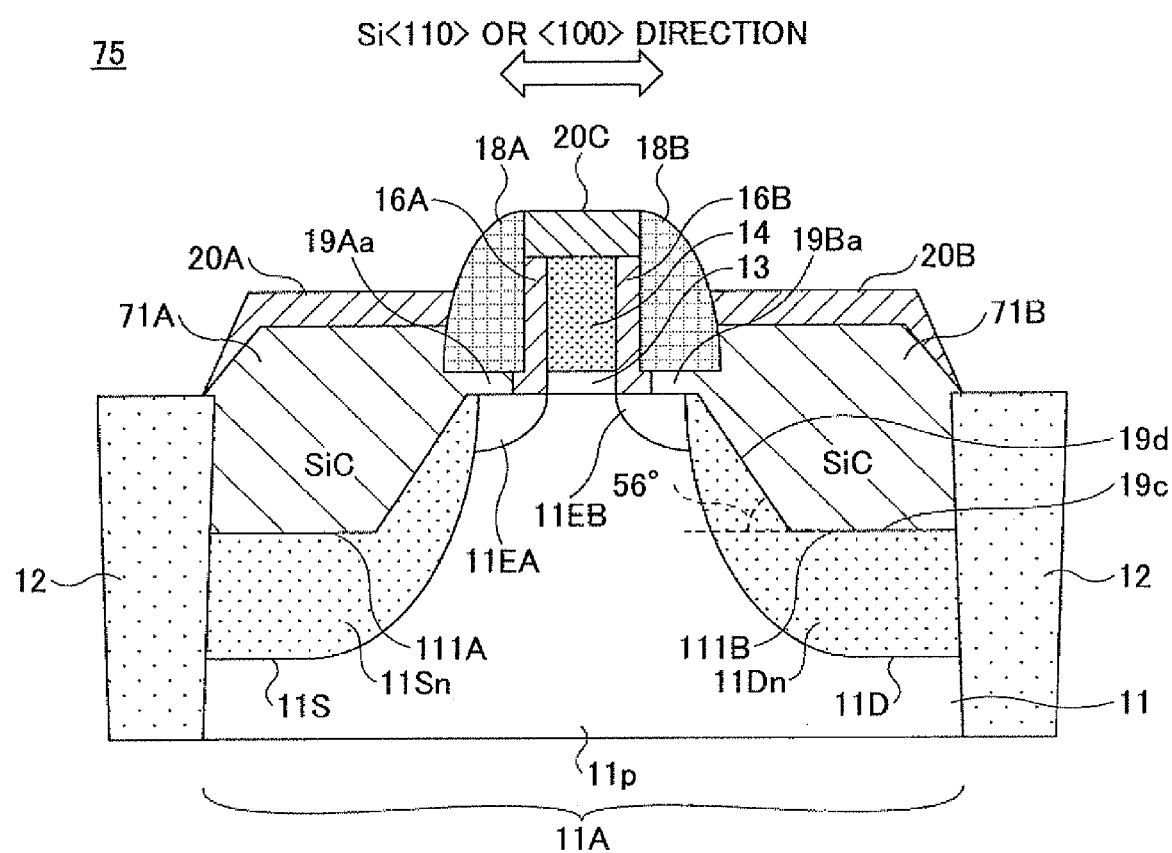
FIG. 17 is a cross-sectional view illustrating an example of a semiconductor device according to an eighth embodiment of the present invention.

FIG. 17 is a cross-sectional view illustrating an example of a semiconductor device according to an eighth embodiment of the present invention.

In the present embodiment, the same reference numbers are assigned to the same elements as those described in the previous embodiments, and overlapping descriptions are omitted.

The semiconductor device 75 shown in FIG. 17 is an n-channel MOS transistor. In the n-channel MOS transistor 75, side surfaces 19d of the SiC mixed crystal layers 71A and 71B are the same as those in FIG. 6 in the second embodiment.

In the n-channel MOS transistor 75, except that the stress is opposite to the stress in the second embodiment, the same effects can be obtained and this further improves the current driving capability of the n-channel MOS transistor 75.

Ninth Embodiment

Figure 18:
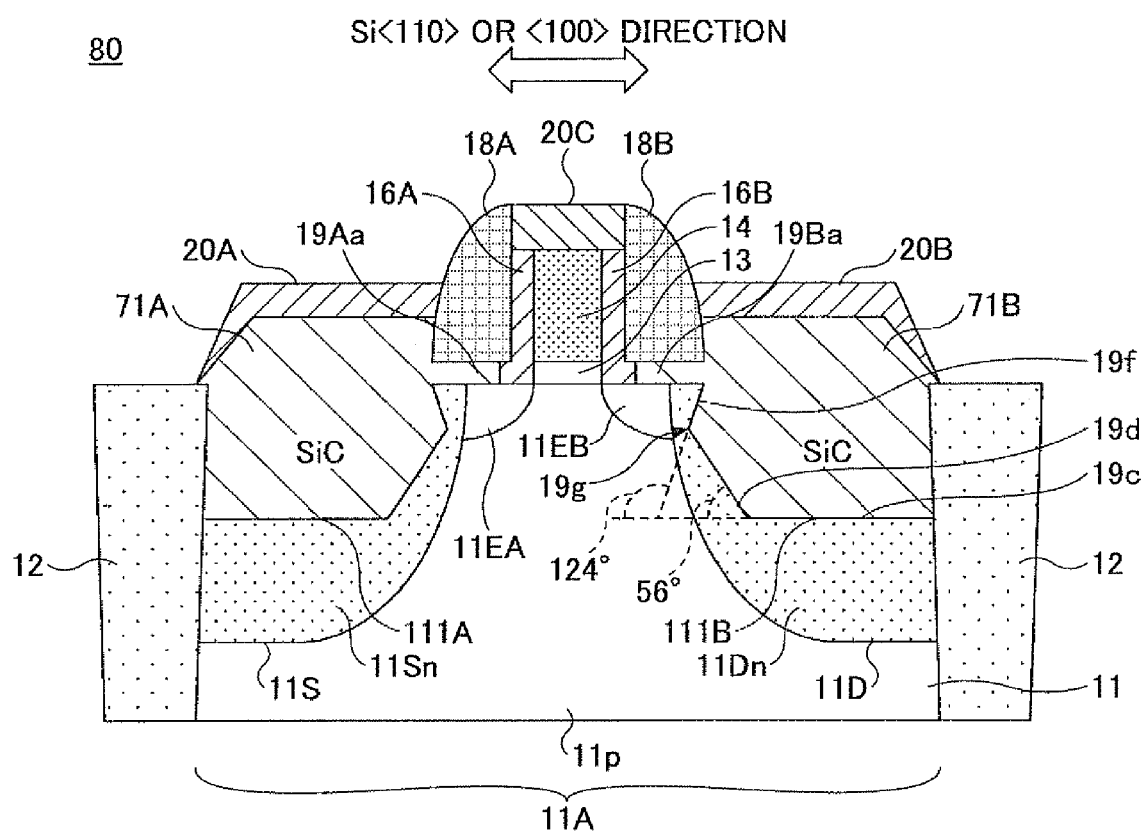
FIG. 18 is a cross-sectional view illustrating an example of a semiconductor device according to a ninth embodiment of the present invention.

FIG. 18 is a cross-sectional view illustrating an example of a semiconductor device according to a ninth embodiment of the present invention.

In the present embodiment, the same reference numbers are assigned to the same elements as those described in the previous embodiments, and overlapping descriptions are omitted.

The semiconductor device 80 shown in FIG. 18 is an n-channel MOS transistor. In the n-channel MOS transistor 80, side surfaces 19d, 19f of the SiC mixed crystal layers 71A and 71B are the same as those in FIG. 8 in the third embodiment.

In the n-channel MOS transistor 80, except that the stress is opposite to the stress in the third embodiment, the same effects can be obtained and this further improves the current driving capability of the n-channel MOS transistor 80.

10th Embodiment

Figure 19:
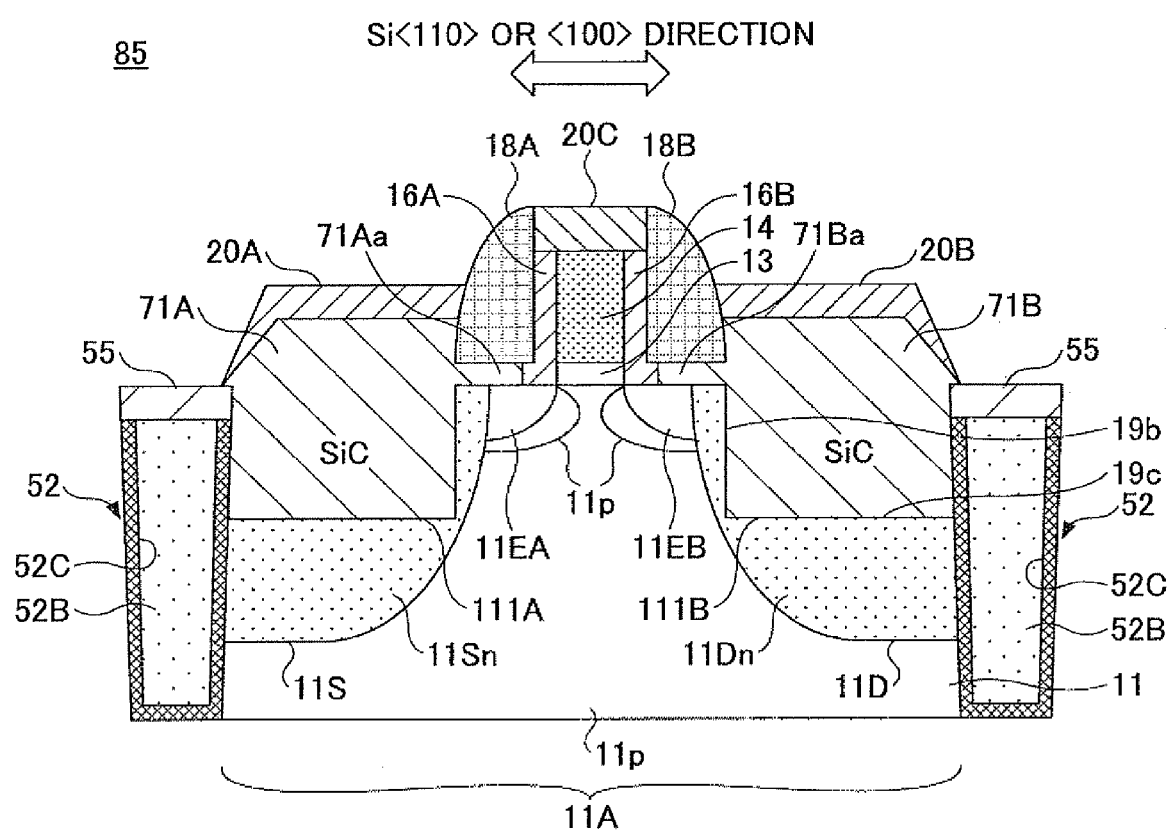
FIG. 19 is a cross-sectional view illustrating an example of a semiconductor device according to a 10th embodiment of the present invention.

FIG. 19 is a cross-sectional view illustrating an example of a semiconductor device according to a 10th embodiment of the present invention.

In the present embodiment, the same reference numbers are assigned to the same elements as those described in the previous embodiments, and overlapping descriptions are omitted.

The semiconductor device 85 shown in FIG. 19 is an n-channel MOS transistor, which is obtained by incorporating the element separation region 52 shown in FIG. 10 in the n-channel MOS transistor of the seventh embodiment.

In the element separation region 52 of the n-channel MOS transistor 85, because the HF resistance films 52C and 55 covers the whole CVD oxide film 52B, which is used to remove a native oxide film, erosion of the element separation region 52 is preventable, which is caused by a HF treatment executed for removing portions of the first side wall insulating films 16A, 16B or for removing the native oxide film on the silicon substrate 11. As a result, it is possible to prevent the silicide layer of the source or the drain from reaching the n-well 11n in the silicon substrate 11, and prevent junction leakage.

11th Embodiment

Figure 20:
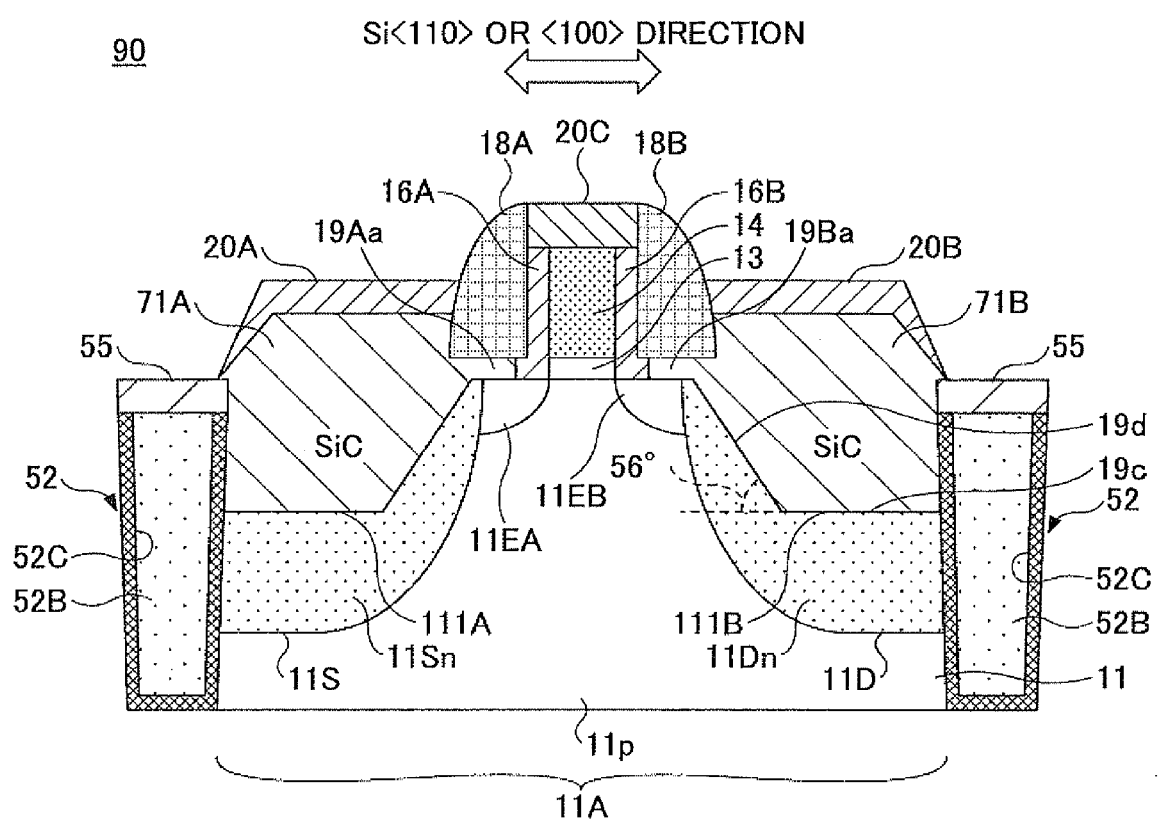
FIG. 20 is a cross-sectional view illustrating an example of a semiconductor device according to an 11th embodiment of the present invention.

FIG. 20 is a cross-sectional view illustrating an example of a semiconductor device according to an 11th embodiment of the present invention.

In the present embodiment, the same reference numbers are assigned to the same elements as those described in the previous embodiments, and overlapping descriptions are omitted.

The semiconductor device 90 shown in FIG. 20 is an n-channel MOS transistor, which is obtained by incorporating the element separation region 52 shown in FIG. 10 into the n-channel MOS transistor of the eighth embodiment.

The n-channel MOS transistor 90 has the same effects as the n-channel MOS transistor 85.

12th Embodiment

Figure 21:
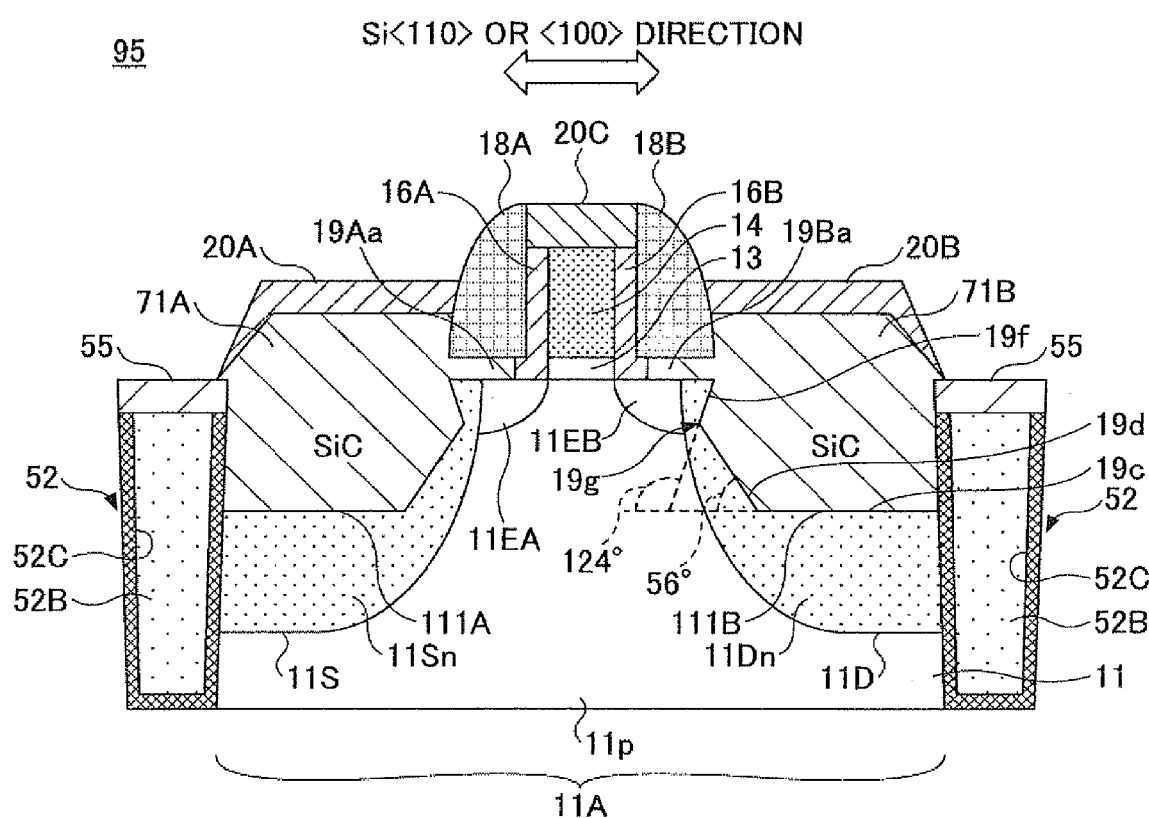
FIG. 21 is a cross-sectional view illustrating an example of a semiconductor device according to a 12th embodiment of the present invention.

FIG. 21 is a cross-sectional view illustrating an example of a semiconductor device according to a 12th embodiment of the present invention.

The semiconductor device 95 shown in FIG. 21 is an n-channel MOS transistor, which is obtained by incorporating the element separation region 52 shown in FIG. 10 into the n-channel MOS transistor of the ninth embodiment.

The n-channel MOS transistor 95 has the same effects as the n-channel MOS transistors 85 and 90.

13th Embodiment

Figure 22:
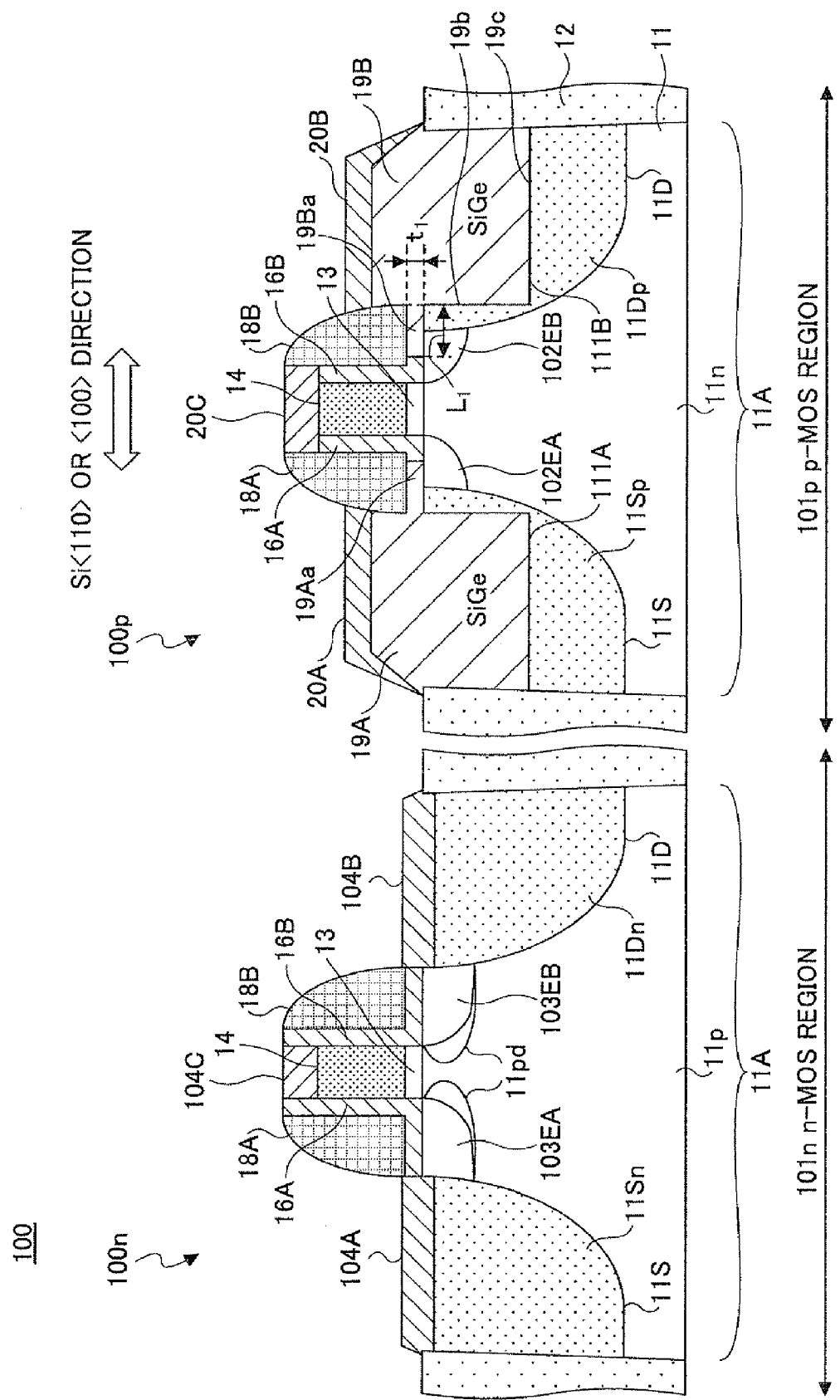
FIG. 22 is a cross-sectional view illustrating an example of a semiconductor device according to a 13th embodiment of the present invention.

FIG. 22 is a cross-sectional view illustrating an example of a semiconductor device according to a 13th embodiment of the present invention.

In the following descriptions, the same reference numbers are assigned to the same elements as those described in the previous embodiments, and overlapping descriptions are omitted.

The semiconductor device shown in FIG. 22 is a CMOS (Complementary MOS) transistor. It should be noted that the semiconductor device of the present embodiment may also be implemented as a p-channel MOS transistor constituting the CMOS transistor in FIG. 22.

In FIG. 22, the semiconductor device 100 includes a p-channel MOS transistor 100p and an re-channel MOS transistor 100n. The p-channel MOS transistor 100p is basically the same as the p-channel MOS transistor 10 of the first embodiment except that a source extension region 102EA, the drain extension region 102EB, and pocket implanted regions of the p-channel MOS transistor 100p are different from those in the first embodiment.

The n-channel MOS transistor 100n is formed in a device region 11A of an n-MOs region 101n, which is demarcated by an element separation region 12, in a single crystal silicon substrate 11 having a (100) crystal plane as a principal plane. In the single crystal silicon substrate 11, a p-type Si well 11p is formed corresponding to the device region 11A.

On the silicon substrate 11 including the device region 11A, a gate insulating film 13 is formed corresponding to a channel region in the silicon substrate 11. On the gate insulating film 13, a gate electrode 14 is formed from a polysilicon film implanted with n-type impurities such as As.

On side-walls of the laminated structure of the gate insulating film 13 and the gate electrode 14, first side wall insulating films 16A and 16B are formed. In addition, the first side wall insulating films 16A and 16B cover portions of the silicon substrate besides the gate insulating film 13, and cover the side-walls of the laminated structure of the gate insulating film 13 and the gate electrode 14. Second side-wall insulating films 18A and 18B are formed on side surfaces of the first side walls 16A and 16B.

In the n-channel MOS transistor 100n, p-type pocket implanted regions 11pd are formed in the device region 11A on two sides of the gate electrode 14 in the silicon substrate 11. For example, the p-type pocket implanted regions 11pd are formed by implanting B or other p-type impurities obliquely. Further, an n-type source extension region 103EA and an n-type drain extension region 103EB are formed to partially overlap the p-type pocket implanted regions 11pd. The n-type source extension region 103EA and the n-type drain extension region 103EB are in contact with n-type diffusion regions 11Sn and 11Dp, respectively, which form a source region 11S and a drain region 11D of the n-channel MOS transistor 100n, respectively.

In the p-channel MOS transistor 100p, the source extension region 102EA and the drain extension region 102EB are formed by implanting boron (B) or other p-type impurities the same as the p-type impurity implanted in the extended portions 19Aa, 19Ba of the SiGe mixed crystal layers 19A and 19B. The p-type impurities in the source extension region 102EA and the drain extension region 102EB are diffused to the silicon substrate 11 by means of solid phase diffusion.

In the p-channel MOS transistor 100p, n-type pocket implanted regions are not formed below the gate electrode 14 on the inner side of the source extension region 102EA and the drain extension region 102EB. The reasons are described below.

The source extension region 102EA and the drain extension region 102EB are formed by diffusing p-type impurities the same as those in the extended portions 19Aa, 19Ba of the SiGe mixed crystal layers 19A and 19B to the silicon substrate 11 by means of solid phase diffusion. For this reason, the impurity concentration profile from the surface of the silicon substrate 11 along the depth direction of the silicon substrate 11 is a maximum at the surface of the silicon substrate 11, and decreases along the depth direction of the silicon substrate 11.

On the other hand, when implanting the impurities by ion-implantation, the channeling effect occurs, and a region having a high impurity concentration, where the impurity concentration is higher than that of the surrounding region, is formed at a position deeper than the desired position. This region is referred to as "channeling high impurity concentration region"). Due to this, in order to prevent the short-channel effect, it is necessary to form n-type pocket implanted regions on the inner side of the source extension region 102EA and the drain extension region 102EB at a position deeper than the source extension region 102EA and the drain extension region 102EB.

However, in the p-channel MOS transistor 100p of the present embodiment, since the source extension region 102EA and the drain extension region 102EB are formed by means of solid phase diffusion, the above-mentioned channeling high impurity concentration region is not formed, it is possible to omit the n-type pocket implanted regions.

It is not required that the n-type pocket implanted regions be omitted, that is, the n-type pocket implanted regions can still be formed, but the impurity concentration thereof may be lower than usual impurity concentration.

Here, the channeling effect is a phenomenon in which impurity atoms implanted by ion-implantation do not repeatedly collide with silicon atoms, and penetrate through the silicon crystal lattice, thus forming a region having a high impurity concentration at a position deeper than the desired position.

It should be noted that when the n-type pocket implanted regions are not formed in the p-channel MOS transistor 100p, the n-type impurity concentration in the depth direction from the bottom of the source extension region 102EA and the drain extension region 102EB equal to the impurity concentration in the n-well.

In addition, in the p-channel MOS transistor 100p, it is preferable that volumes of the extended portions 19Aa, 19Ba be sufficiently large, because large volumes of the extended portions 19Aa, 19Ba can increase the stress applied on the channel region, and thus further improves the carrier mobility. For example, it is preferable that the distance L1 from the outer side ends of the second side-wall insulating films 18A and 18B to the ends of the extended portions 19Aa, 19Ba on the side of the gate electrode 14 be sufficiently long. When the distance L1 is sufficiently long, the parasitic resistance of the channel region decreases, and it is anticipated that this further improves mobility of the p-type carriers in the channel region. However, it is certain the distance L1 should be not so long such that the ends of the extended portions 19Aa, 19Ba on the side of the gate electrode 14 do not touch the side wall of the gate insulating film 13.

In addition, it is preferable that thickness t1 of the extended portions 19Aa, 19Ba be in a range from 5 nm to 20 nm, because the extended portions 19Aa, 19Ba of such a thickness reduce the parasitic resistance of the channel region, and improve mobility of the p-type carriers.

It should be noted the above-described thickness range of the extended portions 19Aa, 19Ba is also applicable to the first embodiment through the 12th embodiment.

In the p-channel MOS transistor 100p of the present embodiment, p-type impurities the same as those in the extended portions 19Aa, 19Ba of the SiGe mixed crystal layers 19A and 19B diffuse to the silicon substrate 11 by means of solid phase diffusion. Due to the solid phase diffusion, the channeling effect does not occur, and thus, the n-type pocket implanted regions can be omitted, or the impurity concentration of the n-type pocket implanted regions can be lowered. As a result, it is possible to improve mobility of the p-type carriers in the channel region.

Below, a method of fabricating the semiconductor device 100 in FIG. 22 is explained with reference to FIG. 23A through FIG. 23G.

FIG. 23A through FIG. 23G are cross-sectional views illustrating portions of the semiconductor device 100 in FIG. 22 for illustrating a method of fabricating the semiconductor device 100 according to the present embodiment of the present invention.

Similar to FIG. 22, FIG. 23A through FIG. 23G are cross-sectional views along the gate length direction of the p-channel MOS transistor 100p and the n-channel MOS transistor 100n of the semiconductor device 100.

Figure 23A:
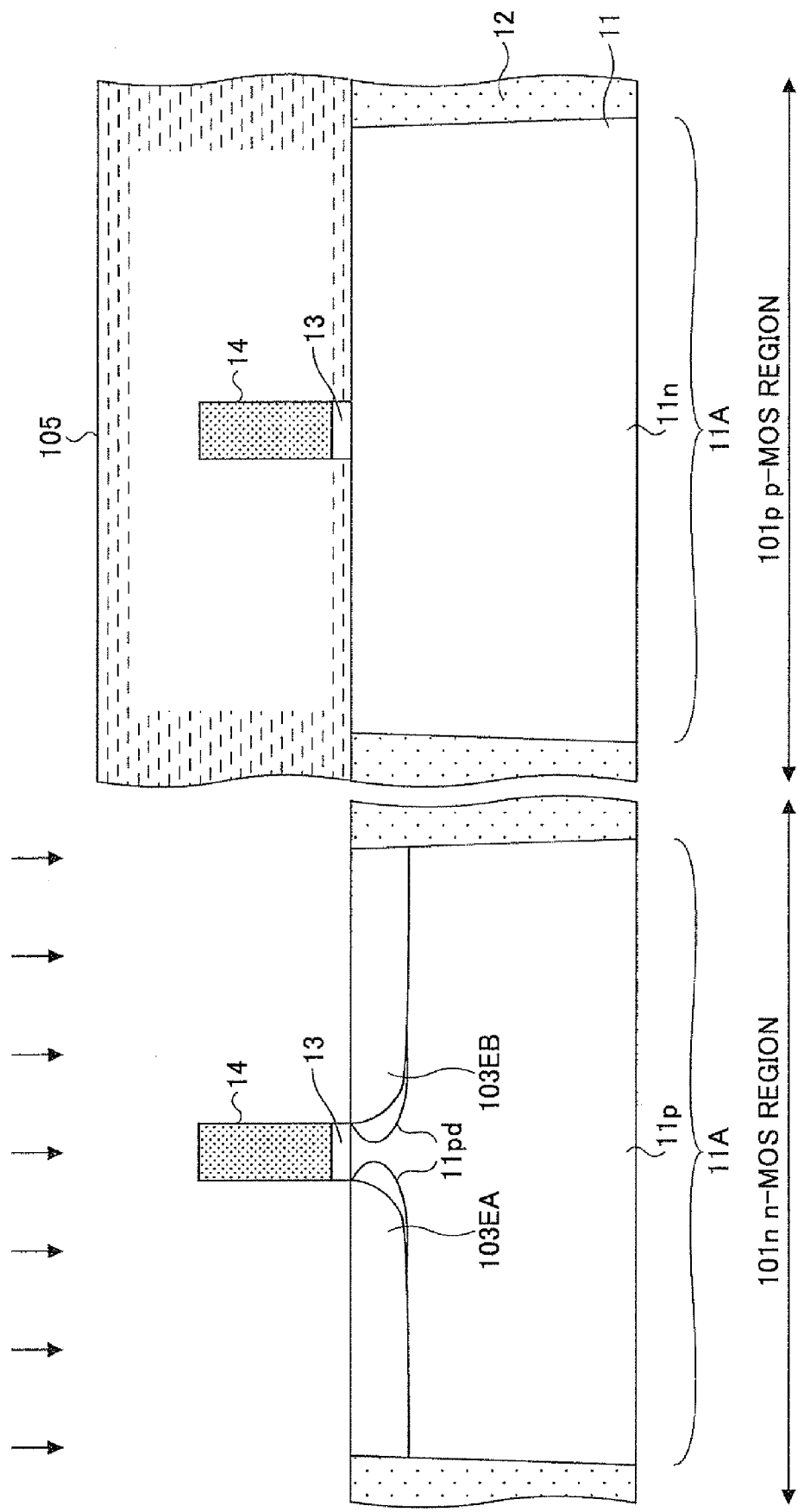

In the step shown in FIG. 23A, on the p-type silicon substrate 11, the device region 11A is demarcated by the STI-type element separation region 12, and n-type impurities are implanted into the device region 11A of the p-MOS region 101p, thereby, the n-type Si well 11n is formed corresponding to the device region 11A. Similarly, p-type impurities are implanted into the device region 11A of the n-MOS region 101n, thereby, the p-type Si well 11p is formed corresponding to the device region 11A.

Next, still in the step shown in FIG. 23A, on the silicon substrate 11, corresponding to the device regions 11A of both the p-MOS region 101p and the n-MOS region 101n, the gate insulating films 13 and the gate electrodes 14 are formed respectively by patterning a SiON film and a poly-silicon film, which are uniformly formed on the silicon substrate 11.

Next, still in the step shown in FIG. 23A, the p-MOS region 101p is covered with a resist film 105, and the n-MOS region 101n is covered with the gate electrode 14 as a mask, B or other p-type impurities are implanted obliquely, thereby, forming the p-type pocket implantation regions 11pd.

In addition, with the device regions 11A of the n-MOS region 101n being covered by using the gate electrode 14 as a mask, P, As or other n-type impurities are implanted, thereby, forming the n-type source extension region 103EA and the n-type drain extension region 103EB.

Next, in the step shown in FIG. 23B, the resist film 105 is removed, and a first insulating film 16a is formed on the gate electrode 14, and then a second insulating film 18a is formed thereon.

Then, the second insulating film 18a is etched back to remove portions of the second insulating film 18a except for the portions on the two sides of the gate electrode 14 to form the second side wall insulating films 18A and 18B.

Next, the first insulating film 16a is etched with the second side wall insulating films 18A and 18B as masks to expose the surfaces of the silicon substrate 11 and the gate electrode 14 to form the first side wall insulating films 16A, 16B.

The first side wall insulating films 16A, 16B are formed from insulating materials, which have etching selectivity, different from the second side wall insulating films 18A and 18B, respectively. For example, the first side wall insulating films 16A, 16B are formed from silicon oxide films, and the second side wall insulating films 18A and 18B are formed from silicon nitride films. It is preferable that thickness of the first side wall insulating films 16A, 16B on the surface of the silicon substrate be in a range from 5 nm to 20 nm, because in the subsequent steps of forming the p-MOS region 101p, portions of the first side wall insulating films 16A, 16B are to be removed to form spaces, and then the SiGe mixed crystal layers fill up the spaces. If the thickness of the first side wall insulating films 16A, 16B is less than 5 nm, when forming the spaces, it is difficult for etchants like a water solution of HF or HF vapor to enter into the spaces, and this may make it difficult to form the spaces. On the other hand, if the thickness of the first side wall insulating films 16A, 16B is greater than 20 nm, the second side wall insulating films 18A, 18B is apt to be too thin, and when forming the extended portions 19Aa and 19Ba, the second side wall insulating films 18A, 18B is liable to lifted off.

Next, in the step shown in FIG. 23C, with the n-MOS region 101n being covered by a resist film 106, B or other p-type impurities are implanted into the p-MOS region 101p, thereby, forming the p-type impurity regions 11Sp and 11Dp outside the second side-wall insulating films 18A and 18B in the device region 11A in the silicon substrate 11. In order that the p-type impurity regions 11Sp and 11Dp are formed on the inner side of the outer ends of the second side-wall insulating films 18A and 18B, the p-type impurities may be implanted obliquely into the silicon substrate 11 by ion-implantation.

Figure 23D:
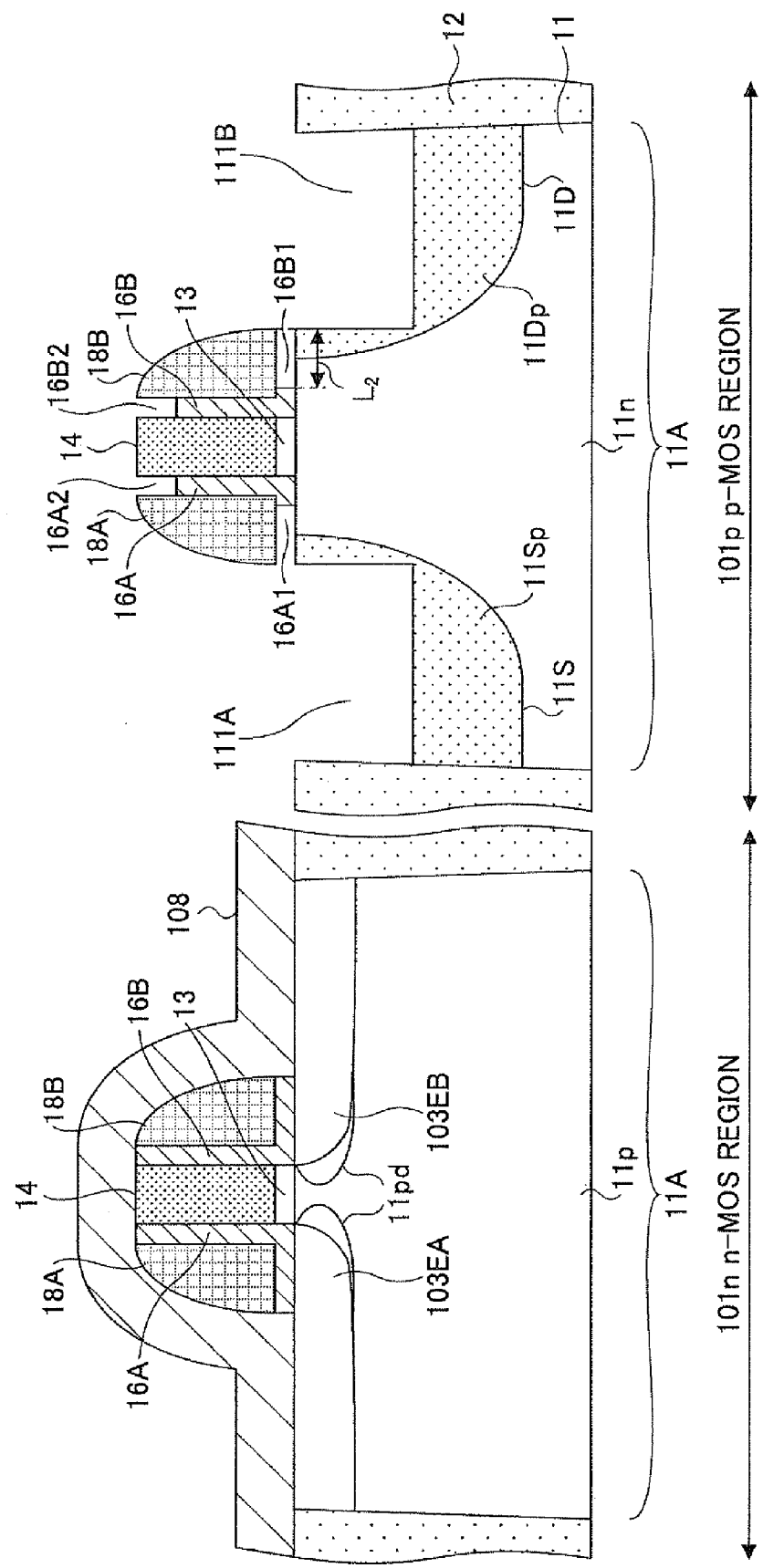

Next, in the step shown in FIG. 23D, the resist film 106 is removed, and a silicon oxide film 108 is formed to cover the n-MOS region 101n. The silicon oxide film 108 is formed to have a thickness such that the silicon oxide film 108 is not removed in the subsequent step of isotropically etching the p-MOS region 101p. For example, the silicon oxide film 108 is formed to have a thickness of 40 nm by using a high density plasma CVD device.

Next, still in the step shown in FIG. 23D, in the silicon substrate 11 corresponding to the p-MOS region 101p, a portion of the device region 11A outside the second side-wall insulating films 18A and 18B is etched to form the trenches 111A and 111B. The method of forming the trenches 111A and 111B is the same as that described with reference to FIG. 4C.

Next, still in the step shown in FIG. 23D, portions of the first side wall insulating films 16A, 16B in the p-MOS region 101p are removed by isotropic etching, and below the bottom surface of the second side wall insulating films 18A and 18B, the surface of the silicon substrate 11 is exposed, forming the spaces 16A1 and 16B1, which are like slits along the gate width direction. The method of forming the spaces 16A1 and 16B1 is the same as that described with reference to FIG. 5A. In the spaces 16A1 and 16B1, it is preferable that the distance L2 from the outer side ends of the second side-wall insulating films 18A and 18B to the ends of the first side wall insulating films 16A, 16B of the gate electrode 14 be sufficiently long.

Figure 23E:
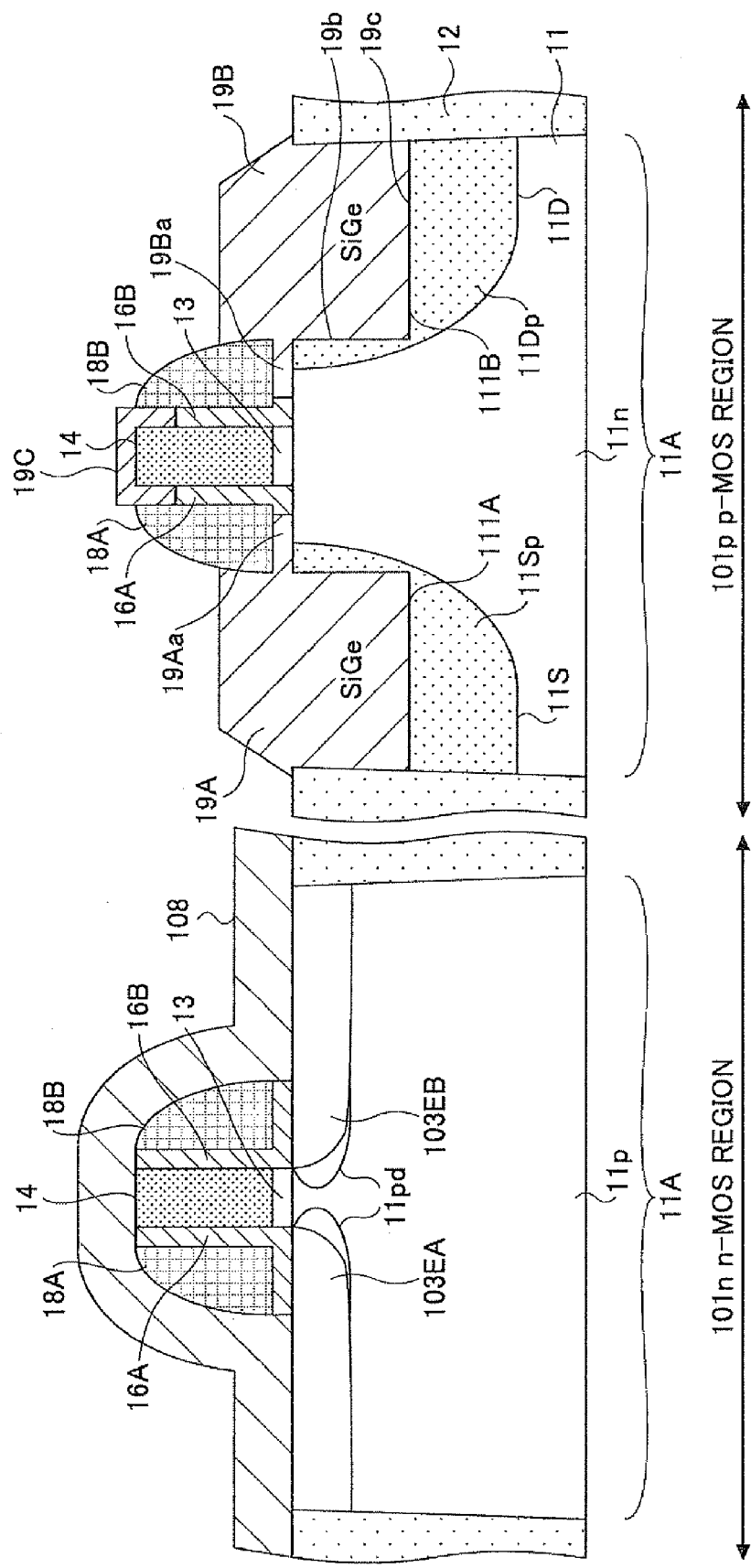

Next, in the step shown in FIG. 23E, the p-type SiGe mixed crystal layers 19A and 19B are epitaxially grown in the trenches 111A and 111B in the p-MOS region 101p as shown in FIG. 23D. The p-type SiGe mixed crystal layers 19A and 19B fill up the spaces 16A1 and 16B1, forming the extended portions 19Aa, 19Ba. Further, the SiGe mixed crystal layers 19A and 19B grow upward while being in close contact with the side surfaces of the second side-wall insulating films 18A, 18B. At the same time, the SiGe mixed crystal layer 19C is also formed on the surface of the gate electrode 14. The method of forming the p-type SiGe mixed crystal layers 19A and 19B is the same as that described with reference to FIG. 5B.

Figure 23F:
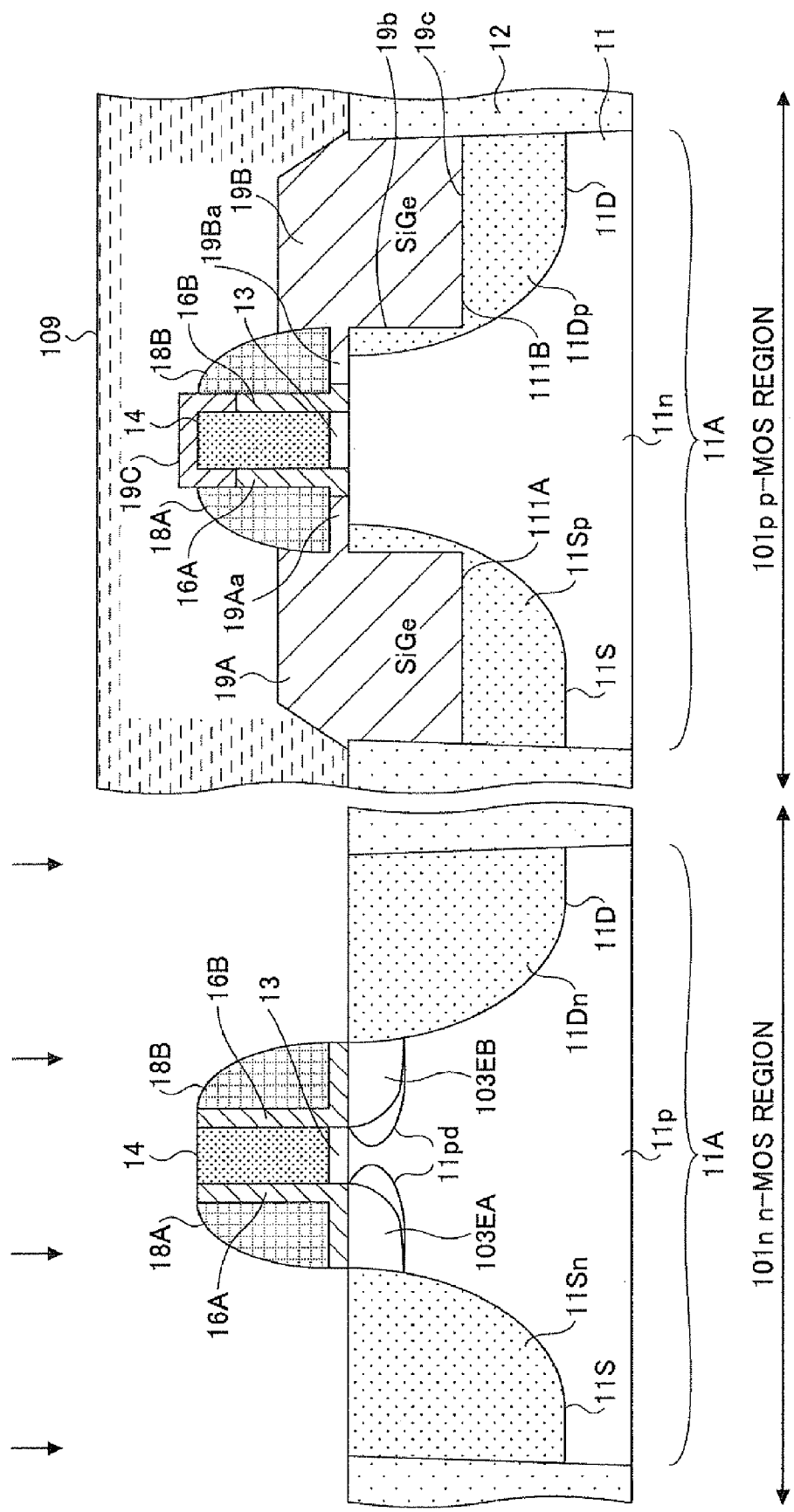

Next, in the step shown in FIG. 23F, a resist film 109 is formed to cover the p-MOS region 101p, and the silicon oxide film 108 covering the n-MOS region 101n is removed by dry etching to expose the surface of the silicon substrate 11.

Next, still in the step shown in FIG. 23F, P or other n-type impurities are implanted into the n-MOS region 101n, thereby, forming the n-type impurity regions 11Sn and 11Dn outside the second side-wall insulating films 18A and 18B in the device region 11A in the silicon substrate 11. In this way, since the n-type impurity regions 11Sn and 11Dn in the n-MOS region 101n are formed after the extended portions 19Aa, 19Ba in the p-MOS region 101p are formed, it is possible to prevent abnormal diffusion of impurities in the n-type impurity regions 11Sn and 11Dn, and this improves performance of the transistor.

Figure 23G:
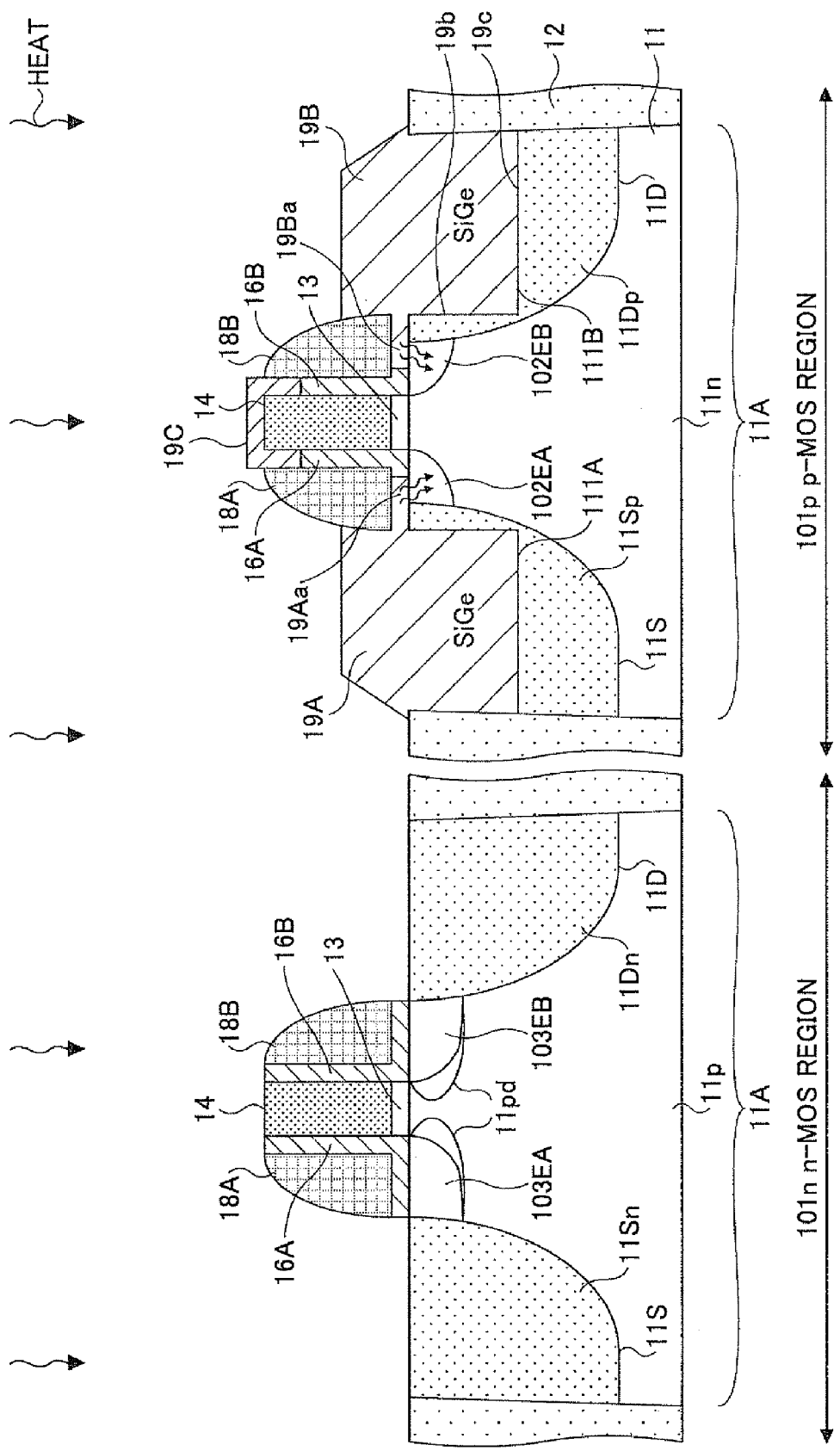

Next, in the step shown in FIG. 23G, the source extension region 102EA and the drain extension region 102EB are formed by heat treatment in the p-MOS region 101p. Specifically, a RTP (Rapid Thermal Process) device is used to perform a heat treatment to induce diffusion of the p-type impurity in the extended portions 19Aa, 19Ba of the SiGe mixed crystal layers 19A and 19B in the p-channel MOS transistor 100p to the silicon substrate 11 in contact with the extended portions 19Aa, 19Ba. That is, as shown by arrows in the extended portions 19Aa, 19Ba in FIG. 23G, the p-type impurities diffuse from the extended portions 19Aa, 19Ba, in which the impurity concentration is high, to the silicon substrate 11, in which the impurity concentration is low. Because this diffusion is solid phase diffusion, the impurity concentration profile is formed so that the impurity concentration is high near the surface of the silicon substrate 11, and decreases along the depth direction of the silicon substrate 11. Due to this, the channeling effect, which occurs when the impurities are implanted by ion-implantation, does not occur, thus, it is possible to prevent the short-channel effect even without forming the n-type pocket implanted region. As a result, it is possible to improve mobility of the p-type carriers in the channel region.

Instead of omitting the n-type pocket implanted regions, the n-type pocket implanted regions can be formed with low impurity concentration compared to the usual impurity concentration.

When fabricating the n-type pocket implanted regions, as shown in the step shown in FIG. 23A, P or other n-type impurities may be implanted obliquely into the device region 11A in the p-MOS region 101p with the gate electrode 14 as a mask to form the pocket implanted regions.

Next, still in the step shown in FIG. 23G, heat treatment is performed to activate impurities in the p-type diffusion regions 11Sp and 11Dp or the n-type diffusion regions 11Sn and 11Dn. This step can be omitted if the impurities have been activated in the heat treatment for forming the source extension region 102EA and the drain extension region 102EB.

In addition, formation of the n-type impurity regions 11Sn and 11Dn as shown in FIG. 23F may be carried out after formation of the source extension region 102EA and the drain extension region 102EB as shown in FIG. 23G and before the heat treatment for impurity activation. Due to this, it is possible to reduce influence of the heat treatment for forming the source extension region 102EA and the drain extension region 102EB on the n-type impurity regions 11Sn and 11Dn, such as distortion of the profile caused by thermal diffusion.

After the step shown in FIG. 23G, a step of forming silicide films is performed. Due to this, as shown in FIG. 22, silicide layers 20A, 20B, and 20C are formed by silicifying the surfaces of the SiGe mixed crystal layers 19A and 19B in the p-MOS region 101p, and the surface of the SiGe mixed crystal layer 19C on the gate electrode 14. Further, silicide layers 104A, 104B, and 104C are formed by silicifying the surface of the portion of the silicon substrate 11 corresponding to the source region 11S and the drain region 11D in the n-MOS region 101n, and the surface of the gate electrode 14. The method of forming the silicide layers is the same as the step after the step in FIG. 5B.

In this way, the semiconductor device 100 includes the p-channel MOS transistor 100p and the n-channel MOS transistor 100n as shown in FIG. 22 is formed.

In the method of fabricating the semiconductor device 100 of the present embodiment, the p-type impurities in the extended portions 19Aa, 19Ba of the SiGe mixed crystal layers 19A and 19B in the p-channel MOS transistor 100p are diffused into the silicon substrate 11 by solid phase diffusion to form the source extension region 102EA and the drain extension region 102EB. Because of the solid phase diffusion, the impurity concentration profile is formed so that the impurity concentration of the p-type impurities is high near the surface of the silicon substrate 11, and decreases along the depth direction of the silicon substrate 11. Since the channeling effect, which occurs when the impurities are implanted by ion-implantation, does not occur, it is possible to form the n-type pocket implanted regions with low impurity concentration, or it is possible to prevent the short-channel effect even without forming the n-type pocket implanted region. As a result, it is possible to improve mobility of the p-type carriers in the channel region. In addition, since the n-type pocket implanted regions can be omitted, the fabrication process is simple.

14th Embodiment

Figure 24:
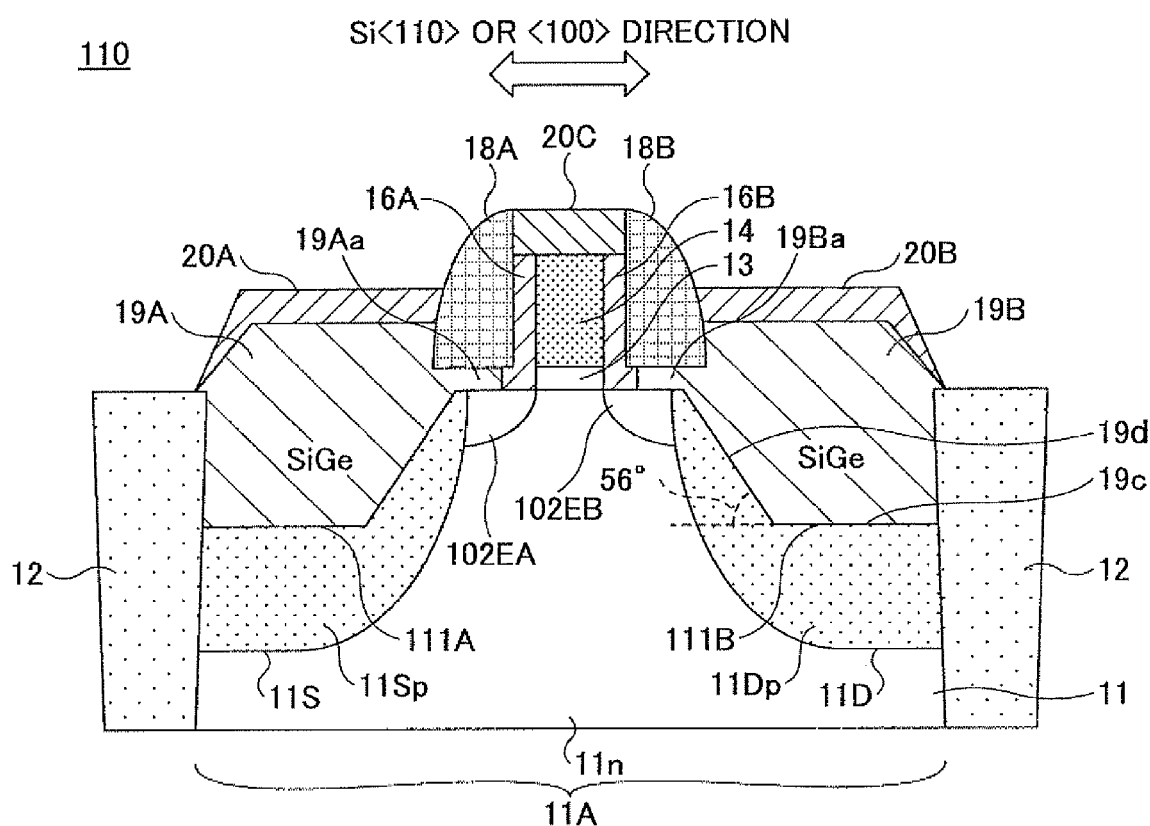
FIG. 24 is a cross-sectional view illustrating an example of a semiconductor device 110 according to a 14th embodiment of the present invention.

FIG. 24 is a cross-sectional view illustrating an example of a semiconductor device 110 according to a 14th embodiment of the present invention.

In the following descriptions, the same reference numbers are assigned to the same elements as those described in the previous embodiments, and overlapping descriptions are omitted.

The semiconductor device 110 shown in FIG. 24 is a p-channel MOS transistor, which is a modification of the p-channel MOS transistor 100p in FIG. 22 in the 13th embodiment. It should be noted that the semiconductor device of the present embodiment may be combined with the n-channel MOS transistor 100n in FIG. 22 in the 13th embodiment to form the CMOS transistor in FIG. 22.

The p-channel MOS transistor 110 in FIG. 24 is basically the same as the p-channel MOS transistor 100p in FIG. 22 except that the SiGe mixed crystal layers 19A and 19B are different.

The SiGe mixed crystal layers 19A and 19B in the p-channel MOS transistor 110 are the same as those shown in FIG. 6 in the second embodiment, and the method of fabricating the SiGe mixed crystal layers 19A and 19B in the p-channel MOS transistor 110 is also the same as that shown in FIG. 7A and FIG. 7B in the second embodiment.

In the p-channel MOS transistor 110 of the present embodiment, the source extension region 102EA and the drain extension region 102EB are formed by diffusing, by heat treatment, the p-type impurities in the extended portions 19Aa, 19Ba of the SiGe mixed crystal layers 19A and 19B into the silicon substrate 11 by means of solid phase diffusion.

Therefore, in the p-channel MOS transistor 110, because of the SiGe mixed crystal layers 19A and 19B and the source extension region 102EA and the drain extension region 102EB, it is possible to further improve mobility of the p-type carriers in the channel region.

15th Embodiment

Figure 25:
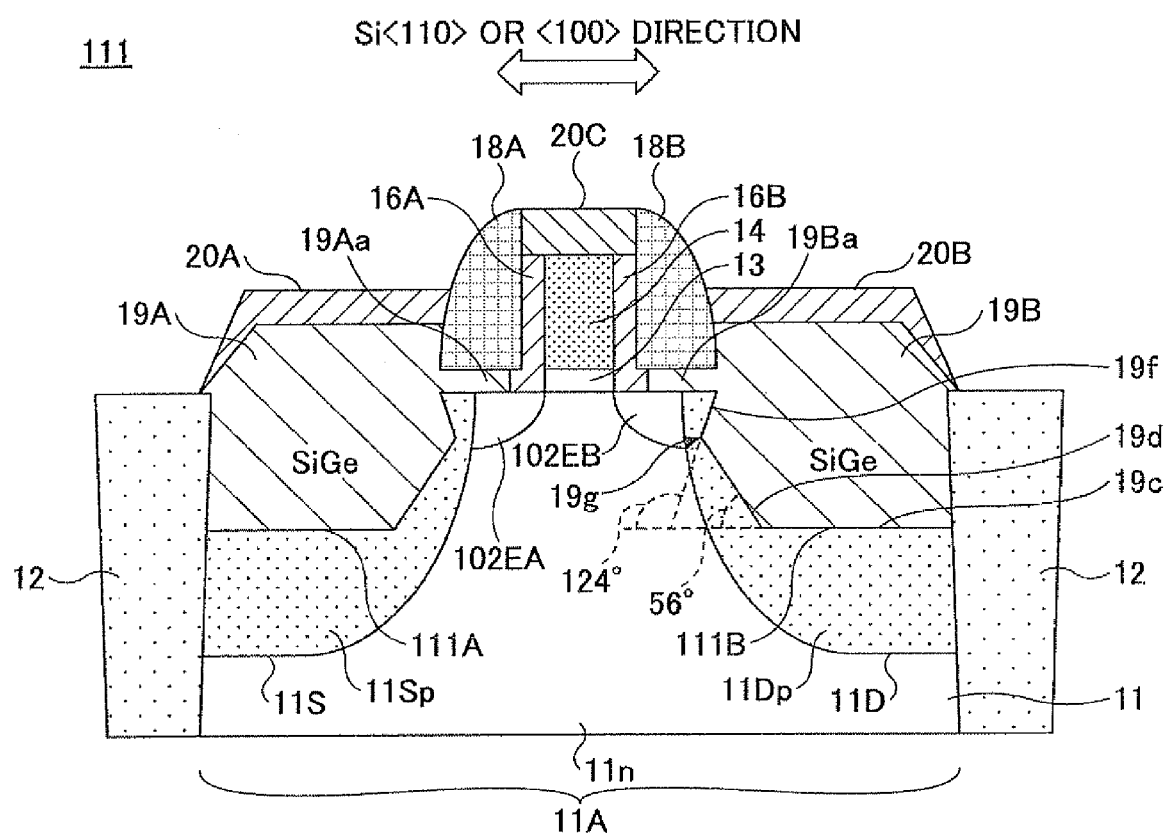
FIG. 25 is a cross-sectional view illustrating an example of a semiconductor device 110 according to a 15th embodiment of the present invention.

FIG. 25 is a cross-sectional view illustrating an example of a semiconductor device 110 according to a 15th embodiment of the present invention.

In the following descriptions, the same reference numbers are assigned to the same elements as those described in the previous embodiments, and overlapping descriptions are omitted.

The semiconductor device 111 shown in FIG. 25 is a p-channel MOS transistor, which is a modification of the p-channel MOS transistor 100p in FIG. 22 in the 13th embodiment. It should be noted that the semiconductor device of the present embodiment may be combined with the n-channel MOS transistor 100n in FIG. 22 to form the CMOS transistor in FIG. 22.

The p-channel MOS transistor 111 in FIG. 25 is basically the same as the p-channel MOS transistor 100p in FIG. 22 except that the SiGe mixed crystal layers 19A and 19B are different.

The SiGe mixed crystal layers 19A and 19B in the p-channel MOS transistor 111 are the same as those shown in FIG. 8 in the third embodiment, and the method of fabricating the SiGe mixed crystal layers 19A and 19B in the p-channel MOS transistor 111 is also the same as that shown in FIG. 9A through FIG. 9C in the third embodiment.

In the p-channel MOS transistor 111 of the present embodiment, the source extension region 102EA and the drain extension region 102EB are formed by diffusing, by heat treatment, the p-type impurities in the extended portions 19Aa, 19Ba of the SiGe mixed crystal layers 19A and 19B into the silicon substrate 11 by means of solid phase diffusion.

Therefore, in the p-channel MOS transistor 111, because of the SiGe mixed crystal layers 19A and 19B and the source extension region 102EA and the drain extension region 102EB, it is possible to further improve mobility of the p-type carriers in the channel region.

16th Embodiment

Figure 26:
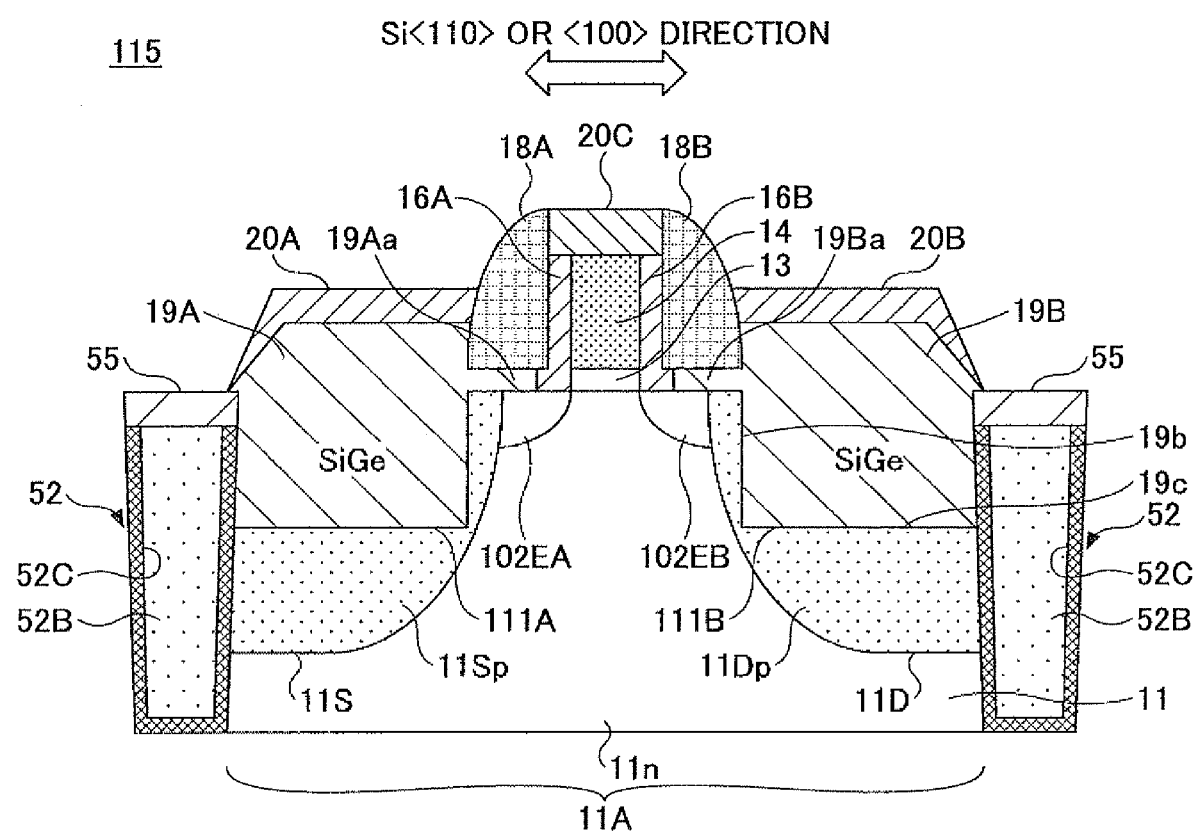
FIG. 26 is a cross-sectional view illustrating an example of a semiconductor device 110 according to a 16th embodiment of the present invention.

FIG. 26 is a cross-sectional view illustrating an example of a semiconductor device 110 according to a 16th embodiment of the present invention.

In the following descriptions, the same reference numbers are assigned to the same elements as those described in the previous embodiments, and overlapping descriptions are omitted.

The semiconductor device 115 shown in FIG. 26 is a p-channel MOS transistor, which is a modification of the p-channel MOS transistor 100p in FIG. 22. It should be noted that the semiconductor device of the present embodiment may be combined with the n-channel MOS transistor 100n in FIG. 22 to form the CMOS transistor in FIG. 22.

The p-channel MOS transistor 115 in FIG. 26 is basically the same as the p-channel MOS transistor 100p in FIG. 22 in the 13th embodiment except that the element separation region 52 has a different structure. The element separation region 52 in the p-channel MOS transistor 115 is the same as that shown in FIG. 10 in the fourth embodiment.

Therefore, in the p-channel MOS transistor 115, it is possible to prevent erosion of the element separation region 52 caused by the HF treatment and prevent junction leakage, and further improve mobility of the p-type carriers in the channel region.

17th Embodiment

Figure 27:
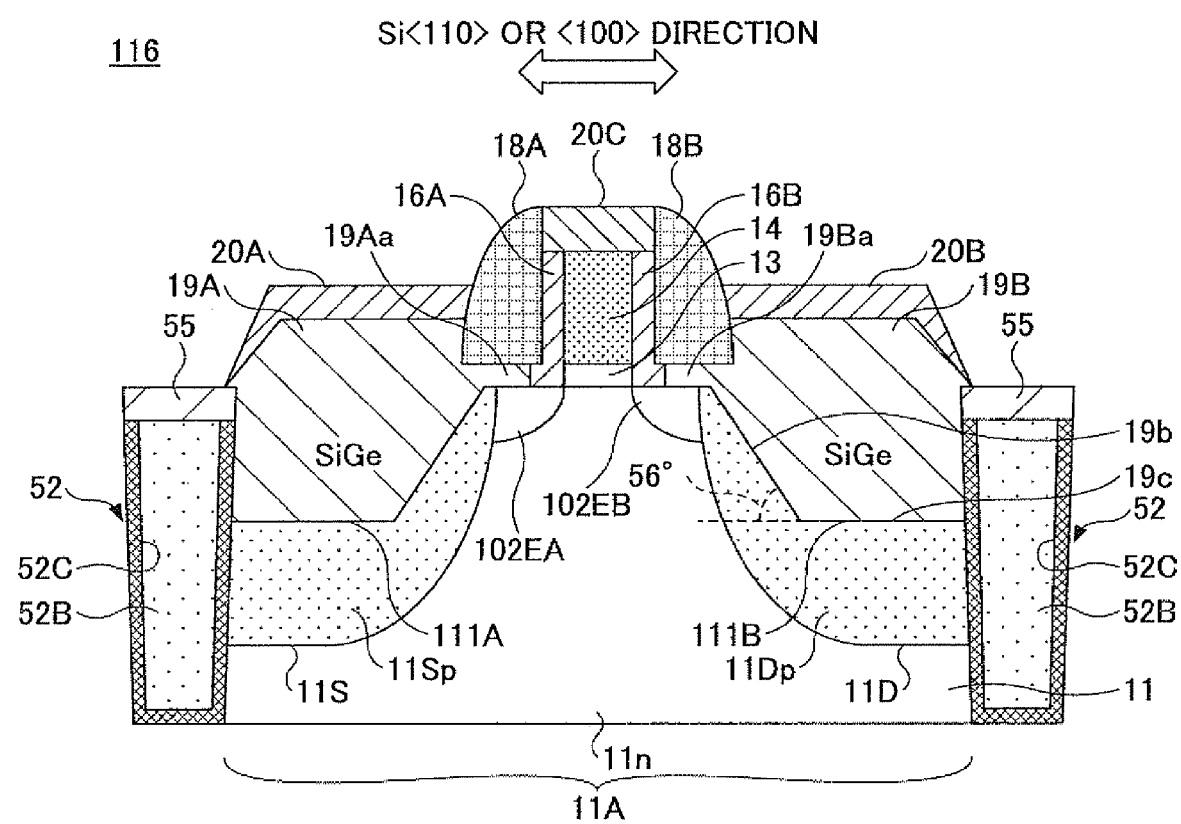
FIG. 27 is a cross-sectional view illustrating an example of a semiconductor device 116 according to a 17th embodiment of the present invention.

FIG. 27 is a cross-sectional view illustrating an example of a semiconductor device 116 according to a 17th embodiment of the present invention.

In the following descriptions, the same reference numbers are assigned to the same elements as those described in the previous embodiments, and overlapping descriptions are omitted.

The semiconductor device 116 shown in FIG. 27 is a p-channel MOS transistor, which is a modification of the p-channel MOS transistor 100p in FIG. 22. It should be noted that the semiconductor device of the present embodiment may be combined with the n-channel MOS transistor 100n in FIG. 22 to form the CMOS transistor in FIG. 22.

The p-channel MOS transistor 116 in FIG. 27 is basically the same as the p-channel MOS transistor 110 in FIG. 24 in the 14th embodiment except that the element separation region 52 has a different structure. The element separation region 52 in the p-channel MOS transistor 116 is the same as that shown in FIG. 14 in the fifth embodiment.

Therefore, in the p-channel MOS transistor 116, it is possible to prevent erosion of the element separation region 52 caused by the HF treatment and prevent junction leakage, and further improve mobility of the p-type carriers in the channel region.

18th Embodiment

Figure 28:
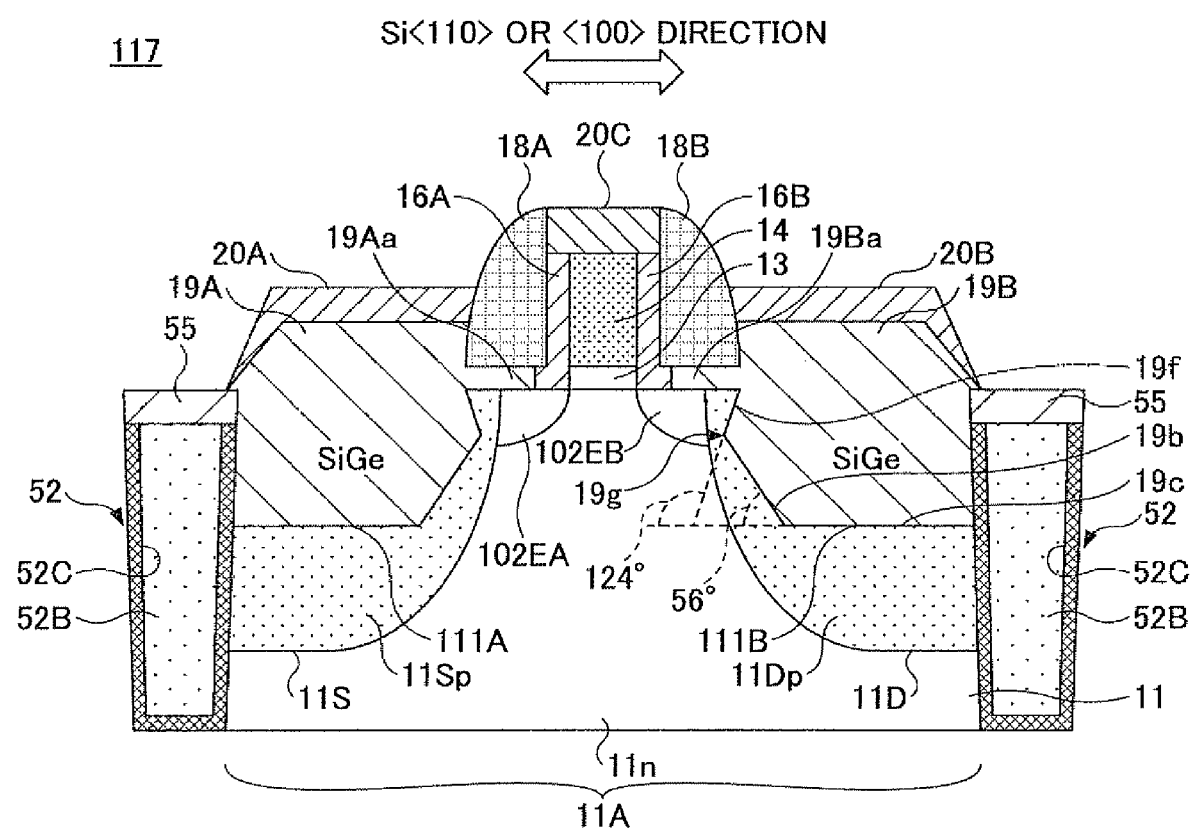
FIG. 28 is a cross-sectional view illustrating an example of a semiconductor device 117 according to an 18th embodiment of the present invention.

FIG. 28 is a cross-sectional view illustrating an example of a semiconductor device 117 according to an 18th embodiment of the present invention.

In the following descriptions, the same reference numbers are assigned to the same elements as those described in the previous embodiments, and overlapping descriptions are omitted.

The semiconductor device 117 shown in FIG. 28 is a p-channel MOS transistor, which is a modification of the p-channel MOS transistor 100p in FIG. 22. It should be noted that the semiconductor device of the present embodiment may be combined with the n-channel MOS transistor 100n in FIG. 22 to form the CMOS transistor in FIG. 22.

The p-channel MOS transistor 117 in FIG. 28 is basically the same as the p-channel MOS transistor 111 in FIG. 25 in the 15th embodiment except that the element separation region 52 has a different structure. The element separation region 52 in the p-channel MOS transistor 117 is the same as that shown in FIG. 15 in the sixth embodiment.

Therefore, in the p-channel MOS transistor 116, it is possible to prevent erosion of the element separation region 52 caused by the HF treatment and prevent junction leakage, and further improve mobility of the p-type carriers in the channel region.

19th Embodiment

FIG. 29 is a cross-sectional view illustrating an example of a semiconductor device 120 according to a 19th embodiment of the present invention.

In the following descriptions, the same reference numbers are assigned to the same elements as those described in the previous embodiments, and overlapping descriptions are omitted.

In FIG. 29, in each of the p-channel MOS transistor 120p and the n-channel MOS transistor 120n of the semiconductor device 120, third side wall insulating films 122A and 122B are formed between one of the opposite side walls of the gate electrode 14 and one of the first side wall insulating films 16A and 16B to cover the side walls of the gate insulating film 13.

Except for presence of the third side wall insulating films 122A and 122B, the p-channel MOS transistor 120p of the semiconductor device 120 in FIG. 29 in the present embodiment is the same as the p-channel MOS transistor 10 of the first embodiment in FIG. 3.

The third side wall insulating films 122A and 122B are formed from insulating, which have etching selectivity, different from the first side wall insulating films 16A and 16B. For example, if the first side wall insulating films 16A and 16B are formed from a silicon oxide film, the third side wall insulating films 122A and 122B are formed from a silicon nitride film.

The extended portions 19Aa, 19Ba of the p-channel MOS transistor 120p are in contact with the first side wall insulating films 16A and 16B on the side of the gate electrode 14. When the extended portions 19Aa, 19Ba are very close to the side walls of the gate insulating film 13, the stress from the SiGe mixed crystal of the extended portions 19Aa, 19Ba is more effectively applied on the channel region, and it is anticipated that the parasitic resistance of the channel region decreases, and the mobility of the p-type carriers is improved. For this reason, it is preferable that the extended portions 19Aa, 19Ba be formed in contact with the outer surface of the third side wall insulating films 122A and 122B on the side of the gate insulating film 13.

In addition, it is preferable that the thickness of the third side wall insulating films 122A and 122B be equal to or less than that of the first side walls 16A and 16B, because in this case the extended portions 19Aa, 19Ba can be formed at a position very close to the side walls of the gate insulating film 13. For example, if the thickness of the first side walls 16A and 16B is 10 nm, the thickness of the third side wall insulating films 122A and 122B may be in a range from 3 nm to 10 nm.

In FIG. 29, it is illustrated that the lower ends of the first side walls 16A and 16B are formed to be roughly at the same height as the bottom surfaces of the second side-wall insulating films 18A and 18B. However, the first side walls 16A and 16B may also be formed to be higher than the bottom surfaces of the second side-wall insulating films 18A and 18B.

In the n-channel MOS transistor 120n, the third side wall insulating films 122A and 122B are not indispensable. However, it is preferable to form the third side wall insulating films 122A and 122B also in the n-channel MOS transistor 120n, because the gate lengths of the p-channel MOS transistor 120p and the n-channel MOS transistor 120n can be aligned if they are formed in the same step.

In the present embodiment, because the third side wall insulating films 122A and 122B are formed in the p-channel MOS transistor 120p of the semiconductor device 120, the extended portions 19Aa, 19Ba can be formed at a position in contact with the outer surface of the third side wall insulating films 122A and 122B. Due to this, stress from the SiGe mixed crystal constituting the extended portions 19Aa, 19Ba can be more effectively applied on the channel region, and as a result, it is possible to further improve the mobility of the p-type carriers.

Below, a method of fabricating the semiconductor device 120 in FIG. 29 is explained with reference to FIG. 30A and FIG. 30B.

Figure 30A:
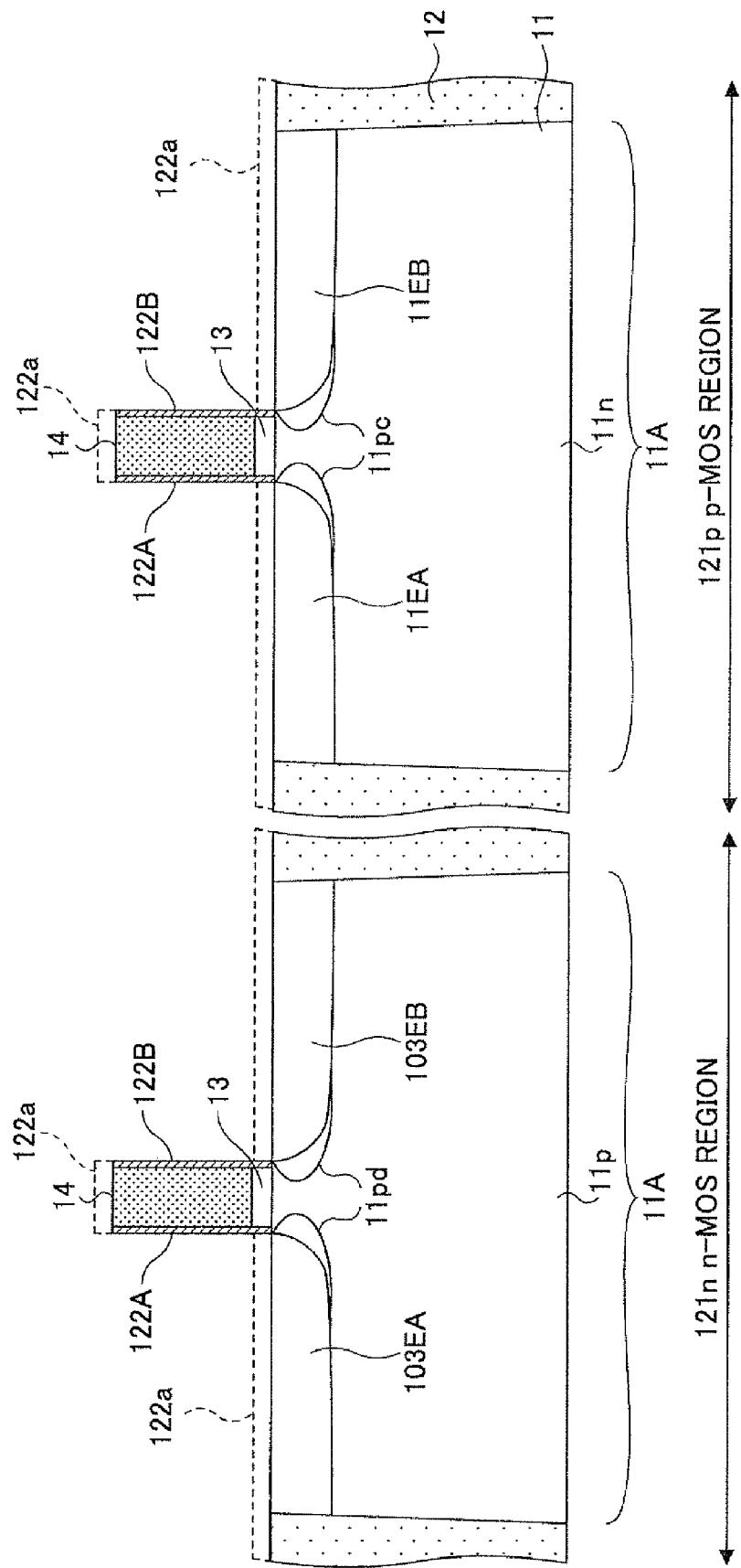
FIG. 30A and FIG. 30B are cross-sectional views illustrating portions of the semiconductor device 120 in FIG. 29 for illustrating a method of fabricating the semiconductor device 120 according to the 19th embodiment of the present invention.
Figure 30B:
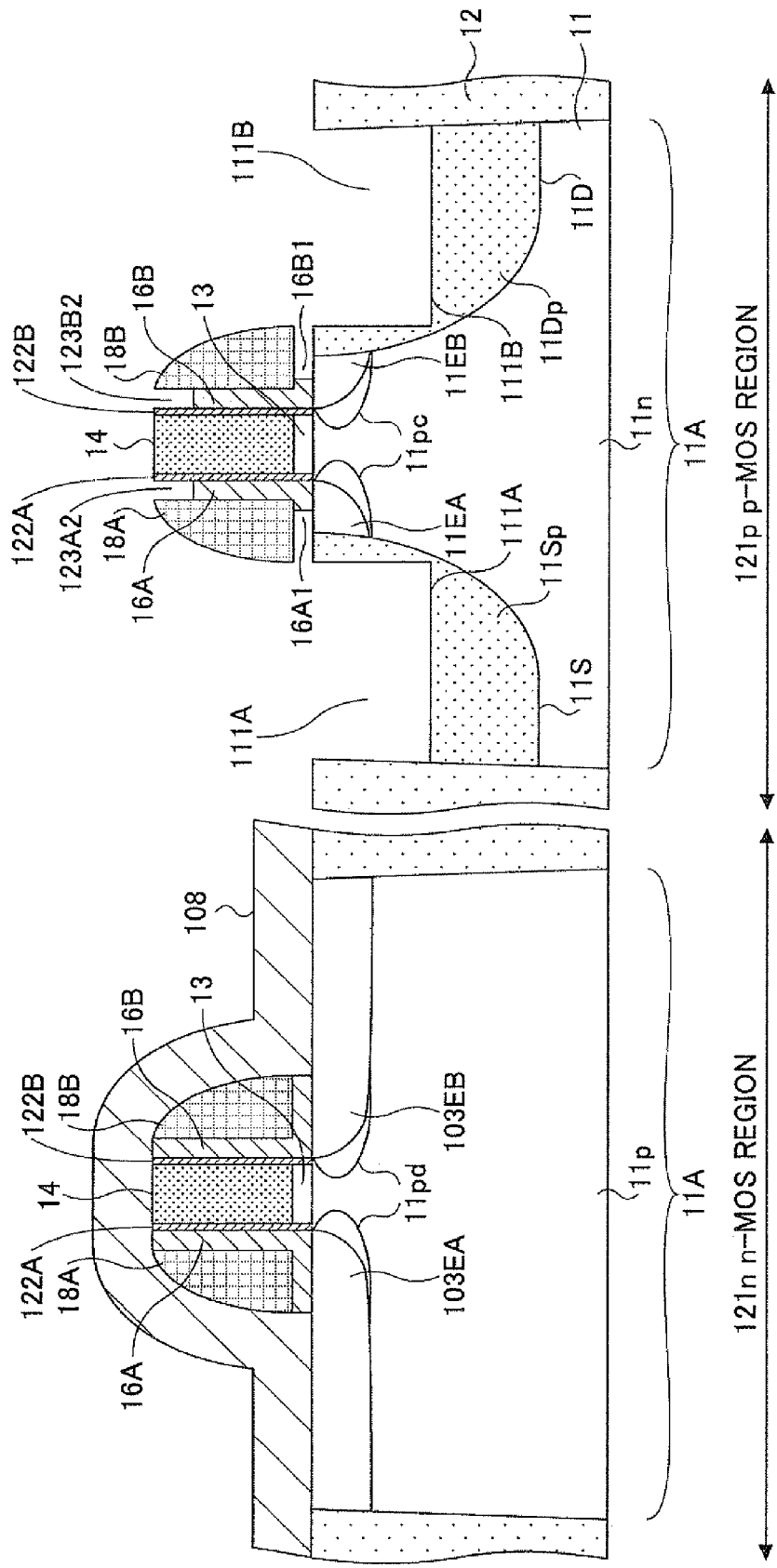

FIG. 30A and FIG. 30B are cross-sectional views illustrating portions of the semiconductor device 120 in FIG. 29 for illustrating a method of fabricating the semiconductor device 120 according to the 19th embodiment of the present invention.

In the step shown in FIG. 30A, on the p-type silicon substrate 11, the element separation region 12, and the p-type Si well 11p and the n-type Si well 11n in the device region 11A are formed.

In addition, the gate insulating films 13 and the gate electrodes 14 are formed respectively on the silicon substrate 11 and corresponding to the respective device regions 11A of a p-MOS region 121p and an n-MOS region 121n. The above steps are the same as those shown in FIG. 23A.

Next, still in the step shown in FIG. 30A, a third insulating film 122a is formed to cover the gate insulating films 13 and the gate electrodes 14. The third insulating film 122a is formed from an insulating material, which has etching selectivity, different from the first side wall insulating films 16A and 16B, which are formed in the subsequent steps. For example, the third insulating film 122a is a silicon nitride film formed by CVD. In addition, the third insulating film 122a is etched back, thereby, forming the third side wall insulating films 122A and 122B on the side walls of the gate insulating films 13 and the gate electrodes 14. The lower ends of the third side wall insulating films 122A and 122B are in contact with the silicon substrate 11.

Next, still in the step shown in FIG. 30A, the p-type pocket implanted regions 11pd, and the n-type source extension region 103EA and the n-type drain extension region 103EB are formed in the device region 11A in the n-MOS region 121n. This step is the same as that shown in FIG. 23A.

Next, still in the step shown in FIG. 30A, with the gate electrode 14 as a mask, As or other n-type impurities are implanted obliquely in the device region 11A of the p-MOS region 121p, thereby, forming the n-type pocket implantation regions 11pc. Further, with the gate electrode 14 as a mask, boron (B) or other p-type impurities are implanted in the device region 11A of the p-MOS region 121p, thereby forming the source extension region 11EA and the drain extension region 11EB.

Next, in the step shown in FIG. 30B, the first side wall insulating films 16A and 16B and the second side-wall insulating films 18A and 18B are formed on the outer surfaces of the third side wall insulating film 122A and 122B. The method of forming the first side wall insulating films 16A and 16B and the second side-wall insulating films 18A and 18B is the same as that shown in FIG. 23B.

Next, still in the step shown in FIG. 30B, steps the same as those in FIG. 23C and FIG. 23D are performed to form the silicon oxide film 108 covering the p-MOS region 121n, the p-type impurity regions 11Sp and 11Dp in the p-MOS region 121p, and the trenches 111A and 111B.

Next, still in the step shown in FIG. 30B, portions of the first side wall insulating films 16A, 16B in the p-MOS region 121p are removed by isotropic etching, and below the bottom surfaces of the second side wall insulating films 18A and 18B, the surface of the silicon substrate 11 is exposed, forming the spaces 16A1 and 16B1.

When the first side wall insulating films 16A, 16B are formed from silicon oxide films, a water solution of HF or HF vapor is used in the isotropic etching. In the present embodiment, since the third side wall insulating films 122A and 122B are formed from a silicon nitride film, even when etching of the first side wall insulating films 16A, 16B is overdone, the etching process stops on the outer surface of the third side wall insulating films 122A and 122B. For this reason, it is possible to prevent the gate insulating film 13 from being eroded, and prevent the surface of silicon substrate 11 in the channel region from being exposed. In addition, the spaces 16A1 and 16B1 can be formed very close to the side walls of the gate insulating film 13.

In the isotropic etching, the amount of the first side wall insulating films 16A, 16B to be removed is determined appropriately in the same way as in the semiconductor device 10 in FIG. 3 in the first embodiment, further, it is preferable that the spaces 16A1 and 16B1 can reach the outer surface of the third side wall insulating films 122A and 122B. Due to this, it is possible to make the extended portions 19Aa, 19Ba large.

During the isotropic etching, the first side wall insulating films 16A, 16B on the gate electrode 14 are also etched, and forming openings 123A2 and 123B2. In addition, since the upper portion of the third side wall insulating films 122A and 122B may be formed to be thinner than the lower portion of the third side wall insulating films 122A and 122B, when carrying out the isotropic etching, the portions of the third side wall insulating films 122A and 122B exposed in the openings 123A2 and 123B2 may be removed.

Next, after the step shown in FIG. 30B, the step of forming the SiGe mixed crystal regions as shown in FIG. 23E, the step of removing the resist film in the n-MOS region and the step of forming the n-type impurity regions as shown in FIG. 23F, and the step of forming silicide layers after the step in FIG. 23G, the semiconductor device 120 as shown in FIG. 29 of the present embodiment is obtained.

In the method of fabricating the semiconductor device 120 according to the 19th embodiment of the present invention, since the third side wall insulating films 122A and 122B are formed on the side walls of the gate insulating films 13 and the gate electrodes 14, even when the isotropic etching of the first side wall insulating films 16A, 16B is overdone, the etching process stops on the outer surface of the third side wall insulating films 122A and 122B. For this reason, it is possible to prevent the gate insulating film 13 from being eroded, and prevent leakage of the gate insulating film 13. In addition, since the surface of silicon substrate 11 in the channel region is not exposed, In addition, it is possible to prevent short circuit between the SiGe mixed crystal filling up the spaces 16A1 and 16B1 (the extended portions 19Aa, 19Ba) and the channel region.

In addition, since the spaces 16A1 and 16B1 can be formed in contact with the outer surface of the third side wall insulating films 122A and 122B, it is possible to obtain the extended portions 19Aa, 19Ba of a large volume. Due to this, stress from the SiGe mixed crystal constituting the extended portions 19Aa, 19Ba can be more effectively applied on the channel region, and as a result, it is possible to further improve the mobility of the p-type carriers.

20th Embodiment

Figure 31:
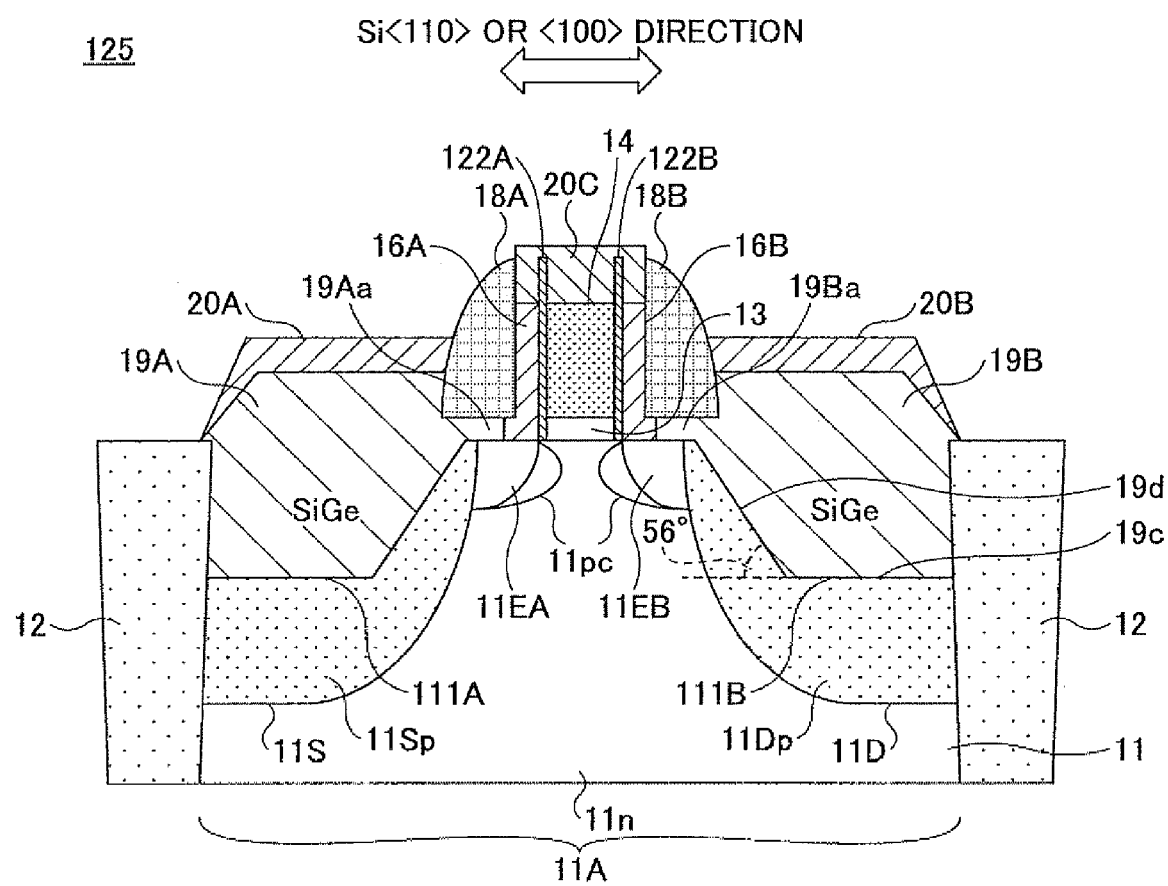
FIG. 31 is a cross-sectional view illustrating an example of a semiconductor device 125 according to a 20th embodiment of the present invention.

FIG. 31 is a cross-sectional view illustrating an example of a semiconductor device 125 according to a 20th embodiment of the present invention.

In the following descriptions, the same reference numbers are assigned to the same elements as those described in the previous embodiments, and overlapping descriptions are omitted.

The semiconductor device 125 shown in FIG. 31 in the present embodiment is basically the same as the p-channel MOS transistor 120p of the semiconductor device 120 shown in FIG. 29 in the 19th embodiment except that the SiGe mixed crystal layers 19A and 19B have a different structure.

The SiGe mixed crystal layers 19A and 19B in the present embodiment are the same as those shown in FIG. 6 in the second embodiment, and the method of fabricating the SiGe mixed crystal layers 19A and 19B in the present embodiment is also the same as that shown in FIG. 7A and FIG. 7B in the second embodiment.

In the semiconductor device 125 of the present embodiment, the third side wall insulating films 122A and 122B are formed between one of the opposite side walls of the gate electrode 14 and one of the first side wall insulating films 16A and 16B in contact with the surface of the silicon substrate 11 to cover the side walls of the gate insulating film 13.

Therefore, the semiconductor device 125 of the present embodiment has the same effect as the semiconductor device 120 in FIG. 29 in the 19th embodiment. Additionally, because of the structural effect of the SiGe mixed crystal layers 19A and 19B, it is possible to further improve the mobility of the p-type carriers.

21st Embodiment

Figure 32:
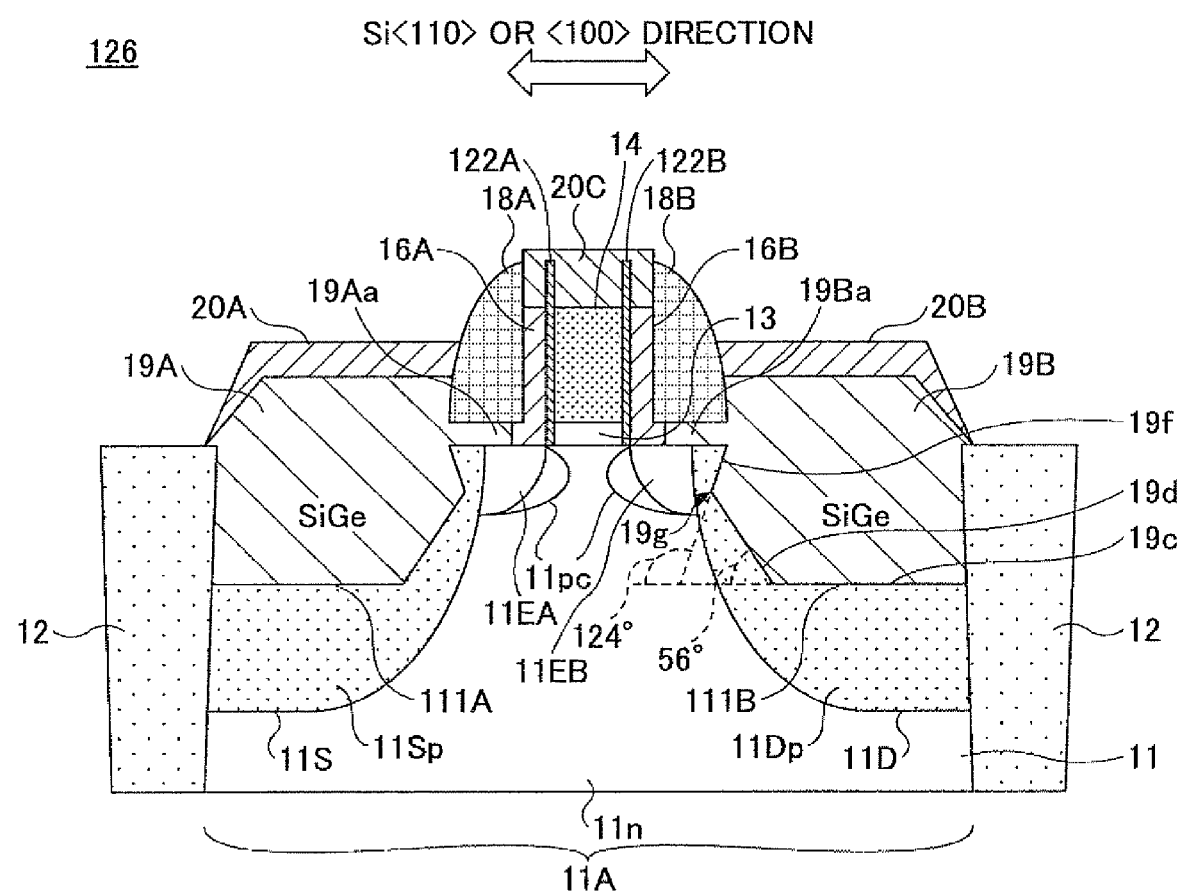
FIG. 32 is a cross-sectional view illustrating an example of a semiconductor device 126 according to a 21st embodiment of the present invention.

FIG. 32 is a cross-sectional view illustrating an example of a semiconductor device 126 according to a 21st embodiment of the present invention.

In the following descriptions, the same reference numbers are assigned to the same elements as those described in the previous embodiments, and overlapping descriptions are omitted.

The semiconductor device 126 shown in FIG. 32 in the present embodiment is basically the same as the p-channel MOS transistor 120p of the semiconductor device 120 shown in FIG. 29 in the 19th embodiment except that the SiGe mixed crystal layers 19A and 19B have a different structure.

The SiGe mixed crystal layers 19A and 19B in the present embodiment are the same as those shown in FIG. 8 in the third embodiment, and the method of fabricating the SiGe mixed crystal layers 19A and 19B in the present embodiment is also the same as that shown in FIG. 9A through FIG. 9C in the third embodiment.

In the semiconductor device 126 of the present embodiment, the third side wall insulating films 122A and 122B are formed between one of the opposite side walls of the gate electrode 14 and one of the first side wall insulating films 16A and 16B in contact with the surface of the silicon substrate 11 to cover the side walls of the gate insulating film 13.

Therefore, the semiconductor device 126 of the present embodiment has the same effect as the semiconductor device 120 in FIG. 29 in the 19th embodiment. Additionally, because of the effect of the SiGe mixed crystal layers 19A and 19B, it is possible to further improve the mobility of the p-type carriers.

22nd Embodiment

Figure 33:
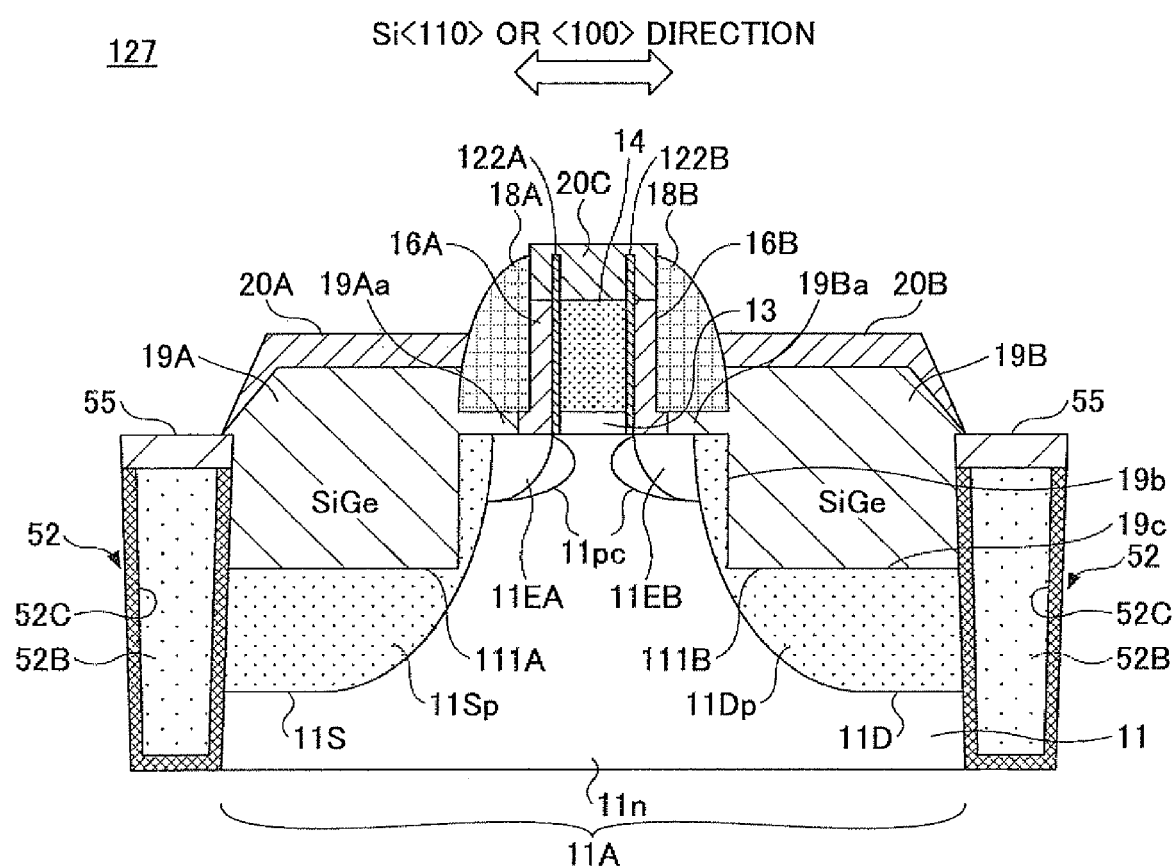
FIG. 33 is a cross-sectional view illustrating an example of a semiconductor device 127 according to a 22nd embodiment of the present invention.

FIG. 33 is a cross-sectional view illustrating an example of a semiconductor device 127 according to a 22nd embodiment of the present invention.

In the following descriptions, the same reference numbers are assigned to the same elements as those described in the previous embodiments, and overlapping descriptions are omitted.

The semiconductor device 127 shown in FIG. 33 is basically the same as the p-channel MOS transistor 120p in FIG. 29 in the 19th embodiment except that the element separation region 52 has a different structure. The element separation region 52 in the semiconductor device 127 is the same as that shown in FIG. 10 in the fourth embodiment.

Therefore, the semiconductor device 127 of the present embodiment has the same effect as the semiconductor device 127 in FIG. 29 in the 19th embodiment, and it is possible to prevent erosion of the element separation region 52 caused by the HF treatment and prevent junction leakage.

23rd Embodiment

Figure 34:
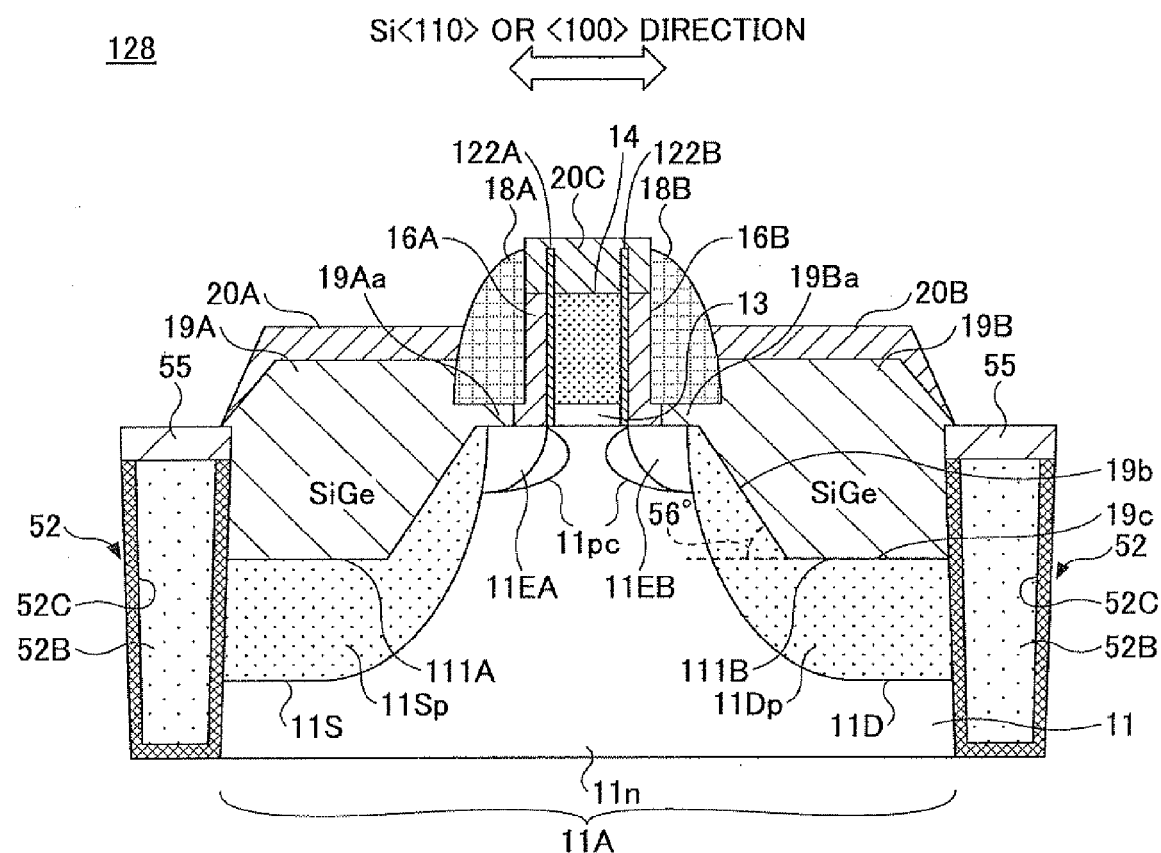
FIG. 34 is a cross-sectional view illustrating an example of a semiconductor device 128 according to a 23rd embodiment of the present invention.

FIG. 34 is a cross-sectional view illustrating an example of a semiconductor device 128 according to a 23rd embodiment of the present invention.

In the following descriptions, the same reference numbers are assigned to the same elements as those described in the previous embodiments, and overlapping descriptions are omitted.

The semiconductor device 128 shown in FIG. 34 is basically the same as the semiconductor device 125 in FIG. 31 in the 20th embodiment except that the element separation region 52 has a different structure. The element separation region 52 in the semiconductor device 128 is the same as that shown in FIG. 14 in the fifth embodiment.

Therefore, the semiconductor device 128 of the present embodiment has the same effect as the semiconductor device 125 in FIG. 31 in the 20th embodiment, and it is possible to prevent erosion of the element separation region 52 caused by the HF treatment and prevent junction leakage.

24th Embodiment

Figure 35:
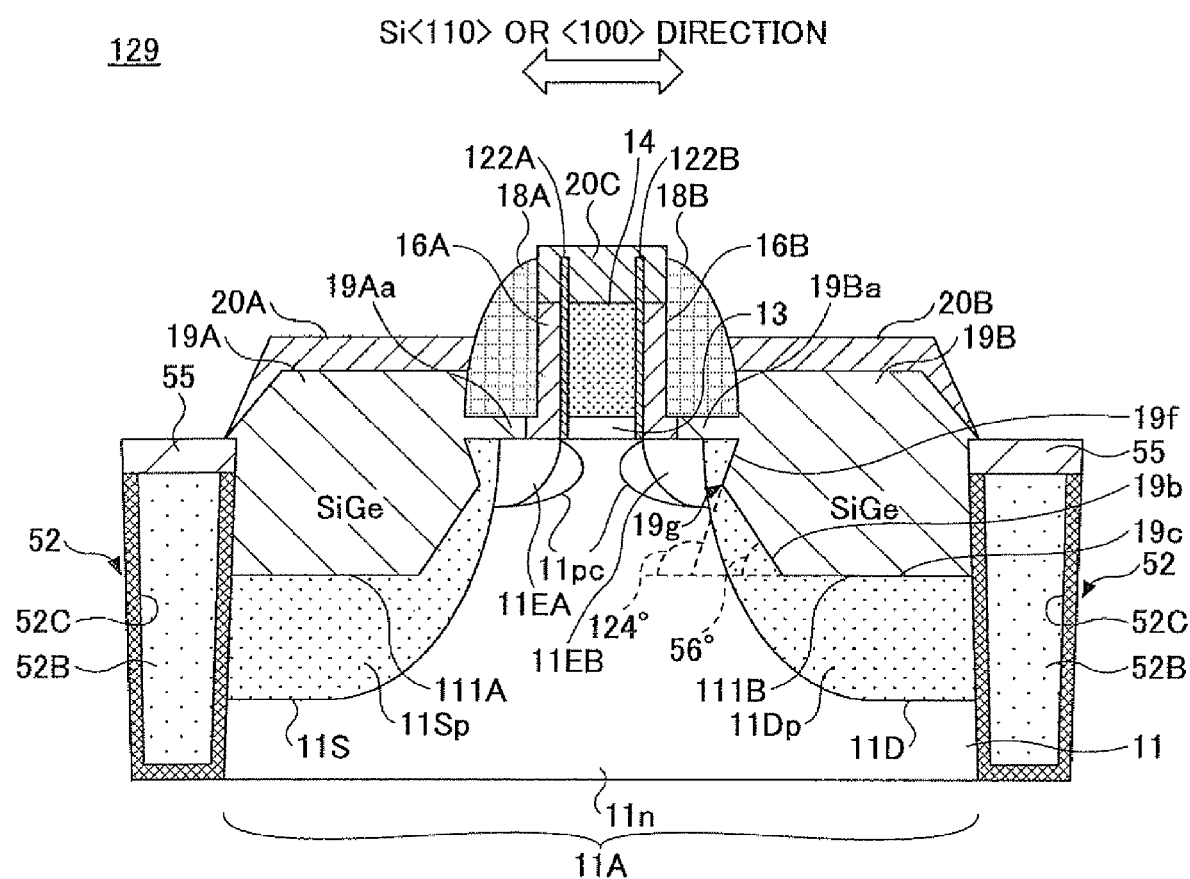
FIG. 35 is a cross-sectional view illustrating an example of a semiconductor device 129 according to a 24th embodiment of the present invention.

FIG. 35 is a cross-sectional view illustrating an example of a semiconductor device 129 according to a 24th embodiment of the present invention.

In the following descriptions, the same reference numbers are assigned to the same elements as those described in the previous embodiments, and overlapping descriptions are omitted.

The semiconductor device 129 shown in FIG. 35 is basically the same as the semiconductor device 126 in FIG. 32 in the 21st embodiment except that the element separation region 52 has a different structure. The element separation region 52 in the semiconductor device 129 is the same as that shown in FIG. 15 in the sixth embodiment.

Therefore, the semiconductor device 129 of the present embodiment has the same effect as the semiconductor device 126 in FIG. 32 in the 21st embodiment, and it is possible to prevent erosion of the element separation region 52 caused by the HF treatment and prevent junction leakage.

25th Embodiment

Figure 36:
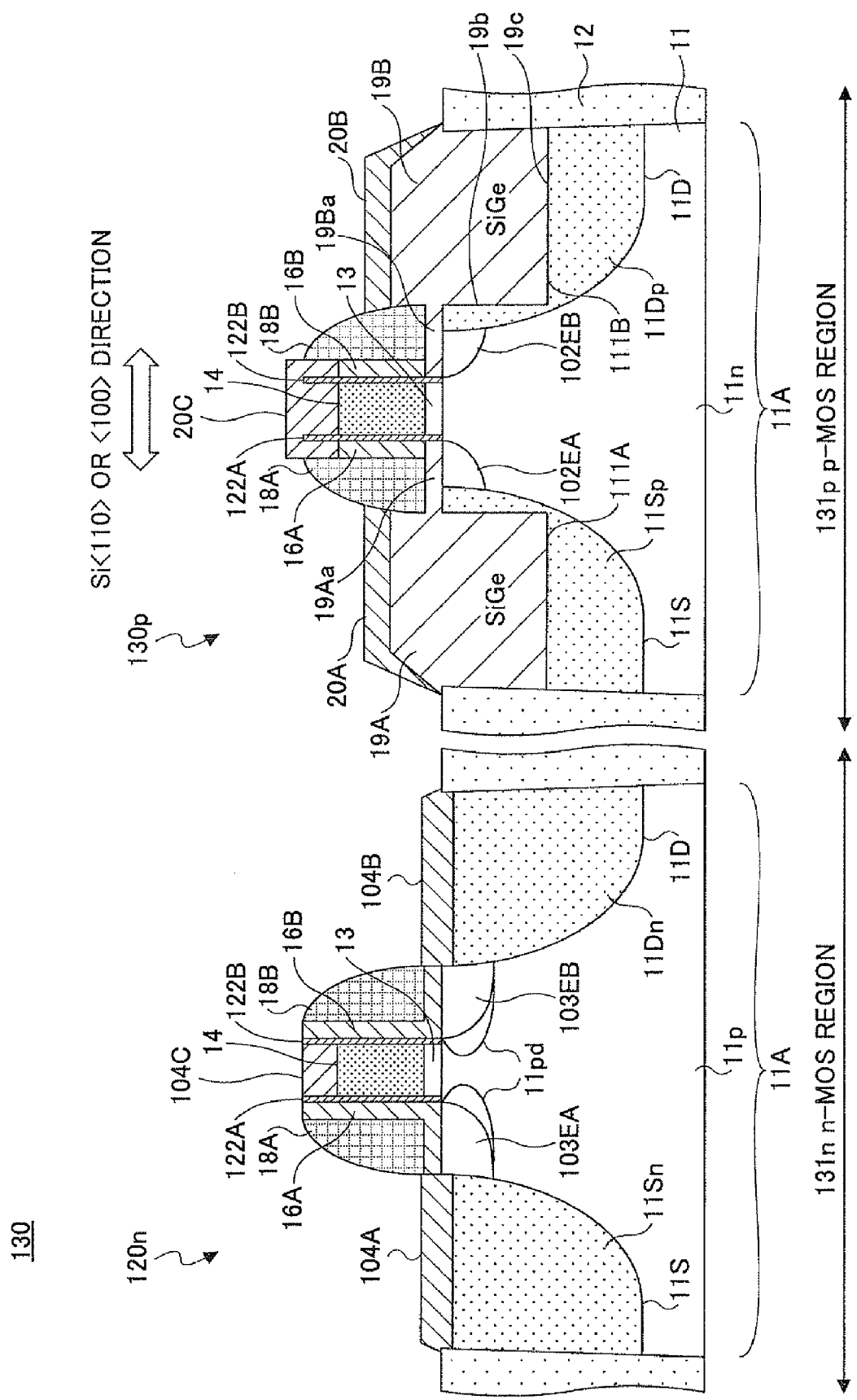
FIG. 36 is a cross-sectional view illustrating an example of a semiconductor device 130 according to a 25th embodiment of the present invention.

FIG. 36 is a cross-sectional view illustrating an example of a semiconductor device 130 according to a 25th embodiment of the present invention.

Figure 37:
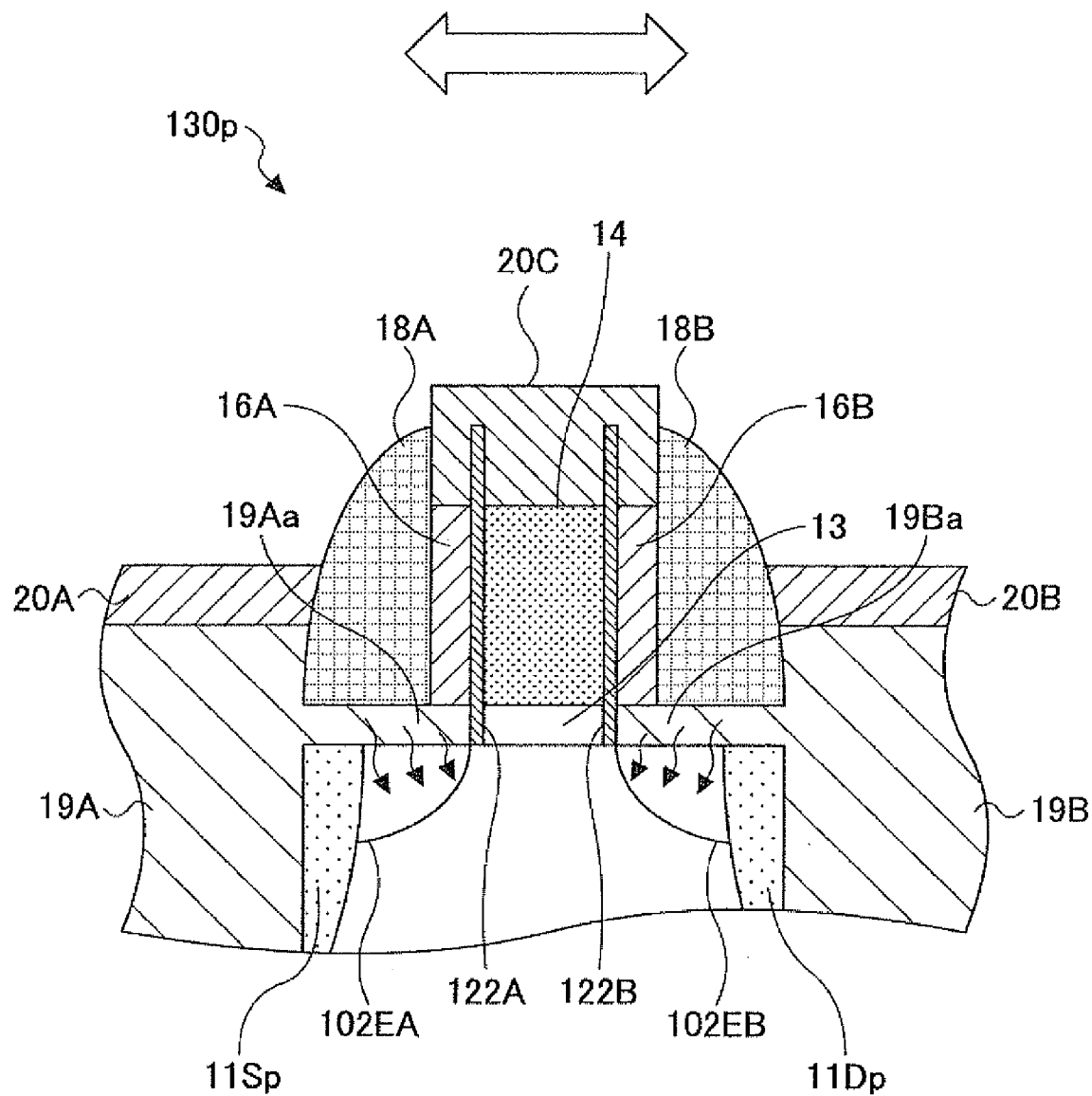
FIG. 37 is an enlarged cross-sectional view of a principal portion of the semiconductor device 130.

FIG. 37 is an enlarged cross-sectional view of a principal portion of the semiconductor device 130.

In the following descriptions, the same reference numbers are assigned to the same elements as those described in the previous embodiments, and overlapping descriptions are omitted.

The semiconductor device 130 includes a p-channel MOS transistor 130p and an n-channel MOS transistor 130n. In the p-channel MOS transistor 130p, the source extension region 102EA and the drain extension region 102EB are formed by diffusing p-type impurities the same as the p-type impurities implanted in the extended portions 19Aa, 19Ba of the SiGe mixed crystal layers 19A and 19B to the silicon substrate 11 by solid phase diffusion. In addition, in the p-channel MOS transistor 130p of the semiconductor device 130, the third side wall insulating films 122A and 122B are formed between one of the opposite side walls of the gate electrode 14 and one of the first side wall insulating films 16A and 16B in contact with the side surface of the silicon substrate 11 to cover the side walls of the gate insulating film 13.

In other words, the p-channel MOS transistor 130p in the present embodiment corresponds to a combination of the p-channel MOS transistor 100p in FIG. 22 in the 13th embodiment and the p-channel MOS transistor 120p in FIG. 29 in the 19th embodiment.

In addition, in the p-channel MOS transistor 130p, since the extended portions 19Aa, 19Ba are in contact with the outer sides of the third side wall insulating films 122A and 122B on the side of the gate insulating film 13, the stress from the SiGe mixed crystal of the extended portions 19Aa, 19Ba can be effectively applied on the channel region. Further, since the extended portions 19Aa, 19Ba are very close to the gate insulating film 13, the p-type impurities diffused from the SiGe mixed crystal of the extended portions 19Aa, 19Ba are distributed in proximity of the two sides of the gate insulating film 13, thereby, forming the source extension region 102EA and the drain extension region 102EB. For this reason, it is anticipated that the parasitic resistance of the channel region can be reduced and the mobility of the p-type carriers can be improved.

It is described above that preferably the extended portions 19Aa, 19Ba are in contact with the outer surface of the third side wall insulating films 122A and 122B on the side of the gate insulating film 13, but this is not indispensable. For example, the first side wall insulating films 16A and 16B may be disposed between the extended portions 19Aa, 19Ba and the third side wall insulating films 122A and 122B, respectively.

The semiconductor device 130 of the present embodiment can be fabricated by combining the method of fabricating the p-channel MOS transistor 100p in FIG. 22 in the 13th embodiment and the method of fabricating the p-channel MOS transistor 120p in FIG. 29 in the 19th embodiment. Detailed descriptions are omitted.

26th Embodiment

Figure 38:
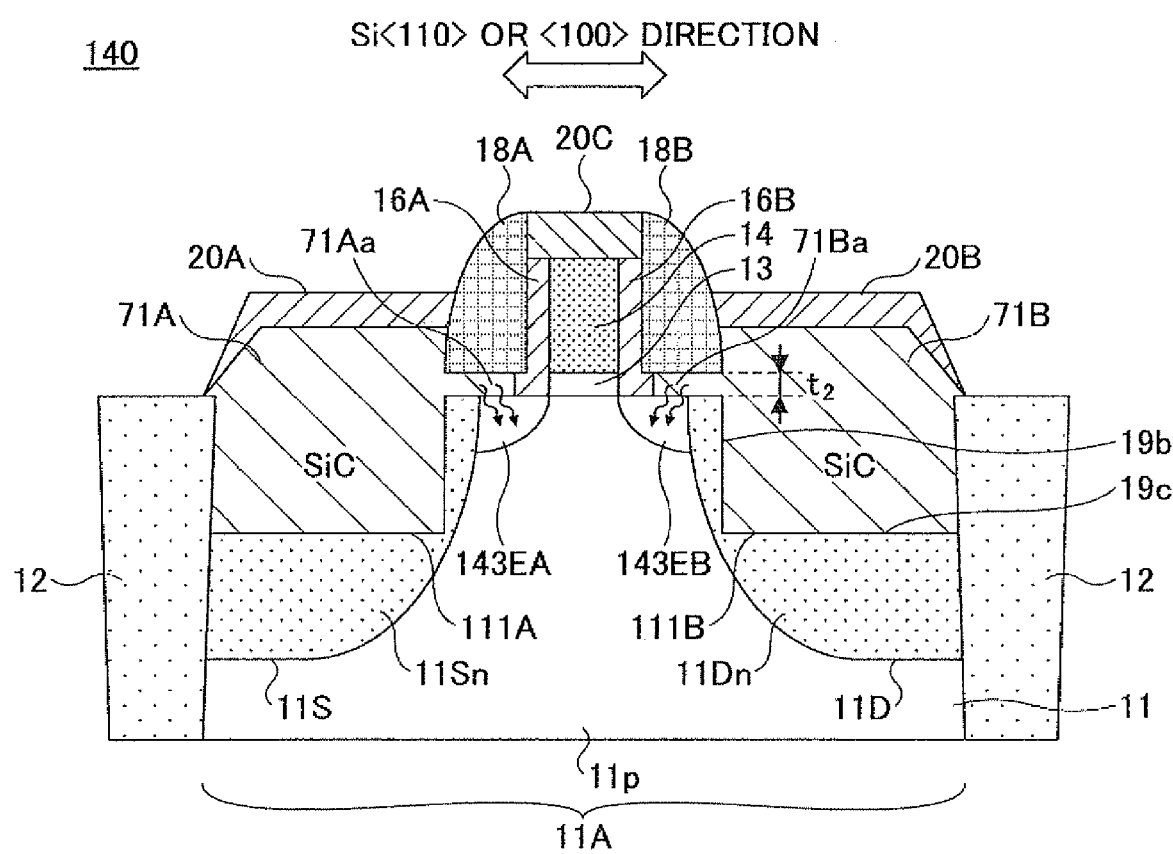
FIG. 38 is a cross-sectional view illustrating an example of a semiconductor device 140 according to a 26th embodiment of the present invention.

FIG. 38 is a cross-sectional view illustrating an example of a semiconductor device 140 according to a 26th embodiment of the present invention.

In the following descriptions, the same reference numbers are assigned to the same elements as those described in the previous embodiments, and overlapping descriptions are omitted.

The semiconductor device 140 shown in FIG. 38 is an n-channel MOS transistor, which is a modification of the semiconductor device 70 in FIG. 16 in the 7th embodiment.

In the semiconductor device 140, source extension region 143EA and drain extension region 143EB are formed by diffusing the n-type impurities in the extended portions 71Aa, 71Ba of the SiC mixed crystal layers 71A and 71B to the silicon substrate 11 by solid phase diffusion.

Therefore, since the high impurity concentration region caused by the channeling effect is not formed, it is possible to reduce the impurity concentration of the n-type pocket implanted regions or omit the n-type pocket implanted regions, thus, it is possible to further improve mobility of the p-type carriers in the channel region.

In addition, similar to the p-channel MOS transistor 100*p* in the 13th embodiment, in the semiconductor device 140, it is preferable that volumes of the extended portions 71Aa, 71Ba be sufficiently large, because large volumes of the extended portions 71Aa, 71Ba can increase the stress applied on the channel region, and thus further improves the carrier mobility.

The method of fabricating the semiconductor device 140 in the present embodiment is nearly the same as the method of fabricating the semiconductor device 70 in FIG. 16 in the 16th embodiment except that the method of fabricating the source extension region 143EA and the drain extension region 143EB is different.

When fabricating the source extension region 143EA and the drain extension region 143EB, after forming the n-type SiC mixed crystal layers 71A and 71B and the extended portions 71Aa, 71Ba, the n-type impurities in the extended portions 71Aa, 71Ba of the SiC mixed crystal layers 71A, 71B are diffused, by heat treatment, to the silicon substrate 11 by means of solid phase diffusion. For this reason, the impurity concentration profile from the surface of the silicon substrate 11 along the depth direction of the silicon substrate 11 is a maximum at the surface of the silicon substrate 11, and decreases along the depth direction of the silicon substrate 11. The conditions of the heat treatment are roughly the same as those as shown in the step of forming the p-channel MOS transistor in FIG. 23G.

When the semiconductor device 140 of the present embodiment is combined with a p-channel MOS transistor to form a CMOS transistor, the steps from FIG. 23A to FIG. 23G can be carried out while just replacing the steps for forming a p-channel MOS transistor with steps for forming the n-channel MOS transistor.

In addition, the SiC mixed crystal layers of the semiconductor device 140 may also be replaced by the SiC mixed crystal layers of the semiconductor device 75 in the 17th embodiment, or the semiconductor device 80 in the 18th embodiment.

Further, the element separation region 12 of the semiconductor device 140 may be replaced by the element separation region 52 of the semiconductor device in FIG. 19 in the 10th embodiment, and after replacing the element separation region, the SiC mixed crystal layers of the semiconductor device 140 may be further replaced by the SiC mixed crystal layers of the semiconductor device 75 in the 17th embodiment, or the semiconductor device 80 in the 18th embodiment.

27th Embodiment

Figure 39:
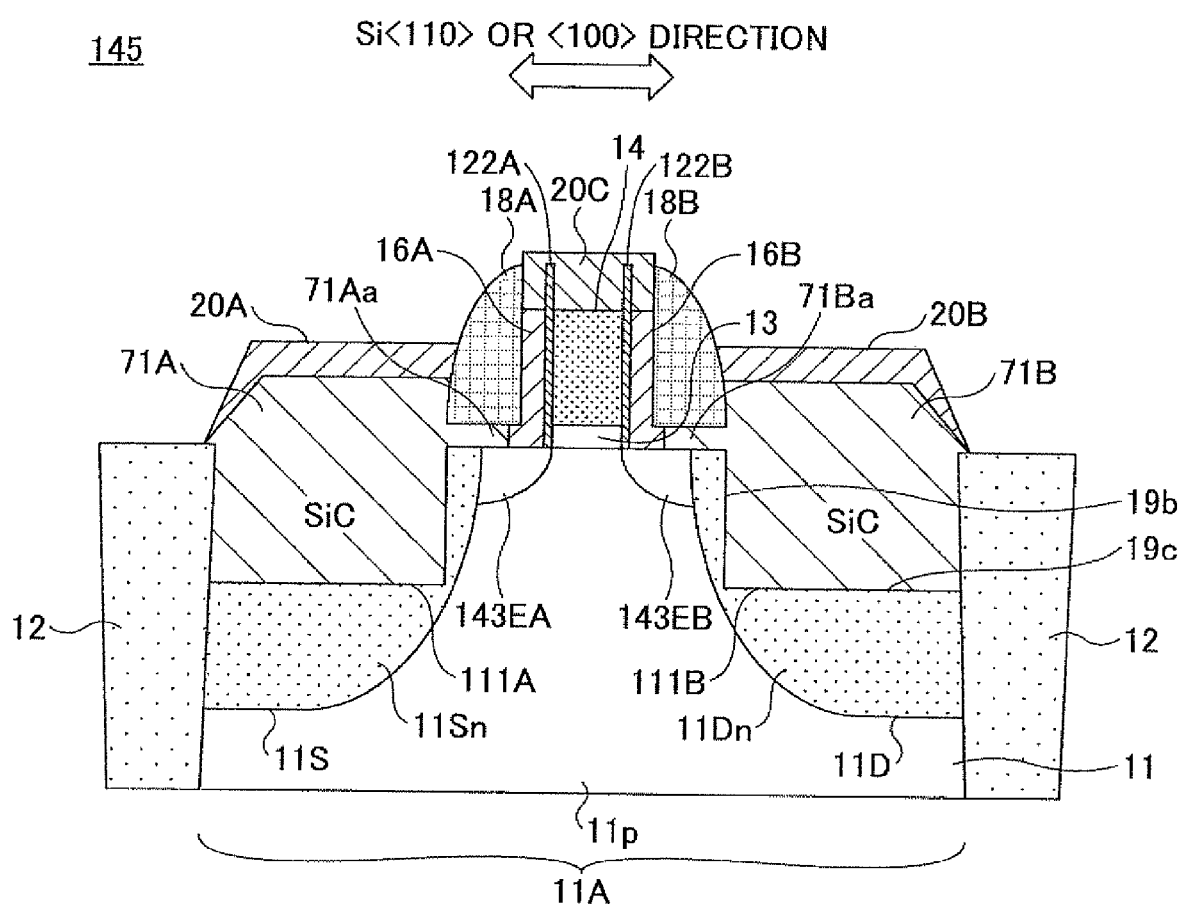
FIG. 39 is a cross-sectional view illustrating an example of a semiconductor device 145 according to a 27th embodiment of the present invention.

FIG. 39 is a cross-sectional view illustrating an example of a semiconductor device 145 according to a 27th embodiment of the present invention.

In the following descriptions, the same reference numbers are assigned to the same elements as those described in the previous embodiments, and overlapping descriptions are omitted.

The semiconductor device 145 shown in FIG. 39 is an n-channel MOS transistor. In the semiconductor device 145, the third side wall insulating films 122A and 122B are formed between one of the opposite side walls of the gate electrode 14 and one of the first side wall insulating films 16A and 16B in contact with the side surface of the silicon substrate 11 to cover the side walls of the gate insulating film 13. Except for the third side wall insulating films 122A and 122B, the semiconductor device 145 is the same as the semiconductor device 70 in FIG. 16 in the seventh embodiment.

In the semiconductor device 145, the third side wall insulating films 122A and 122B are formed from insulating materials, which have etching selectivity, different from the first side wall insulating films 16A and 16B. For example, if the first side wall insulating films 16A and 16B are formed from a silicon oxide film, the third side wall insulating films 122A and 122B are formed from a silicon nitride film.

In the semiconductor device 145, the extended portions 71Aa, 71Ba are in contact with the first side wall insulating films 16A and 16B on the side of the gate insulating film 13. When the extended portions 71Aa, 71Ba are arranged to be very close to the side walls of the gate insulating film 13, the stress from the SiC mixed crystal layers of the extended portions 71Aa, 71Ba can be effectively applied on the channel region. As a result, the parasitic resistance of the channel region decreases, and the carrier mobility is improved.

In addition, it is preferable that the extended portions 71Aa, 71Ba be formed in contact with the outer surface of the third side wall insulating films 122A and 122B on the side of the gate insulating film 13, because this further reduces the parasitic resistance of the channel region, and further improves the carrier mobility.

It should be noted that the SiC mixed crystal layers of the semiconductor device 145 may be replaced by the SiC mixed crystal layers of the semiconductor device 75 in the 17th embodiment or the semiconductor device 80 in the 18th embodiment.

Further, the element separation region 12 of the semiconductor device 145 may be replaced by the element separation region 52 of the semiconductor device in FIG. 19 in the 10th embodiment, and after replacing the element separation region, the SiC mixed crystal layers of the semiconductor device 145 may be further replaced by the SiC mixed crystal layers of the semiconductor device 75 in the 17th embodiment or the semiconductor device 80 in the 18th embodiment.

While the invention is described above with reference to specific embodiments chosen for purpose of illustration, it should be apparent that the invention is not limited to these embodiments, but numerous modifications could be made thereto by those skilled in the art without departing from the basic concept and scope of the invention.

For example, the n-channel MOS transistor in the semiconductor device in the 19th embodiment may be replaced by one of the semiconductor devices of the seventh embodiment through the 12th embodiment, or by the semiconductor devices in the 26th, 27th embodiments, or by the semiconductor devices (n-channel MOS transistor) including the above-mentioned modifications. Further, the n-channel MOS transistors obtained by the above replacement may be combined with p-channel MOS transistors obtained by replacing the p-channel MOS transistor of the semiconductor device in the 13th embodiment by the semiconductor device of one of the first embodiment through the sixth embodiment, and the 14th embodiment through the 25th embodiment.

What is claimed is:

1. A method of manufacturing a semiconductor device, comprising:
    forming a gate insulating film over a silicon substrate;
    forming a gate electrode over the gate insulating film;
    implanting a first impurity having first conductivity into the silicon substrate using the gate electrode as a mask;
    forming a first side wall insulating film on a side wall of the gate electrode, a portion of the first side wall insulating film extending over the silicon substrate;
    forming a second side wall insulating film on the first side wall insulating film;

implanting a second impurity having the first conductivity into the silicon substrate using the gate electrode, the first side wall insulating film, and the second side wall insulating film as masks;

forming a trench in the silicon substrate by etching the silicon substrate using the gate electrode, the first side wall insulating film, and the second side wall insulating film as masks;

removing a portion of the first side wall insulating film to form a concave portion between the silicon substrate and the second sidewall insulating film;

forming a semiconductor mixed crystal layer in the trench and in the concave portion; and performing a heat treatment to diffuse an impurity in the semiconductor mixed crystal layer formed in the concave portion into the silicon substrate.

2. The method as claimed in claim 1, further comprising, between said forming of the gate electrode and said forming of the first side wall insulating film:

forming a third side wall insulating film on the side wall of the gate electrode, said third side wall insulating film and the first side wall insulating film being formed from different insulating materials each having etching selectivity.

3. The method as claimed in claim 2, wherein in said removing of the portion of the first side wall insulating film, a portion of the third side wall insulating film is exposed.

4. The method as claimed in claim 1, wherein the first side wall insulating film and the second side wall insulating film are formed from different insulating materials each having etching selectivity, and in said removing of the portion of the first side wall insulating film, an etching solution is used to enable etching speed in the first side wall insulating film to be greater than etching speed in the second side wall insulating film.

5. A method of manufacturing a semiconductor device including a first MOS transistor of a first conductivity formed in a first region of a semiconductor substrate and a second MOS transistor of a second conductivity opposite to the first conductivity and formed in a second region of the semiconductor substrate, said method comprising:

forming a gate insulating film over a silicon substrate in the first region and the second region;

forming a gate electrode over the gate insulating film in the first region and the second region;

forming pocket implantation regions of the first conductivity and first diffusion regions of the second conductivity in the silicon substrate in the second region;

forming a first side wall insulating film on a side wall of the gate electrode in the first region and the second region, a portion of the first side wall insulating film extending over the silicon substrate;

forming a second side wall insulating film on the first side wall insulating film in the first region and the second region;

forming second diffusion regions of the first conductivity in the silicon substrate in the first region using the gate electrode, the first side wall insulating film, and the second side wall insulating film as masks, said second diffusion regions forming a source region and a drain region;

forming, by etching the silicon substrate, a trench in the first region in the silicon substrate using the gate electrode, the first side wall insulating film, and the second side wall insulating film as masks;

removing a portion of the first side wall insulating film in the first region to form a concave portion between the silicon substrate and the second side wall insulating film;

forming a semiconductor mixed crystal layer of the first conductivity in the trench and in the concave portion;

forming second diffusion regions of the second conductivity in the silicon substrate in the second region using the gate electrode, the first side wall insulating film, and the second side wall insulating film as masks;

and performing a heat treatment to diffuse an impurity in the semiconductor mixed crystal layer formed in the concave portion into the silicon substrate.

6. The method as claimed in claim 5, wherein a thickness of the first side wall insulating film is in a range from 5 nm to 20 nm.

7. The method as claimed in claim 5, wherein the first side wall insulating film and the second side wall insulating film are formed from different insulating materials each having etching selectivity, and in said removing of the portion of the first side wall insulating film, an etching solution is used to enable etching speed in the first side wall insulating film to be greater than etching speed in the second side wall insulating film.

8. A method of manufacturing a semiconductor device including a first MOS transistor of a first conductivity formed in a first region of a semiconductor substrate and a second MOS transistor of a second conductivity opposite to the first conductivity and formed in a second region of the semiconductor substrate, said method comprising:

forming a gate insulating film over a silicon substrate in the first region and the second region;

forming a gate electrode over the gate insulating film in the first region and the second region;

forming pocket implantation regions of the second conductivity and first diffusion regions of the first conductivity in the silicon substrate in the first region using the gate electrode as a mask;

forming pocket implantation regions of the first conductivity and first diffusion regions of the second conductivity in the silicon substrate in the second region using the gate electrode as a mask;

forming a first side wall insulating film on a side wall of the gate electrode in the first region and the second region, a portion of the first side wall insulating film extending over the silicon substrate;

forming a second side wall insulating film on the first side wall insulating film in the first region and the second region;

forming second diffusion regions of the first conductivity in the silicon substrate in the first region using the gate electrode, the first side wall insulating film, and the second side wall insulating film as masks, said second diffusion regions forming a source region and a drain region;

forming, by etching the silicon substrate, a trench in the first region in the silicon substrate using the gate electrode, the first side wall insulating film, and the second side wall insulating film as mask;

removing a portion of the first side wall insulating film in the first region to form a concave portion between the silicon substrate and the second side wall insulating film;

forming a semiconductor mixed crystal layer of the first conductivity in the trench;

forming second diffusion regions of the second conductivity in the silicon substrate in the second region using the gate electrode, the first side wall insulating film, and the second side wall insulating film as masks; and forming, between said forming of the gate electrode and said forming of the first side wall insulating film, a third side wall insulating film on the side wall of the gate electrode, said third side wall insulating film and the first side wall insulating film being formed from different insulating materials each having etching selectivity.

9. The method as claimed in claim 8, wherein
a thickness of the first side wall insulating film is in a range from 5 nm to 20 nm.

* * * * *